(12) United States Patent
Hsiao

(10) Patent No.: US 10,895,999 B2
(45) Date of Patent: Jan. 19, 2021

(54) DATA READING METHOD, STORAGE CONTROLLER AND STORAGE DEVICE

(71) Applicant: Shenzhen EpoStar Electronics Limited CO., Shenzhen (CN)

(72) Inventor: Yu-Hua Hsiao, Hsinchu County (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 16/531,140

(22) Filed: Aug. 5, 2019

(65) Prior Publication Data

US 2020/0341679 A1    Oct. 29, 2020

(30) Foreign Application Priority Data

Apr. 26, 2019  (TW) .............................. 108114667 A

(51) Int. Cl.
*G06F 3/06*      (2006.01)

(52) U.S. Cl.
CPC .......... *G06F 3/0655* (2013.01); *G06F 3/0604* (2013.01); *G06F 3/0679* (2013.01)

(58) Field of Classification Search
None
See application file for complete search history.

*Primary Examiner* — Charles Rones
*Assistant Examiner* — Jonah C Krieger
(74) *Attorney, Agent, or Firm* — JCIPRNET

(57) ABSTRACT

A data reading method is provided. The method includes: using a predetermined read voltage corresponding to a read operation to read a target physical page to obtain a read codeword syndrome of a read codeword; using a first adjust read voltage to read again the target physical page to obtain a first adjust codeword syndrome of a first adjust codeword; generating soft information of each of a plurality of target memory cells of the target physical page according to the read codeword and the first adjust cordword; identifying a target confidence table according to a size relative relation between the foregoing syndromes to find a confidence value of each of the target memory cells from the target confidence table; and performing an adjusted preset decoding operation according to the soft information and the confidence values to obtain a valid codeword, so as to complete the read operation.

23 Claims, 33 Drawing Sheets

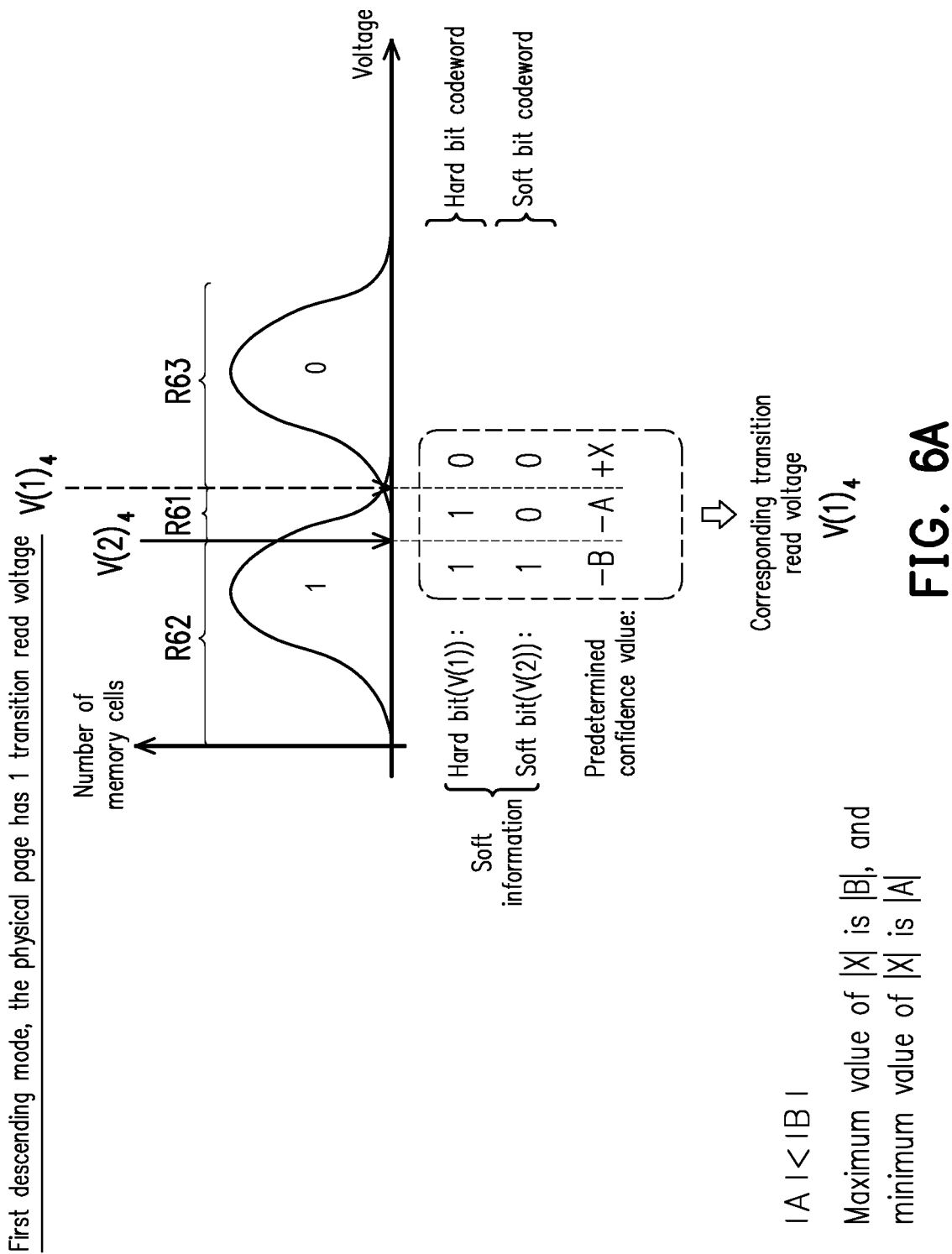

Confidence tables corresponding to first descending mode

| Soft information of memory cells | "11" | "10" | "01" | "00" |
|---|---|---|---|---|
| Confidence tables corresponding physical page having 1 transition read voltage | "−B" | "−A" | Null or "0" | "+X" |
| Confidence tables corresponding physical page having 2 or more transition read voltages | "−B" | "−A" | "+A" | "+B" |

Maximum value of |X| is |B|, and
minimum value of |X| is |A|

FIG. 6E

Confidence tables corresponding to first ascending mode

| Soft information of memory cells | "11" | "01" | "00" | "10" |
|---|---|---|---|---|
| Confidence tables corresponding physical page having 1 transition read voltage | "−X" | "+A" | "+B" | Null or "0" |
| Confidence tables corresponding physical page having 2 or more transition read voltages | "−B" | "+A" | "+B" | "−A" |

Maximum value of $|X|$ is $|B|$, and minimum value of $|X|$ is $|A|$

FIG. 7C

Confidence tables corresponding to horizontal mode

| Soft information of memory cells | "11" | "01" | "00" | "10" |
|---|---|---|---|---|
| Confidence tables corresponding physical page having 1 transition read voltage | "-B" | "Y" | "+B" | Null or "0" |
| Confidence tables corresponding physical page having 2 or more transition read voltages | "-B" | "Y" | "+B" | "-B" |

— 800

$Y \leq |B|$

FIG. 8C

Confidence tables corresponding to second descending mode

| Soft information of memory cells | "111" | "110" | "100" | "000" | "001" | "011" | "010" | "101" |
|---|---|---|---|---|---|---|---|---|
| Confidence tables corresponding physical page having 1 transition read voltage | "−C" | "−B" | "−A" | "+X" | Null or "0" | Null or "0" | Null or "0" | Null or "0" |
| Confidence tables corresponding physical page having 2 or more transition read voltages | "−B" or "−D" | "−B" | "−A" | "+B" or "+D" | "+B" | "+A" | Null or "0" | Null or "0" |

|A|<|B|<|C|

Maximum value of |X| is |C|, and minimum value of |X| is |A|

|D|=(|A|+|B|)/2

FIG. 9E

Confidence tables corresponding to second ascending mode

| Soft information of memory cells | "111" | "011" | "001" | "000" | "010" | "100" | "101" | "110" |
|---|---|---|---|---|---|---|---|---|
| Confidence tables corresponding physical page having 1 transition read voltage | "−X" | "+A" | "+B" | "+C" | Null or "0" | Null or "0" | Null or "0" | Null or "0" |
| Confidence tables corresponding physical page having 2 or more transition read voltages | "−B" or "−D" | "+A" | "+B" | "+B" or "+D" | Null or "0" | "−A" | Null or "0" | "−B" |

|A|<|B|<|C|

Maximum value of |X| is |C|, and minimum value of |X| is |A|

|D|=(|A|+|B|)/2

FIG. 10

| Confidence tables corresponding to horizontal mode | | | | | | | | |
|---|---|---|---|---|---|---|---|---|
| Soft information of memory cells | "111" | "110" | "001" | "000" | "010" | "100" | "101" | "110" |
| Confidence tables corresponding physical page having 1 transition read voltage | "−X" | "+A" | "+B" | "+C" | Null or "0" | Null or "0" | Null or "0" | Null or "0" |
| Confidence tables corresponding physical page having 2 or more transition read voltages | "−B" or "−D" | "+A" | "+B" | "+B" or "+D" | Null or "0" | "−A" | Null or "0" | "−B" |

$|A| < |B| < |C|$

Maximum value of $|X|$ is $|C|$, and minimum value of $|X|$ is $|A|$ $|D| = (|A| + |B|)/2$

FIG. 11C

| Memory cell | | G1 | G2 | G3 | G4 | G5 | G6 | G7 | G8 | Storage state (Gray code) |
|---|---|---|---|---|---|---|---|---|---|---|
| | Lower physical page (L) | 1 | 1 | 1 | 1 | 0 | 0 | 0 | 0 | |
| | Middle physical page (M) | 1 | 1 | 0 | 0 | 0 | 0 | 1 | 1 | |
| | Upper physical page (U) | 1 | 0 | 0 | 1 | 1 | 0 | 0 | 1 | |
| Deviate rightward | | | | | | | | | | |
| | Amount of storage states of the lower physical page of the memory cell which deviate rightward (NL1) | | | | $C(1)_{G4G5}$ | | | | | |
| | Amount of storage states of the middle physical page of the memory cell which deviate rightward (NM1) | | $C(1)_{G2G3}$ | | | | $C(1)_{G6G7}$ | | | |
| | Amount of storage states of the upper physical page of the memory cell which deviate rightward (NU1) | $C(1)_{G1G2}$ | | $C(1)_{G3G4}$ | | $C(1)_{G5G6}$ | | $C(1)_{G7G8}$ | | |
| Deviate leftward | | | | | | | | | | |
| | Amount of storage states of the lower physical page of the memory cell which deviate leftward (NL2) | | | | $C(1)_{G4G3}$ | | | | | |
| | Amount of storage states of the middle physical page of the memory cell which deviate leftward (NM2) | | $C(1)_{G2G1}$ | | | | $C(1)_{G6G5}$ | | | |
| | Amount of storage states of the upper physical page of the memory cell which deviate leftward (NU2) | | | $C(1)_{G3G2}$ | | $C(1)_{G5G4}$ | | $C(1)_{G7G6}$ | | |
| | Deviation amount of the lower physical page: (DNL=NL1−NL2) | | $D(1)_2$ | | $D(1)_4$ | | $D(1)_6$ | | | |
| | Deviation amount of the middle physical page: (DNM=NM1−NM2) | | | $D(1)_3$ | | $D(1)_5$ | | $D(1)_7$ | | |
| | Deviation amount of the upper physical page: (DNU=NU1−NU2) | $D(1)_1$ | | $D(1)_3$ | | $D(1)_5$ | | $D(1)_7$ | | |

| | $V(i)_1$ | $V(i)_2$ | $V(i)_3$ | $V(i)_4$ | $V(i)_5$ | $V(i)_6$ | $V(i)_7$ | Deviation amount difference value summation $SD(i)$ | Sort (in an ascending order) |
|---|---|---|---|---|---|---|---|---|---|
| V(1) | -1 | 9 | 6 | -4 | -3 | -2 | 0 | 5 | 13 |
| V(2) | -1 | 1 | -2 | -42 | -7 | -10 | -6 | -67 | 9 |
| V(3) | -1 | -11 | -23 | -180 | -24 | -51 | -8 | -298 | 5 |
| V(4) | -1 | -3 | -1 | -27 | -6 | -37 | -28 | -103 | 8 |
| V(5) | -6 | -208 | -504 | -2936 | -2428 | -2320 | -875 | -9277 | 0 |
| V(6) | 498 | 202 | 841 | 21 | 444 | 24 | 145 | 2175 | 15 |
| V(7) | -1 | -5 | -2 | -68 | -30 | -346 | -493 | -945 | 2 |
| V(8) | 19 | -12 | -9 | -153 | -26 | -104 | -42 | -327 | 4 |
| V(9) | 0 | 2 | 1 | -2 | 1 | -1 | 0 | 1 | 12 |
| V(10) | -1 | 0 | 0 | -29 | -2 | -4 | -1 | -37 | 11 |
| V(11) | -2 | -5 | -8 | -98 | -10 | -17 | -3 | -143 | 7 |
| V(12) | -2 | -1 | 0 | -16 | -4 | -12 | -10 | -45 | 10 |
| V(13) | -7 | -173 | -322 | -2720 | -1407 | -1468 | -549 | -6646 | 1 |
| V(14) | 271 | 102 | 877 | 11 | 538 | 36 | 133 | 1968 | 14 |
| V(15) | -1 | -4 | -1 | -41 | -11 | -124 | -298 | -480 | 3 |
| V(16) | 4 | -8 | -1 | -99 | -8 | -33 | -22 | -167 | 6 |

DATA READING METHOD, STORAGE CONTROLLER AND STORAGE DEVICE

CROSS-REFERENCE TO RELATED APPLICATION

This application claims the priority benefit of Taiwan application serial no. 108114667, filed on Apr. 26, 2019. The entirety of the above-mentioned patent application is hereby incorporated by reference herein and made a part of this specification.

BACKGROUND

Field of the Invention

The invention is directed to a data reading method and more particularly, to a data reading method applicable to a storage device configured with a rewritable non-volatile memory module and a storage controller thereof.

Description of Related Art

In general, when an iterative decoding operation (e.g., a low density parity check code decoding operation) performed on a codeword read from a physical page of a rewritable non-volatile memory module is failed, a storage controller of a memory device will try to correct a log likelihood ratio table corresponding to the iterative decoding operation according to verified data (e.g., known data which is pre-stored in the rewritable non-volatile memory module), so as to perform the iterative decoding operation on the read codeword again by using a calibrated log likelihood ratio table.

However, a conventional method needs to additionally prepare the known verified data (i.e., by storing the known verified data into a plurality of word lines of the rewritable non-volatile memory module). Since the conventional method needs to use a spare space of the rewritable non-volatile memory module to store the verified data, a remaining available space of the rewritable non-volatile memory module is reduced accordingly. Consequently, an operational efficiency of the storage device is reduced due to the reduced remaining available space (because many of management operations in the storage device will require the use of the remaining available space).

Moreover, in another conventional method, an adjusted read voltage corresponding to the predetermined read voltage is used to perform a read retry operation when the decoding is failed, so as to again read the physical page which is originally read. Thereafter, a decoding operation is performed on an adjust codeword read by the adjusted read voltage to try to obtain a successfully decoded valid codeword. However, in the conventional method above, if the read retry operation is failed (i.e., the valid codeword cannot be obtained by performing the decoding operation according to the codeword read by using the adjusted read voltage), the originally obtained adjust codeword will be dropped, and another read retry operation is performed on the physical page by using different adjusted read voltages. That is to say, a data reading efficiency is reduced because the conventional method performs the read retry operation for many times. Particularly, all of the adjust codewords obtained by the read retry operation cannot be used to improve the decoding capability of the storage device, resulting in the waste of operation resources.

Thus, how to use other methods to effectively replace the log likelihood ratio table corresponding to the iterative decoding operation without preparing verified data and well use the mechanism of the read retry operation to improve the defects of the conventional methods to improve the performance of the decoding operation and enhance the data reading efficiency of the rewritable non-volatile memory module is one of the subjects studied by people in the field.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a data reading method, a storage controller and a storage device, which can use different read voltages to read a target physical page for many times without preparing any verified data to correspondingly obtain a plurality of codewords and a plurality of syndromes corresponding the codewords and then, generate soft information of each target memory cell of the target physical page according to a relative relation among the syndromes and the plurality of codewords to find out a plurality of confidence values of the plurality of target memory cells from a confidence table corresponding to the size relative relation and the target physical page, so as to perform an adjusted iterative decoding operation according to the plurality of confidence values to reinforce decoding capability and improve an efficiency of the read operation.

An embodiment of the invention provides a data reading method for a storage device disposed with a rewritable non-volatile memory module. The rewritable non-volatile memory module includes a plurality of word lines, wherein each of the word lines is coupled to a plurality of memory cells, each of the memory cells includes a plurality of physical pages, and each of the physical pages is configured to be programmed to have a bit value. The method includes: selecting a target physical page of a target word line to perform a read operation on a target codeword stored by the target physical page, wherein a plurality of target memory cells of the target physical page are configured to respectively store a plurality of target bit values of the target codeword; using a predetermined read voltage corresponding to the target physical page to read the target physical page to obtain a read codeword corresponding to the target physical page and performing a preset decoding operation on the read codeword to obtain a plurality of read codeword syndromes corresponding to the read codeword, wherein the read codeword is stored in a codeword buffer area, and a first one of the read codeword syndromes is stored in a syndrome buffer area; in response to the determination that a plurality of bit values of a last one of the read codeword syndromes are not all zero, using a first adjust read voltage corresponding to the predetermined read voltage to read again the target physical page to obtain a first adjust codeword corresponding to the target physical page and performing the preset decoding operation on the first adjust codeword to obtain a plurality of first adjust codeword syndromes corresponding to the first adjust codeword, wherein the first adjust codeword is stored in the codeword buffer area, and a first one of the first adjust codeword syndromes is stored in the syndrome buffer area; in response to the determination that a plurality of bit values of a last one of the first adjust codeword syndromes are not all zero, generating soft information of each of the target memory cells according to a plurality of codewords corresponding to the read operation in the codeword buffer area; identifying a target confidence table corresponding to a size relative relation from a plurality of confidence tables corresponding to the target physical page according to the size relative relation among a plurality of syndromes in the syndrome buffer area, wherein the confidence tables respectively correspond to a plurality of modes of the size relative relation, and each of the confidence tables has a plurality of predetermined confidence values respectively corresponding to a plurality of soft information patterns; finding a confidence value of each of the target memory cells from the target confidence table according to the plurality of soft information of the target memory cells; and using the confidence values of the target memory cells to replace a plurality of log likelihood ratios corresponding to the target memory cells in the preset decoding operation and performing the adjusted preset decoding operation having the replaced log likelihood ratios on the plurality of soft information, so as to obtain a valid codeword corresponding to the target physical page and complete the read operation.

An embodiment of the invention provides a storage controller for controlling a storage device disposed with a rewritable non-volatile memory module. The storage controller includes a connection interface circuit, a memory interface control circuit, a read assisting circuit unit, an error checking and correcting circuit and a processor. The connection interface unit is configured to couple to a host system. The memory interface control circuit is configured to couple to the rewritable non-volatile memory module, wherein the rewritable non-volatile memory module includes a plurality of word lines, each of the word lines is coupled to a plurality of memory cells, each of the memory cells includes a plurality of physical pages, and each of the physical pages is configured to be programmed to have a bit value. The processor is coupled to the connection interface circuit, the memory interface control circuit, the read assisting circuit unit and the error checking and correcting circuit. The processor is configured to select a target physical page of a target word line to perform a read operation on a target codeword stored by the target physical page, wherein a plurality of target memory cells of the target physical page are configured to respectively store a plurality of target bit values of the target codeword. The processor is further configured to use a predetermined read voltage corresponding to the target physical page to read the target physical page to obtain a read codeword corresponding to the target physical page. The error checking and correcting circuit is configured to perform a preset decoding operation on the read codeword to obtain a plurality of read codeword syndromes corresponding to the read codeword. The read assisting circuit unit is configured to store the read codeword in a codeword buffer area and store a first one of the read codeword syndromes in a syndrome buffer area. In response to the determination that a plurality of bit values of a last one of the read codeword syndromes are not all zero, the processor is further configured to use a first adjust read voltage corresponding to the predetermined read voltage to read again the target physical page to obtain a first adjust codeword corresponding to the target physical page. The error checking and correcting circuit is further configured to perform the preset decoding operation on the first adjust codeword to obtain a plurality of first adjust codeword syndromes corresponding to the first adjust codeword. The read assisting circuit unit is configured to store the first adjust codeword in the codeword buffer area and store a first one of the first adjust codeword syndromes in the syndrome buffer area. In response to the determination that a plurality of bit values of a last one of the first adjust codeword syndromes are not all zero, the read assisting circuit unit is further configured to generate soft information of each of the target memory cells according to a plurality of codewords corresponding to the read operation in the codeword buffer area. Then, the read assisting circuit unit is further configured to identify a target confidence table corresponding to a size relative relation from a plurality of confidence tables corresponding to the target physical page according to the size relative relation among a plurality of syndromes in the syndrome buffer area, wherein the confidence tables respectively correspond to a plurality of modes of the size relative relation, and each of the confidence tables has a plurality of predetermined confidence values respectively corresponding to a plurality of soft information patterns. The read assisting circuit unit is further configured to find a confidence value of each of the target memory cells from the target confidence table according to the plurality of soft information of the target memory cells and use the confidence values of the target memory cells to replace a plurality of log likelihood ratios corresponding to the target memory cells in the preset decoding operation, and the error checking and correcting circuit is further configured to perform an adjusted preset decoding operation having the replaced log likelihood ratios on the plurality of soft information, so as to obtain a valid codeword corresponding to the target physical page and complete the read operation.

An embodiment of the invention provides a storage device. The storage device includes a rewritable non-volatile memory module, a memory interface control circuit and a processor. The rewritable non-volatile memory module has a plurality of word lines, each of the word lines is coupled to a plurality of memory cells, each of the memory cells includes a plurality of physical pages, and each of the physical pages is configured to be programmed to have a bit value. The memory interface control circuit is configured to couple to the rewritable non-volatile memory module. The processor is coupled to the memory interface control circuit. The processor loads and executes a read assisting program code module to implement a data reading method. The data reading method includes: selecting a target physical page of a target word line to perform a read operation on a target codeword stored by the target physical page, wherein a plurality of target memory cells of the target physical page are configured to respectively store a plurality of target bit values of the target codeword; using a predetermined read voltage corresponding to the target physical page to read the target physical page to obtain a read codeword corresponding to the target physical page and performing a preset decoding operation on the read codeword to obtain a plurality of read codeword syndromes corresponding to the read codeword, wherein the read codeword is stored in a codeword buffer area, and a first one of the read codeword syndromes is stored in a syndrome buffer area; in response to the determination that a plurality of bit values of a last one of the read codeword syndromes are not all zero, using a first adjust read voltage corresponding to the predetermined read voltage to read again the target physical page to obtain a first adjust codeword corresponding to the target physical page and performing the preset decoding operation on the first adjust codeword to obtain a plurality of first adjust codeword syndromes corresponding to the first adjust codeword, wherein the first adjust codeword is stored in the codeword buffer area, and a first one of the first adjust codeword syndromes is stored in the syndrome buffer area; in response to the determination that a plurality of bit values of a last one of the first adjust codeword syndromes are not all zero, generating soft information of each of the target memory cells according to a plurality of codewords corresponding to the read operation in the codeword buffer area; identifying a target confidence table corresponding to a size relative relation from a plurality of confidence tables corresponding to the target physical page according to the size relative relation among a plurality of syndromes in the syndrome buffer area, wherein the confidence tables respectively correspond to a plurality of modes of the size relative relation, and each of the confidence tables has a plurality of predetermined confidence values respectively corresponding to a plurality of soft information patterns; finding a confidence value of each of the target memory cells from the target confidence table according to the plurality of soft information of the target memory cells; and using the confidence values of the target memory cells to replace a plurality of log likelihood ratios corresponding to the target memory cells in the preset decoding operation and performing the adjusted preset decoding operation having the replaced log likelihood ratios on the plurality of soft information, so as to obtain a valid codeword corresponding to the target physical page and complete the read operation.

Based on the above, the data reading method, the storage controller and the storage device provided by the embodiments of the invention can utilize the predetermined read operation (using the predetermined read voltage) and the read retry operation (using the first adjust read voltage) performed on the target physical page without preparing the verified data to obtain a plurality of codewards corresponding to the target physical page and perform the preset decoding operation on the codeword to obtain the plurality of corresponding syndromes. Thereafter, in response to the failure of the read retry operation (the syndromes corresponding to the codewords in the read retry operation are not zero), the soft information of each of the target memory cells of the target physical page can be further generated according to the size relative relation among the syndromes and the codewords to find the confidence values of the target memory cells from the confidence tables corresponding to the size relative relation and the target physical page, so as to perform the adjusted iterative decoding operation according to the confidence values. In this way, the adjusted iterative decoding operation with more powerful decoding capability can be performed for decoding to obtain the valid codeword of the target physical page, such that the correct valid codeword can be obtained after the failure of the read retry operation, and the accuracy and the reliability of the data read from the target word line can be enhanced. Thereby, the negative effect due to the failure of the read retry operation can be mitigated, and the overall time of the read operation for obtaining the valid codeword can be saved, so as to improve the overall efficiency of the data reading operation.

To make the above features and advantages of the invention more comprehensible, embodiments accompanied with drawings are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6A is a schematic diagram illustrating the setting of a plurality of predetermined confidence values corresponding to the first descending mode and a target physical page having 1 transition read voltage according to an embodiment of the invention.

FIG. 6E is a schematic diagram illustrating a plurality of predetermined confidence tables corresponding to the first descending mode of various target physical pages according to an embodiment of the invention.

FIG. 7C is a schematic diagram illustrating a plurality of predetermined confidence tables corresponding to the first descending mode of various target physical pages according to an embodiment of the invention.

FIG. 8C is a schematic diagram illustrating a plurality of predetermined confidence tables corresponding to the horizontal mode of various target physical pages according to an embodiment of the invention.

FIG. 9E is a schematic diagram illustrating a plurality of predetermined confidence tables corresponding to the second descending mode of various target physical pages according to an embodiment of the invention.

FIG. 10 is a schematic diagram illustrating a plurality of predetermined confidence tables corresponding to the second ascending mode of various target physical pages according to an embodiment of the invention.

FIG. 11C is a schematic diagram illustrating a plurality of predetermined confidence tables corresponding to the hook-like mode of various target physical pages according to an embodiment of the invention.

FIG. 12A is a schematic diagram illustrating the calculation of deviation amount difference values according to an embodiment of the invention.

FIG. 12B is a schematic diagram illustrating a statistical table for recording the deviation amount difference values and deviation amount difference value summations according to an embodiment of the invention.

FIG. 13 is a schematic diagram illustrating the sorting of a plurality of read voltage sets by the deviation amount difference value summations according to an embodiment of the invention.

DESCRIPTION OF EMBODIMENTS

Figure 1:
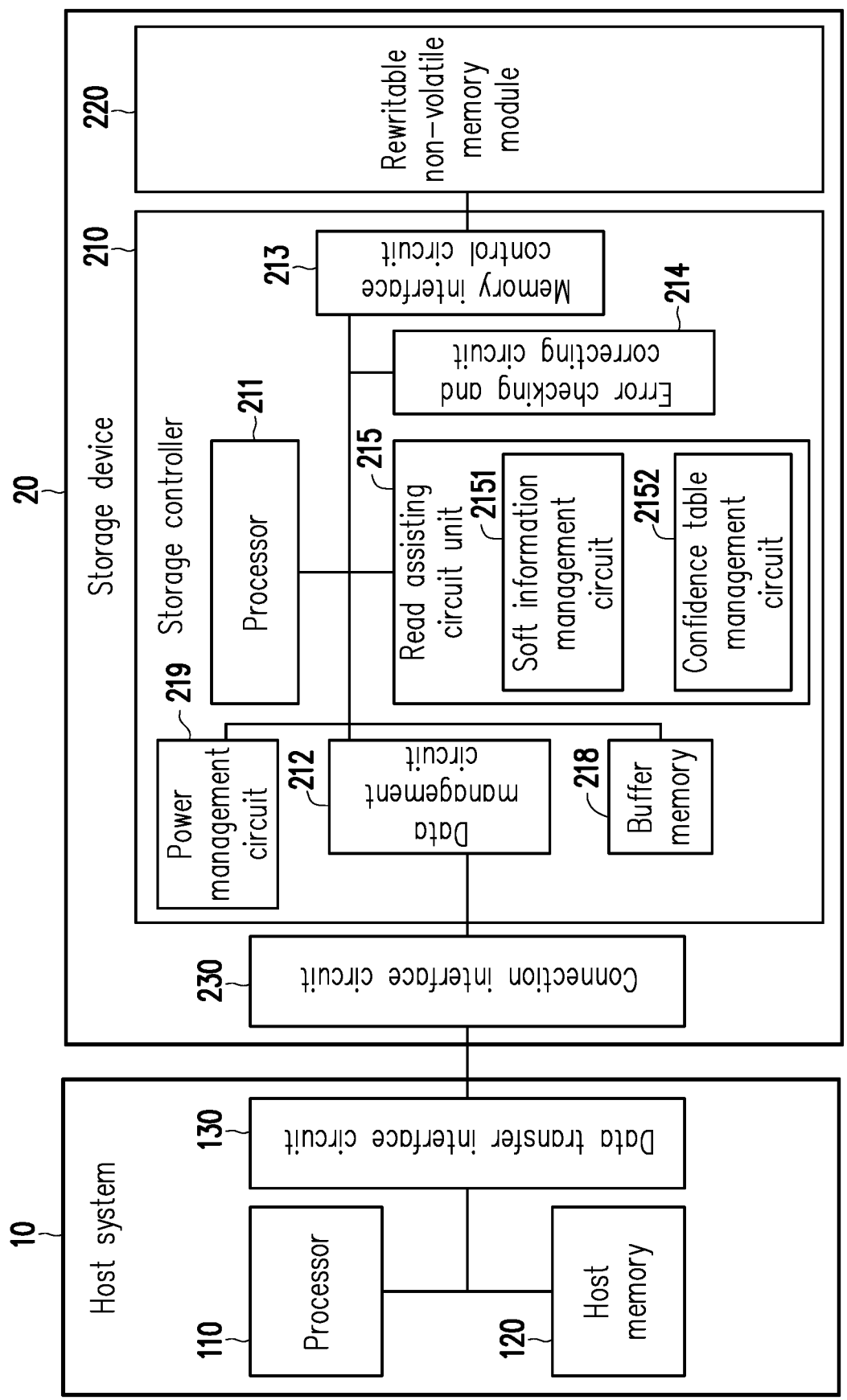
FIG. 1 is a schematic block diagram illustrating a host system and a storage device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that both are conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In the present embodiment, a storage device includes a rewritable non-volatile memory module and a storage device controller (a.k.a. a storage controller or a storage control circuit). Also, the storage device is usually used together with a host system so the host system can write data into or read data from the storage device.

FIG. 1A is a block diagram illustrating a host system and a storage device according to an embodiment of the invention.

Referring to FIG. 1A, a host system 10 includes a processor 110, a host memory 120 and a data transfer interface circuit 130. In present embodiment, the data transfer interface circuit 130 is coupled to (or, electrically connected to) the processor 110 and the host memory 120. In another embodiment, the processor 110, the host memory 120 and the data transfer interface circuit 130 are coupled to one another by utilizing a system bus.

A storage device 20 includes a storage controller 210, a rewritable non-volatile memory module 220 and a connection interface circuit 230. Among them, the storage controller 210 includes a processor 211, a data management circuit 212 and a memory interface control circuit 213.

In present embodiment, the host system 10 is coupled to the storage device 20 through the data transfer interface circuit 130 and the connection interface circuit 230 of the storage device 20 to perform a data accessing operation. For example, the host system 10 may store data into the storage device 20 or read data from the storage device 20 through the data transfer interface circuit 130.

In present embodiment, the processor 110, the host memory 120 and the data transfer interface circuit 130 may be disposed on a main board of the host system 10. The number of the data transfer interface circuit 130 may be one or more. Through the data transfer interface circuit 130, the main board may be coupled to the storage device 20 in a wired manner or a wireless manner. The storage device 20 may be, for example, a flash drive, a memory card, a solid state drive (SSD) or a wireless memory storage device. The wireless memory storage device may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board may also be coupled to various I/O devices including a Global Positioning System) module, a network interface card, a wireless transmission device, a keyboard, a monitor and a speaker through the system bus.

In the present embodiment, the data transfer interface circuit 130 and the connection interface circuit 230 are interface circuits compatible with a peripheral component interconnect express (PCI Express) interface standard. Further, data is transferred between the data transfer interface circuit 130 and the connection interface circuit 230 by using a communication protocol of a non-volatile memory express (NVMe) interface standard.

However, it should be understood that the invention is not limited thereto, and the data transfer interface circuit 130 and the connection interface circuit 230 may also be compatible to a parallel advanced technology attachment (PATA) standard, an Institute of Electrical and Electronic Engineers (IEEE) 1394 standard, a serial advanced technology attachment (SATA) standard, a universal serial bus (USB) standard, a SD interface standard, an ultra high speed-I (UHS-I) interface standard, an ultra high speed-II (UHS-II) interface standard, a memory stick (MS) interface standard, a multi-chip package interface standard, a multi media card (MMC) interface standard, an eMMC interface standard, a universal flash storage (UFS) interface standard, an eMCP interface standard, a CF interface standard, an integrated device electronics (IDE) interface standard or other suitable standards. Further, in another embodiment, the connection interface circuit 230 and the storage controller 210 may be packaged into one chip, or the connection interface circuit 230 is distributed outside a chip containing the storage controller 210.

In present embodiment, the host memory 120 is configured to temporarily store commands executed by the processor 110 or data. For instance, in this exemplary embodiment, the host memory 120 may be a dynamic random access memory (DRAM), or a static random access memory (SRAM) and the like. Nevertheless, it should be understood that the invention is not limited in this regard, and the host memory 120 may also be other appropriate memories.

The storage controller 210 is configured to execute a plurality of logic gates or control commands, which are implemented in a hardware form or in a firmware form, and to perform operations of data writing, data reading or data erasing in the rewritable non-volatile memory storage module 220 according to the commands of the host system 10.

More specifically, the processor 211 in the storage controller 210 is a hardware with computing capabilities, which is configured to control overall operation of the storage controller 210. Specifically, the processor 211 has a plurality of control commands, and the control commands may be executed to perform various operations such as data writing, data reading and data erasing when the storage device 20 is in operation.

It should be noted that, in the present embodiment, the processor 110 and the processor 211 are, for example, a central processing unit (CPU), a micro-processor, other programmable microprocessors, a digital signal processor (DSP), a programmable controller, an application specific integrated circuits (ASIC), a programmable logic device (PLD) or other similar circuit elements. The invention is not limited in this regard.

In an embodiment, the storage controller 210 further includes a ROM (not illustrated) and a RAM (not illustrated). More particularly, the ROM has a boot code, which is executed by the processor 221 to load the control commands stored in the rewritable non-volatile memory module 220 into the RAM of the storage controller 210 when the storage controller 210 is enabled. Then, the control commands are executed by the processor 211 to perform operations, such as data writing, data reading or data erasing. In another embodiment, the control commands of the processor 211 may also be stored as program codes in a specific area (for example, physical storage units in the rewritable non-volatile memory module 220 dedicated for storing system data) of the rewritable non-volatile memory module 220.

In present embodiment, as described above, the storage controller 210 further includes the data management circuit 212 and the memory interface control circuit 213. It should be noted that, the operations performed by each part of the storage controller 210 may also be considered as operations performed by the storage controller 210.

The data management circuit 212 is coupled to the processor 211, the memory interface control circuit 213 and the connection interface circuit 230. The data management circuit 212 is configured to perform data transmission under instruction of the processor 211. For example, the data may be read from the host system 10 (e.g., the host memory 120) through the connection interface circuit 230, and the read data may be written into the rewritable non-volatile memory module 220 through the memory interface control circuit 213 (e.g., a writing operation performed according to the write command from the host system 10). As another example, the data may be read from one or more physical units of the rewritable non-volatile memory module 220 through the memory interface control circuit 213 (i.e., the data may be read from one or more memory cells in one or more physical units), and the read data may be written into the host system 10 (e.g., the host memory 120) through the connection interface circuit 230 (e.g., a read operation performed according to a read command from the host system 10). In another embodiment, the data management circuit 212 may also be integrated into the processor 211.

The memory interface control circuit 213 is configured to perform the writing (or, programming) operation, the read operation and the erasing operation on the rewritable non-volatile memory module 220 together with the data management circuit 212 under the instruction of the processor 211.

For instance, the processor 211 may execute a write command sequence to instruct the memory interface control circuit 213 to write the data into the rewritable non-volatile memory module 220; the processor 211 may execute a read command sequence to instruct the memory interface control circuit 213 to read the data from one or more physical units (also referred to as target physical units) corresponding to the read command in the rewritable non-volatile memory module 220; the processor 211 may execute an erase command sequence to instruct the memory interface control circuit 213 to perform the erasing operation for the rewritable non-volatile memory module 220. Each of the write command sequence, the read command sequence and the erase command sequence may include one or more program codes or command codes, which are configured to perform the corresponding operations, such as writing, reading and erasing, on the rewritable non-volatile memory module 220.

In an embodiment, the processor 211 may further issue other types of command sequences to the memory interface control circuit 213 to perform a corresponding operation on the rewritable non-volatile memory module 220.

In addition, data to be written to the rewritable non-volatile memory module 220 is converted into a format acceptable by the rewritable non-volatile memory module 220 through the memory interface control circuit 213. Specifically, if the memory management circuit 211 is to access the rewritable non-volatile memory module 220, the processor 211 may transmit a corresponding command sequence to the memory interface control circuit 213 to instruct the memory interface control circuit 213 to perform a corresponding operation. For example, the command sequences may include the write command sequence for instructing to write data, the read command sequence for instructing to read data, the erase command sequence for instructing to erase data, and other corresponding command sequences for instructing to perform various memory operations (e.g., changing a plurality of predetermined read voltage values of a preset read voltage set to perform the read operation or a read assisting operation, or performing a garbage collection procedure). These command sequences may include one or more signals or data on the bus. The signals or data may include command codes or program codes. For example, a read command sequence may include information, such as a read identification code, a memory address and so on.

The rewritable non-volatile memory module 220 is coupled to the storage controller 210 (the memory control circuit unit 213) and configured to store the data written by the host system 10. The rewritable non-volatile memory module 220 may be a single level cell (SLC) NAND flash memory module (i.e., a flash memory module capable of storing one bit in one memory cell), a multi level cell (MLC) NAND flash memory module (i.e., a flash memory module capable of storing two bits in one memory cell), a triple level cell (TLC) NAND flash memory module (i.e., a flash memory module capable of storing three bits in one memory cell), a quadruple level cell (QLC) NAND flash memory module (i.e., a flash memory module capable of storing four bits in one memory cell), a 3D NAND flash memory module or a vertical NAND flash memory module, other flash memory modules or other memory modules having the same features. The memory cells in the rewritable non-volatile memory module 220 are disposed in an array.

In present embodiment, the rewritable non-volatile memory module 220 has a plurality of word lines, wherein each word line among the word lines includes a plurality of memory cells. The memory cells on the same word line constitute one or more physical programming units. In addition, a plurality of physical programming units may constitute one physical unit (a physical block or a physical erasing unit). In present embodiment, the triple level cell (TLC) NAND flash memory is taken as an example for description. That is to say, in the following embodiments, one memory cell capable of storing three bit values is used as one physical programming unit (i.e., in each programming operation, the data is configured to be programmed by applying a programming voltage one by one on the physical programming units). Here, each memory cell may be grouped into a lower physical page, a middle physical page and an upper physical page, each of which is capable of storing one bit value.

In present embodiment, the memory cell is used as a minimum unit for writing (programming) data. The physical unit is a minimum unit for erasing. Namely, each physical unit includes a minimum number of memory cells to be erased together.

In the following embodiments, a TLC NAND flash memory module is taken as an example to perform a read assisting operation (perform the read assisting operation on a plurality of memory cells of a specific word line). A data reading method used by the read assisting operation is also described as follows. However, the read assisting operation and the data reading method provided by the embodiments of the invention may also be applied to other types of flash memory modules.

The storage controller 210 may assign a plurality of logical units to the rewritable non-volatile memory module 220. The host system 10 may access user data stored in the physical units through the assigned logical units. Here, each of the logical units may be composed of one or more logical addresses. For example, the logical unit may be a logical block, a logical page, or a logical sector. One logical unit may be mapped to one or more physical units, wherein the physical unit may be one or more physical addresses, one or more physical sectors, one or more physical programming units, or one or more physical erasing units. In the present embodiment, the logical unit is a logical block, and a logical sub-unit is a logical page. Each logical unit has a plurality of logical sub-units.

In addition, the storage controller 210 may create a logical to physical address mapping table and a physical to logical address mapping table for recording a mapping relation between the logical units (e.g., the logical blocks, the logical pages or the logical sectors) assigned to the rewritable non-volatile memory module 220 and the physical units (e.g., the physical erasing units, the physical programming units or the physical sectors). In other words, the storage controller 210 may find a physical unit mapped to a logical unit based on the logical to physical address mapping table, and the storage controller 210 may find a logical unit mapped to a physical unit based on the physical to logical address mapping table. Nonetheless, the technical concept with respect to the mapping relation between the logical units and the physical units is a well-known technical means to persons skilled in the field and is not the technical solution to be introduced by the invention, which is not repeated hereinafter.

In the present embodiment, an error checking and correcting circuit 214 is coupled to the processor 211 and configured to perform an error checking and correction procedure to ensure data accuracy. To be specific, when the processor 211 receives a write command from the host system 10, the error checking and correcting circuit 214 generates an error checking and correction code (ECC) and/or an error detecting code (EDC) for the data corresponding to the write command, and the processor 211 may write the data and the corresponding ECC and/or EDC to the rewritable non-volatile memory module 220. Subsequently, when reading the data from the rewritable non-volatile memory module 220, the processor 211 may simultaneously read the ECC and/or the EDC corresponding to the data, and the error checking and correcting circuit 214 may perform the error checking and correcting procedure on the read data based on the ECC and/or EDC. Moreover, after the error checking and correcting procedure, the error checking and correcting circuit 214 may return an error bit count to the processor 211 if the read data is successfully decoded.

In present embodiment, an iterative decoding operation performed by the error checking and correcting circuit 214 uses a low density parity code (LDPC) algorithm. Specifically, after receiving a codeword to be decoded (also referred to as a target codeword or a raw codeword), the error checking and correcting circuit 214 starts to perform the iterative decoding operation on the received codeword, identify a plurality of soft information of the received codeword, inquire in a corresponding log likelihood ratio table (also referred to as an LLR table) according to the plurality of soft information to obtain a plurality of log likelihood ratios corresponding to the plurality of soft information, and perform a round of the iterative decoding operation on the codeword according to the log likelihood ratios and the soft information corresponding to the codeword. The iterative decoding operation performed on the codeword according to the log likelihood ratios and the soft information corresponding to the codeword may also be referred to as a soft decoding operation. It should be noted that the iterative decoding operation performed on a hard bit codeword according to the hard bit codeword and a plurality of predetermined log likelihood ratios corresponding to the hard bit codeword may also be referred to as a hard decoding operation.

In the present embodiment, whenever the error checking and correcting circuit 214 completes a round of the iterative decoding operation on one of the codewords, the error checking and correcting circuit 214 may obtain a decoded codeword corresponding to the codeword and syndromes corresponding to the decoded codeword. The error checking and correcting circuit 214 may determine whether the decoding is successful or failed in the currently performed iterative decoding operation according to the syndromes.

If the decoding is failed, the error checking and correcting circuit 214 may determine whether to subsequently perform again one or more iterative decoding operations according to a total number of the iterative decoding operations performed according to statistics of the codeword and a predetermined iterative number threshold. If the total number is greater than the predetermined iterative number threshold, the error checking and correcting circuit 214 may determine that the preset decoding operation (which may include one or more iterative decoding operations) on the codeword is failed and output the finally obtained decoded codeword and its corresponding syndromes. If the total number is not greater than the predetermined iterative number threshold, the error checking and correcting circuit 214 may again perform a new round of the iterative decoding operation according to the obtained decoded codeword and its corresponding syndromes. A manufacturer may self set the predetermined iterative number threshold based on a demand, and the invention is not limited thereto.

At the end of each of (or each round of) the iterative decoding operations, the error checking and correcting circuit 214 may calculate the syndromes corresponding to the currently lastest obtained decoded codeword to determine whether the current iterative decoding operation is successful or failed. If the decoding is successful (the codeword generated after the decoding is correct, which is a valid codeword), the current iterative decoding operation ends and so does the preset decoding operation performed on the codeword. If the decoding is failed (the codeword generated after the decoding is incorrect, which is an invalid codeword), the current iterative decoding operation ends and a new round (a next round) of the iterative decoding operation is restarted in a condition that the total number is not greater than the predetermined iterative number threshold.

To be more specific, in each iterative decoding operation, the error checking and correcting circuit 214 may determine whether a plurality of bit values of the syndromes corresponding to the decoded codeword are all zero. If the bit values of the syndromes are all zero (i.e., "0"), the error checking and correcting circuit 214 may determine that the decoded codeword is correct, complete the current iterative decoding operation, complete the preset decoding operation corresponding to the codeword and output the decoded codeword which is the valid codeword, so as to complete the read operation corresponding to the raw codeword.

Otherwise, if the bit values of the syndrome are not all zero (i.e., one or more of the bit values is "1"), the error checking and correcting circuit 214 may determine that the decoded codeword is incorrect and end the current iterative decoding operation and the preset decoding operation performed on the codeword.

In the present embodiment, the error checking and correcting circuit 214 may further identify a size of each syndrome according to a total number of bit values of "1" of each syndrome (also referred to as a first bit value total number, wherein the first bit value is "1"). In other words, the error checking and correcting circuit 214 may identify the syndrome with the greater first bit value total number as a greater syndrome. In an embodiment, the error checking and correcting circuit 214 may identify the total number (the first bit value total number) of the bit values of "1" of each of the syndromes in a syndrome buffer area, thereby finding a smallest syndrome having a minimum first bit value total number among the plurality of syndromes. The syndrome buffer area may be configured in a buffer memory 218, or configured in a read assisting circuit unit 215 or in a buffer memory of the error checking and correcting circuit 214.

It should be noted that the description set forth above is merely used to explain the corresponding relationship among the raw codeword, the decoded codeword and the corresponding syndrome, other details related to the iterative decoding operation, the raw codeword, the syndromes and the decoded codeword with respect to the LDPC algorithm do not pertain to the technical solution of the invention and will not be repeated hereinafter.

In an embodiment, the storage controller 210 may further include the buffer memory 218 and a power management circuit 219. The buffer memory is coupled to the processor 211 and configured to temporarily store the data and the commands from the host system 10, the data from the rewritable non-volatile memory module 220 or other system data (e.g., the log likelihood ratio table, the confidence table and so on) for managing the storage device 20, such that the processor 211 may rapidly access the data, the commands or the system data from the buffer memory 218. The power management circuit 219 is coupled to the processor 211 and configured to control power of the storage device 20.

In the present embodiment, the read assisting circuit unit 215 includes a soft information management circuit 2151 and a confidence table management circuit 2152. The read assisting circuit unit 215 is configured to perform a read assisting operation on specific physical pages of a plurality of word lines. To be more specific, the processor 211, at a specific time point, may select a word line (also referred to as a target word line) among the word lines belonging to a plurality of physical units of the rewritable non-volatile memory module 220 and instruct the read assisting circuit unit 215 to perform the read assisting operation (also referred to as the read retry operation) on the target word line.

For example, the specific time point include and is not limited to: (1) when the decoding operation is failed; (2) when the read operation is performed on a word line with a poor physical state (e.g., a word line having a greater erasing number, a greater reading number, a longer retention time or a greater error bit count); (3) when the error bit count of data read from a word line exceeds an error bit count threshold; or (4) when a general read operation is performed on the target word line.

In order to conveniently describe that the invention may utilize a result of a read retry operation and corresponding technical means and benefits, it is assumed in the following embodiments that a target physical page of a target word line is selected by the storage controller 210 to perform a general read operation and correspondingly perform a subsequent read retry operation. It should be noted that the selected target word line already stores data, i.e., data which has been programmed. In the present embodiment, the stored data is not known data or verified data previously set by the manufacturer or the system. For example, the stored data is user data.

In the present embodiment, the read assisting circuit unit 215 may perform the general read operation or the read retry operation on the target physical page of the target word line to obtain a storage state of the target physical page of each of a plurality of target memory cells of the target word line by using a predetermined read voltage (also referred to as a predetermined transition read voltage) corresponding to the general read operation. The predetermined read voltages of a physical page are predetermined transition read voltages configured to distinguish storage states of a plurality of memory cells of the physical page. In general, the predetermined transition read voltages are ideally located at intersections between a plurality of threshold voltage distributions of all the memory cells of the physical page.

The read assisting circuit unit 215 may perform the read retry operation on the target physical page to obtain another storage state of the target physical page of each of the target memory cells of the target word line by using an adjust read voltage (also referred to as a predetermined transition read voltage) corresponding to the predetermined read voltage. There is a voltage difference value between the adjust read voltage and the predetermined read voltage. The adjust read voltage may be previously designed according to a read retry index and the predetermined read voltage of the read retry operation. The adjust read voltage may also be generated according to a predetermined voltage offset value and the predetermined read voltage, wherein the adjust read voltage may be the predetermined read voltage subtracted by the predetermined voltage offset value or added by the predetermined voltage offset value. The concept of the storage state of each physical page and the corresponding transition read voltage is described below.

In the present embodiment, as described above, the target word line stores data. Specifically, the memory cells of each word line may have one or more physical pages (each physical page stores a bit value), each of the memory cells is configured to be programmed to store a bit value corresponding to one of a plurality of different Gray code patterns, and a total number of the Gray code patterns is P, wherein a total number of bit values stored by each Gray code pattern is equal to to a total number of the physical pages of each memory cell. P is a first predetermined positive integer greater than 2, and the value of P may be previously set according to the type of the rewritable non-volatile memory module 220. For example, if the rewritable non-volatile memory module 220 is an MLC NAND flash memory module, P=4, and the total number of bit values stored by each Gray code pattern is 2. If the rewritable non-volatile memory module 220 is an SLC NAND flash memory module, P=2, and the total number of bit values stored by each Gray code pattern is 1. If the rewritable non-volatile memory module 220 is a QLC NAND flash memory module, P=16, and the total number of bit values stored by each Gray code pattern is 4.

For uniformity of description, a TLC NAND flash memory module is taken as an example in the present embodiment, and a plurality of memory cells of the target word line may store the bit values respectively corresponding to 8 Gray code patterns (P=8), and the total number of bit values stored by each Gray code pattern is 3. Details related to the Gray code patterns will be described with reference to FIG. 3A.

Figure 3A:
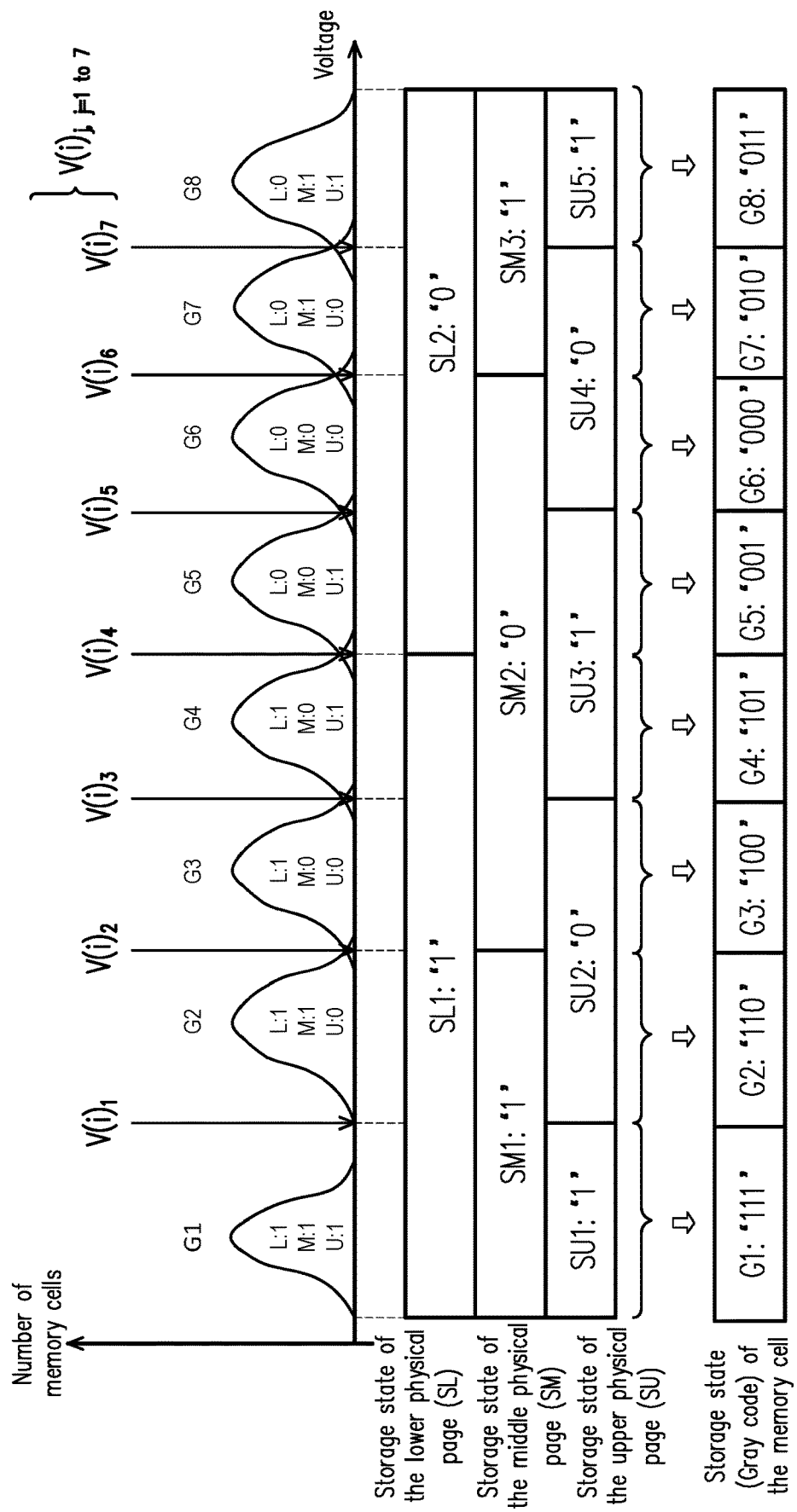
FIG. 3A is a schematic diagram illustrating a plurality of transition read voltages and a plurality of storage states corresponding to a plurality of physical pages having a first read voltage mode (1/2/4) according to an embodiment of the invention.

FIG. 3A is a schematic diagram illustrating threshold voltage distributions having a first read voltage mode (1/2/4) and the corresponding Gray code patterns according to an embodiment of the invention. Since the rewritable non-volatile memory module 220 of the TLC NAND flash memory module is taken as an example in the present embodiment, wherein P is 8 (i.e., $2^3$), each memory cell of the TLC NAND flash memory module has three physical pages for respectively storing bit data. Each of the aforementioned memory cells may store a lower physical page (L), a middle physical page (M) and an upper physical page (U), each of which is capable of storing a bit value. It is assumed that the processor 211 reads a plurality of memory cells (i.e., a plurality of target memory cells) of a target word line of the TLC NAND flash memory module by using a plurality of transition read voltages $V(i)_1$ to $V(i)_7$ of a predetermined read voltage set V(i) and thereby, identifies different bit values (i.e., bit values corresponding to different Gray code patterns) stored by the memory cells. Gate voltages in each memory cell may be divided into 8 Gray code patterns, for example, "L:1 M:1 U:1", "L:1 M:1 U:0", "L:1 M:0 U:0", "L:1 M:0 U:1", "L:0 M:0 U:1", "L:0 M:0 U:0", "L:0 M:1 U:0" and "L:0 M:1 U:1" (wherein "L:" represents the bit value of the lower physical page; "M:" represents the bit value of the middle physical page; and "U:" represents the bit value of the upper physical page) according to the transition read voltages $V(i)_1$ to $V(i)_7$ in the predetermined read voltage set V(i). The 8 Gray code patterns may also be expressed as 8 kinds of bit value combinations, which are "111", "110", "100", "101", "001", "000", "010", and "011". An order of the bit values in each of the bit value combinations is in accordance with the order of the upper, middle, and lower physical pages. That is to say, through applying the read voltages $V(i)_1$ to $V(i)_7$ having different voltage values of the read voltage set V(i) to one of the memory cells of the target word line, the processor 211 may determine whether a channel of the memory cell is turned on to respectively determine that the bit values (also referred to as bit data or read bit values) stored in the memory cell correspond to one of the different Gray code patterns (i.e., "111", "110", "100", "101", "001", "110", "010", and "011") (i.e., the read bit values are read from one of the memory cells of the target word line by using the predetermined read voltage set V(i)).

In the present embodiment, the threshold voltage distributions of the word line may be divided into a plurality of threshold voltage distribution areas according to the corresponding transition read voltages. The threshold voltage distribution areas and the Gray code patterns have a one-to-one mapping relationship between each other. Referring to FIG. 3A, a threshold voltage distribution area G1 corresponds to the Gray code pattern of "111"; a threshold voltage distribution area G2 corresponds to the Gray code pattern of "110"; a threshold voltage distribution area G3 corresponds to the Gray code pattern of "100"; a threshold voltage distribution area G4 corresponds to the Gray code pattern of "101"; a threshold voltage distribution area G5 corresponds to the Gray code pattern of "001"; a threshold voltage distribution area G6 corresponds to the Gray code pattern of "000"; a threshold voltage distribution area G7 corresponds to the Gray code pattern of "010"; and a threshold voltage distribution area G8 corresponds to the Gray code pattern of "011". Moreover, in the present embodiment, if a memory cell has a storage state corresponding to the Gray code pattern of "011", this memory cell may be considered as belonging to the threshold voltage distribution area G8, or the threshold voltage distribution of this memory cell may be considered as belonging to the threshold voltage distribution area G8.

It should be noted that according to a total number of the Gray code patterns that the memory cells of the rewritable non-volatile memory module 220 may have (which is 8 in this example), the processor 211 may determine a total number of the transition read voltages of the predetermined read voltage set, wherein the total number of the transition read voltages of the predetermined read voltage set is the total number of the Gray code patterns subtracted by 1 (which is 7 in this example, i.e., P−1=8−1=7). In addition, a total number of the threshold voltage distribution areas is also equal to the total number of the Gray code patterns.

More specifically, a storage state (also referred to as a Gray code) corresponding to a Gray code pattern stored by a memory cell may be formed by sequentially combining a storage state of the lower physical page (SL), a storage state of the middle physical page (SM) and a storage state of the upper physical page (SU) of the memory cell (as shown by a plurality of arrows in FIG. 3A).

In the present embodiment, the transition read voltage $V(i)_4$ is configured to divide storage states SL1 ("1") and SL2 ("0") of the lower physical page; the transition read voltages $V(i)_2$ and $V(i)_6$ are configured to divide storage states SM1 ("1"), SM2 ("0") and SM3 ("1") of the middle physical page; and the transition read voltages $V(i)_1$, $V(i)_3$, $V(i)_5$ and $V(i)_7$ are configured to divide storage states SU1 ("1"), SU2 ("0"), SU3 ("1"), SU4 ("0") and SU5 ("1") of the upper physical page.

The processor 211 (or the read assisting circuit unit 215) may use the transition read voltages corresponding to the lower physical page, the middle physical page and the upper physical page in the predetermined read voltage set to sequentially read the word line to obtain the storage states of the lower physical pages, the middle physical pages and the upper physical pages of the memory cells of the word line, so as to obtain the Gray codes of the memory cells. For example, it is assumed that the processor 211 (or the read assisting circuit unit 215) uses the predetermined read voltage set V(i) to read the word line to obtain the Gray codes of the memory cells of the word line. The processor 211 (or the read assisting circuit unit 215) may first use the transition read voltage $V(i)_4$ to identify whether the storage states of the lower physical pages of all the memory cells belong to the storage state SL1 or the storage state SL2. Then, the processor 211 (or the read assisting circuit unit 215) may further use the transition read voltages $V(i)_2$ and $V(i)_6$ to identify whether the storage states of the middle physical pages of all the memory cells belong to the storage state SM1, the storage state SM2 or the storage state SM3. Then, the processor 211 (or the read assisting circuit unit 215) may further use the transition read voltages $V(i)_1$, $V(i)_3$, $V(i)_5$ and $V(i)_7$ to identify whether the storage states of the upper physical pages of all the memory cells belong to the storage state SU1, the storage state SU2, the storage state SU3, the storage state SU4 or the storage state SU5. In this way, the processor 211 (or the read assisting circuit unit 215) may identify the storage states of the lower physical pages, the middle physical pages and the upper physical pages of all the memory cells, so as to identify the Gray codes stored by all the memory cells.

Moreover, the rewritable non-volatile memory module 220 with the aforementioned characteristics with respect to the physical pages and the number of the corresponding transition read voltages may also be considered as the rewritable non-volatile memory module 220 (i.e., TLC NAND flash memory module) having the first read voltage mode (1/2/4). "1/2/4" as described above respectively correspond to the total numbers of the transition read voltages that the lower physical pages/the middle physical pages/the upper physical pages have. The invention is not intent to limit the rewritable non-volatile memory module 220 to have the first read voltage mode. The data reading method, the storage controller and the storage device provided by the invention may also applied to the rewritable non-volatile memory module 220 having another read voltage mode, which will be described with reference to FIG. 3B.

Figure 3B:
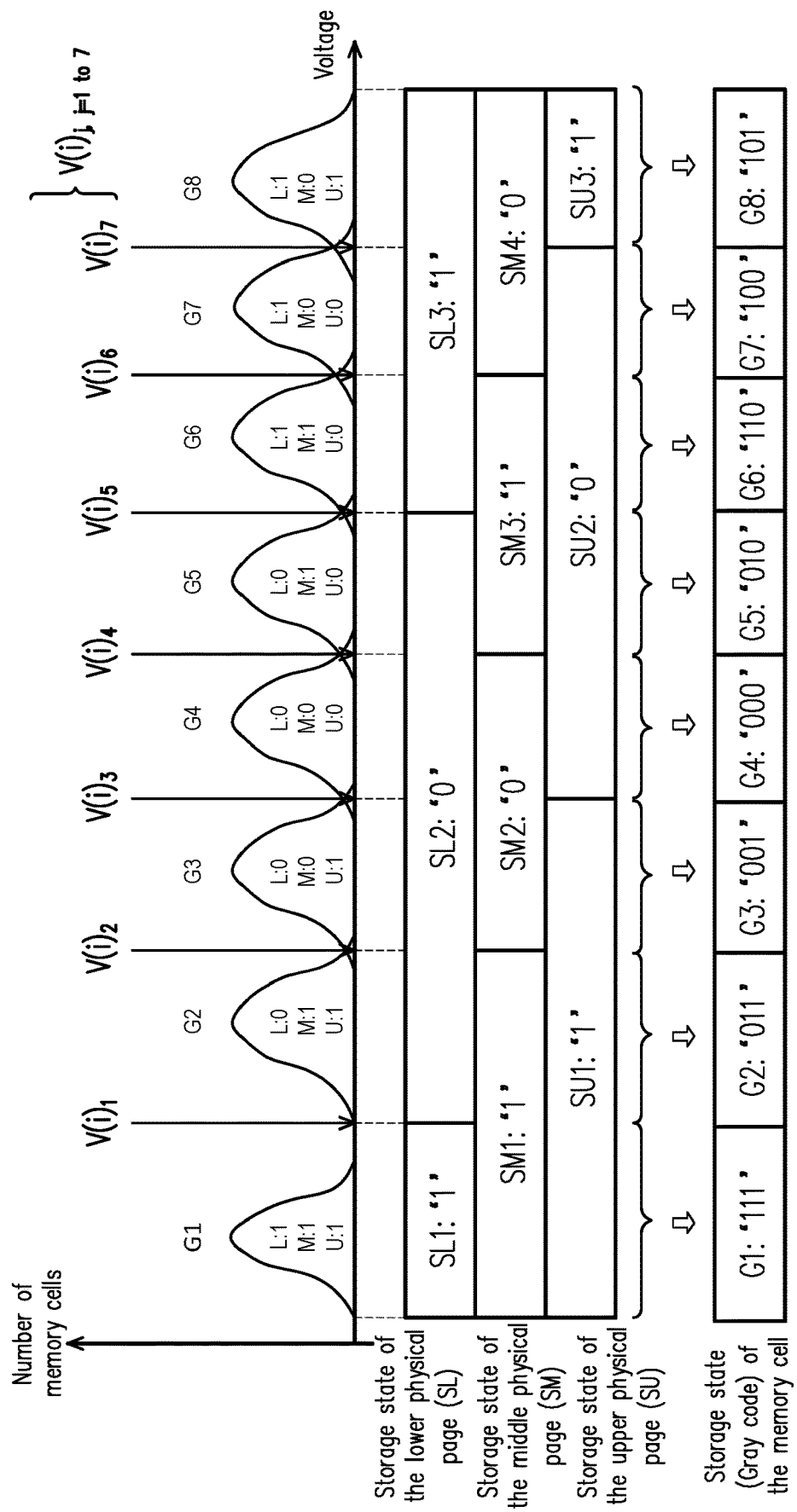
FIG. 3B is a schematic diagram illustrating a plurality of transition read voltages and a plurality of storage states corresponding to a plurality of physical pages having a second read voltage mode (2/3/2) according to an embodiment of the invention.

FIG. 3B is a schematic diagram illustrating threshold voltage distributions having a second read voltage mode (2/3/2) and the corresponding Gray code patterns according to an embodiment of the invention. Referring to FIG. 3B, regarding the rewritable non-volatile memory module 220 (i.e., the TLC NAND flash memory module) having the second read voltage mode (2/3/2), the read voltages $V(i)_1$ and $V(i)_5$ are configured to divide storage states SL1 ("1"), SL2 ("0") and SL3 ("1") of the lower physical page; the transition read voltages $V(i)_2$, $V(i)_4$ and $V(i)_6$ are configured to divide storage states SM1 ("1"), SM2 ("0"), SM3 ("1") and SM4 ("0") of the middle physical page; and the read voltages $V(i)_3$ and $V(i)_7$ are configured to divide storage states SU1 ("1"), SU2 ("0") and SU3 ("1") of the upper physical page. "2/3/2" as described above respectively correspond to the total numbers of the transition read voltages that the lower physical pages/the middle physical pages/the upper physical pages have.

Gate voltages in each memory cell of the rewritable non-volatile memory module 220 having the second read voltage mode (2/3/2) may be divided into 8 Gray code patterns, for example, "L:1 M:1 U:1", "L:0 M:1 U:1", "L:0 M:0 U:1", "L:0 M:0 U:0", "L:0 M:1 U:0", "L:1 M:1 U:0", "L:1 M:0 U:0" and "L:1 M:0 U:1", according to the transition read voltages $V(i)_1$ to $V(i)_7$ in the predetermined read voltage set V(i). The 8 Gray code patterns may also be expressed as 8 kinds of bit value combinations, which are "111", "110", "100", "101", "001", "000", "010", and "011". An order of the bit values in each of the bit value combinations is in accordance with the order of the storage states of the upper, middle, and lower physical pages.

Moreover, Referring to FIG. 3B, the threshold voltage distribution area G1 corresponds to the Gray code pattern of "111"; the threshold voltage distribution area G2 corresponds to the Gray code pattern of "011"; the threshold voltage distribution area G3 corresponds to the Gray code pattern of "001"; the threshold voltage distribution area G4 corresponds to the Gray code pattern of "000"; the threshold voltage distribution area G5 corresponds to the Gray code pattern of "010"; the threshold voltage distribution area G6 corresponds to the Gray code pattern of "110"; the threshold voltage distribution area G7 corresponds to the Gray code pattern of "100"; and the threshold voltage distribution area G8 corresponds to the Gray code pattern of "101". Moreover, in the present embodiment, if a memory cell has a storage state corresponding to the Gray code pattern of "011", this memory cell may be considered as belonging to the threshold voltage distribution area G2, or the threshold voltage distribution of this memory cell may be considered as belonging to the threshold voltage distribution area G2.

In the present embodiment, the threshold voltage distributions of the physical pages of the memory cells of the word line may likely have a shift phenomenon in comparison with a predetermined threshold voltage distribution. Due to the shifting of the threshold voltage distributions, the predetermined transition read voltage previously corresponding to the predetermined threshold voltage of the physical pages are no longer suitable for dividing the storage states of the corresponding physical pages. In other words, in this case, the read bit values (also referred to as read codewords) stored by a plurality of memory cells of the originally read and identified physical pages may be distorted and lead to a failure of the corresponding decoding operation. In this circumstance, the processor 211 performs the read retry operation to use an adjust read voltage different from the predetermined read voltage to read the physical pages and obtain a plurality of read bit values (also referred to as adjust codewords) of the physical pages, and try to decode the adjust codewords. If the decoding operation corresponding to the adjust codewords is failed, the read assisting circuit unit 215 may use the read codewords and the adjust codewords together with a plurality of syndromes corresponding to the read codewords and the adjust codewords to identify the soft information and the confidence value of each of the physical pages of the memory cells, and the error checking and correcting circuit 214 may perform a preset decoding operation (e.g., an LDPC decoding operation) according to the confidence value and the soft information of each of the memory cells, which will be described with reference to FIG. 2.

Figure 2:
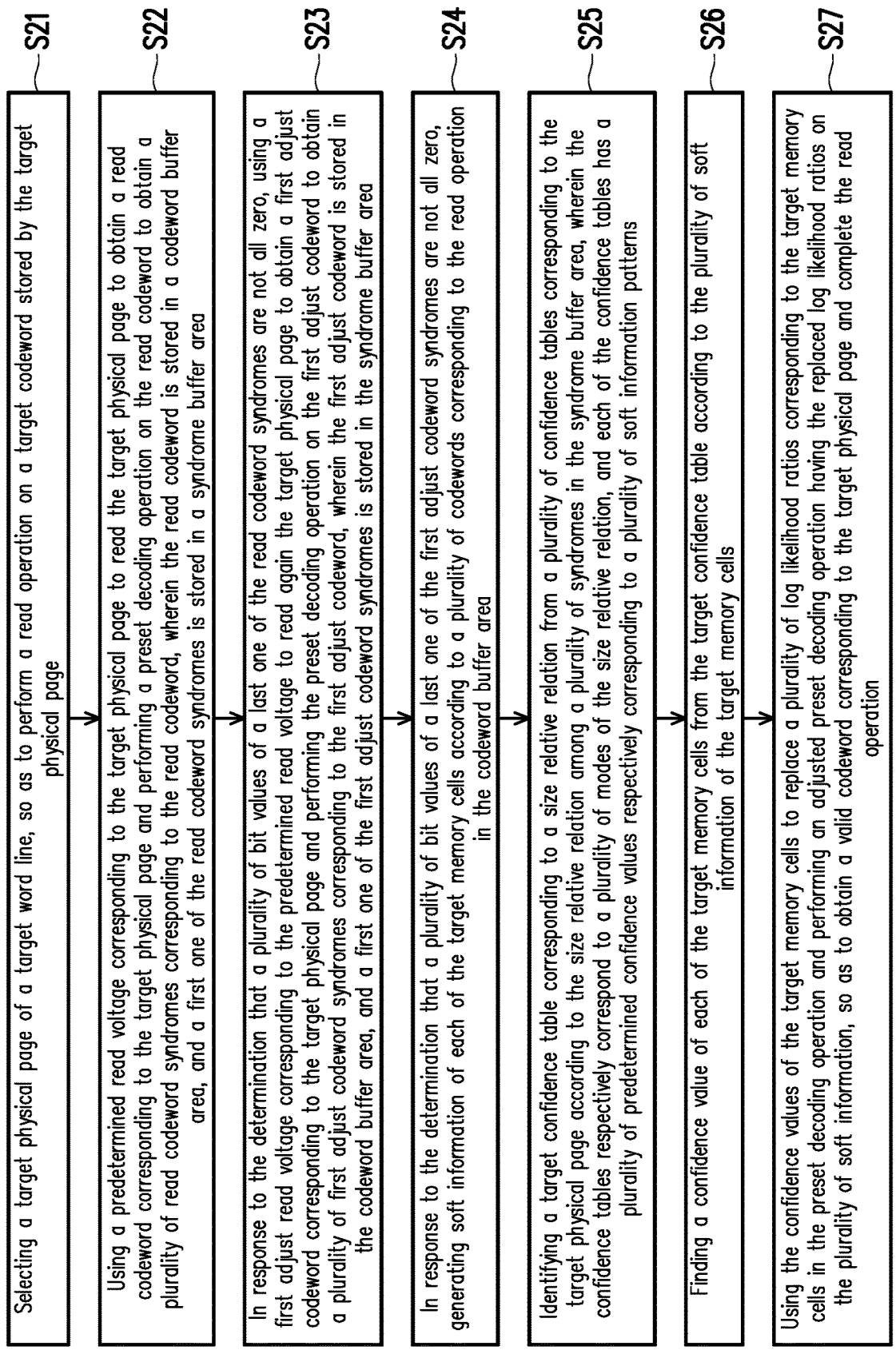
FIG. 2 is a flowchart of a data reading method according to an embodiment of the invention.

FIG. 2 is a flowchart of a data reading method according to an embodiment of the invention. Referring to FIG. 2, in step S21, the processor 211 select a target physical page of a target word line, so as to perform a read operation on a target codeword stored by the target physical page. Specifically, the method and the timing of selecting the target physical page have been described in detail above and will not be not repeated hereinafter. In an embodiment, the processor 211 may find a physical address corresponding to a logical address according to the logical address indicated in a read command received from the host system 10 and select the target physical page corresponding to the physical address for performing the read operation.

Then, in step S22, the read assisting circuit unit 215 (or the soft information management circuit 2151) uses a predetermined read voltage corresponding to the target physical page to read the target physical page to obtain a read codeword corresponding to the target physical page, and the error checking and correcting circuit 214 performs a preset decoding operation on the read codeword to obtain a plurality of read codeword syndromes corresponding to the read codeword, wherein the read codeword is stored in a codeword buffer area, and a first one of the read codeword syndromes is stored in a syndrome buffer area.

For example, if it is assumed that the target physical page is a lower physical page, as illustrated in FIG. 3A, the read assisting circuit unit 215 (or the soft information management circuit 2151) may use a predetermined read voltage $V(1)_4$ corresponding to the lower physical page to read the lower physical page to obtain a storage state of the lower physical pages of each of a plurality of target memory cells of the target word line. The storage states of the lower physical pages of each of the target memory cell may constitute a read codeword corresponding to the lower physical page.

Thereafter, the error checking and correcting circuit 214 performs the preset decoding operation on the read codeword. As described above, the error checking and correcting circuit 214 performs a plurality of iterative decoding operations on the read codeword and obtains a plurality of syndromes (also referred to as read codeword syndromes) corresponding to the iterative decoding operations. A total number of the iterative decoding operations is not over an iterative number threshold. The error checking and correcting circuit 214 may sequentially obtain the read codeword syndromes according to an execution order of the iterative decoding operations. The read assisting circuit unit 215 (or the soft information management circuit 2151) may store the foremost sorted one of the read codeword syndromes (which is the first one of the read codeword syndromes) in the syndrome buffer area and store the read codeword in the codeword buffer area. The first one of the read codeword syndromes is the syndrome obtained after the first one of the iterative decoding operations is performed on the read codeword. The invention is not intent to limit configuration locations of the syndrome buffer area and the codeword buffer area. For example, in an embodiment, the syndrome buffer area or the codeword buffer area may be configured in a buffer memory of the read assisting circuit unit 215.

Moreover, as described above, the error checking and correcting circuit 214 may determine whether the preset decoding operation corresponding to the read codeword is successful according to whether a plurality of bit values of a last one of the read codeword syndromes (i.e., the read codeword syndrome arranged in the last among the read codeword syndromes) are all zero.

In step S23, in response to the determination that the bit values of the last one of the read codeword syndromes are not all zero, the processor 211 uses a first adjust read voltage corresponding to the predetermined read voltage to read again the target physical page to obtain a first adjust codeword corresponding to the target physical page, and the error checking and correcting circuit 214 performs the preset decoding operation on the first adjust codeword to obtain a plurality of first adjust codeword syndromes corresponding to the first adjust codeword, wherein the first adjust codeword is stored in the codeword buffer area, and a first one of the first adjust codeword syndromes is stored in the syndrome buffer area.

Specifically, in response to the determination that the bit values of the last one of the read codeword syndromes are not all zero (i.e., it is determined that the preset decoding operation corresponding to the read codeword is failed/unsuccessful), the read assisting circuit unit 215 performs a read retry operation corresponding to the target physical page. In the read retry operation, the processor 211 uses the first adjust read voltage corresponding to the predetermined read voltage to read again the target physical page to obtain the first adjust codeword corresponding to the target physical page.

Afterwards, the error checking and correcting circuit 214 performs the preset decoding operation on the first adjust codeword. As described above, the error checking and correcting circuit 214 performs a plurality of iterative decoding operations on the first adjust codeword and obtains a plurality of syndromes (also referred to as the first adjust codeword syndromes) corresponding to the iterative decoding operations. The error checking and correcting circuit 214 may sequentially obtain the first adjust codeword syndromes according to an execution order of the iterative decoding operations. The read assisting circuit unit 215 (or the soft information management circuit 2151) may store the foremost storted one of the first adjust codeword syndromes (which is the first one of the first adjust codeword syndromes) in the syndrome buffer area and store the first adjust codeword in the codeword buffer area. The first one of the first adjust codeword syndromes is the syndrome obtained after the first one of the iterative decoding operations is performed on the first adjust codeword. In this circumstance, the first adjust codeword syndrome corresponding to the first adjust codeword and the read codeword syndromes corresponding to the read codeword are stored in the syndrome buffer area, and the first adjust codeword and the read codeword are stored in the codeword buffer area. It should be noted that in the present embodiment, the codeword buffer area is configured to store a raw codeword (i.e., a codeword on which the decoding operation is not performed) read by using each read voltage, and the syndrome buffer area is configured to store a plurality of syndromes obtained after the first one of the iterative decoding operations is performed on the raw codewords in the codeword buffer area.

The error checking and correcting circuit 214 may determine whether the preset decoding operation corresponding to the first adjust codeword is successful according to whether a plurality of bit values of a last one of the first adjust codeword syndromes (i.e., the first adjust codeword syndrome arranged in the last among the first adjust codeword syndrome) are all zero. If they are all zero, the error checking and correcting circuit 214 determines that the preset decoding operation corresponding to the first adjust codeword is successful, if they are not all zero, the error checking and correcting circuit 214 determines that the preset decoding operation corresponding to the first adjust codeword is unsuccessful (failed) (which also indicates that the read retry operation is failed) and performs step S24.

It is to be mentioned that in response to the determination that the bit values of the last one of the read codeword syndromes are all zero, the error checking and correcting circuit 214 identifies a decoded read codeword corresponding to the last one of the read codeword syndromes as a valid codeword of the read operation and completes the read operation. Moreover, in response to the determination that the bit values of the last one of the first adjust codeword syndromes are all zero, the error checking and correcting circuit 214 identifies a decoded first adjust codeword corresponding to the last one of the first adjust codeword syndromes as the valid codeword corresponding to the read operation and completes the read operation.

In step S24, in response to the determination that the bit values of the last one of the first adjust codeword syndrome are not all zero, the read assisting circuit unit 215 (or the soft information management circuit 2151) generates the soft information of each of the target memory cells according to a plurality of codewords corresponding to the read operation in the codeword buffer area.

Specifically, in the present embodiment, the soft information management circuit 2151 identifies a smallest syndrome which has the minimum total number of bit values of "1" among the syndromes in the syndrome buffer area.

Then, the soft information management circuit 2151 selects a codeword corresponding to the smallest syndrome among the codewords in the codeword buffer area to set the selected codeword as a hard bit codeword corresponding to the target memory cells and set the rest of the codewords in the codeword buffer area which are not selected as soft bit codewords corresponding to the target memory cells.

Lastly, the soft information management circuit 2151 uses the hard bit codeword and the soft bit codewords to constitute the soft information of each of the target memory cells.

Figure 4A:
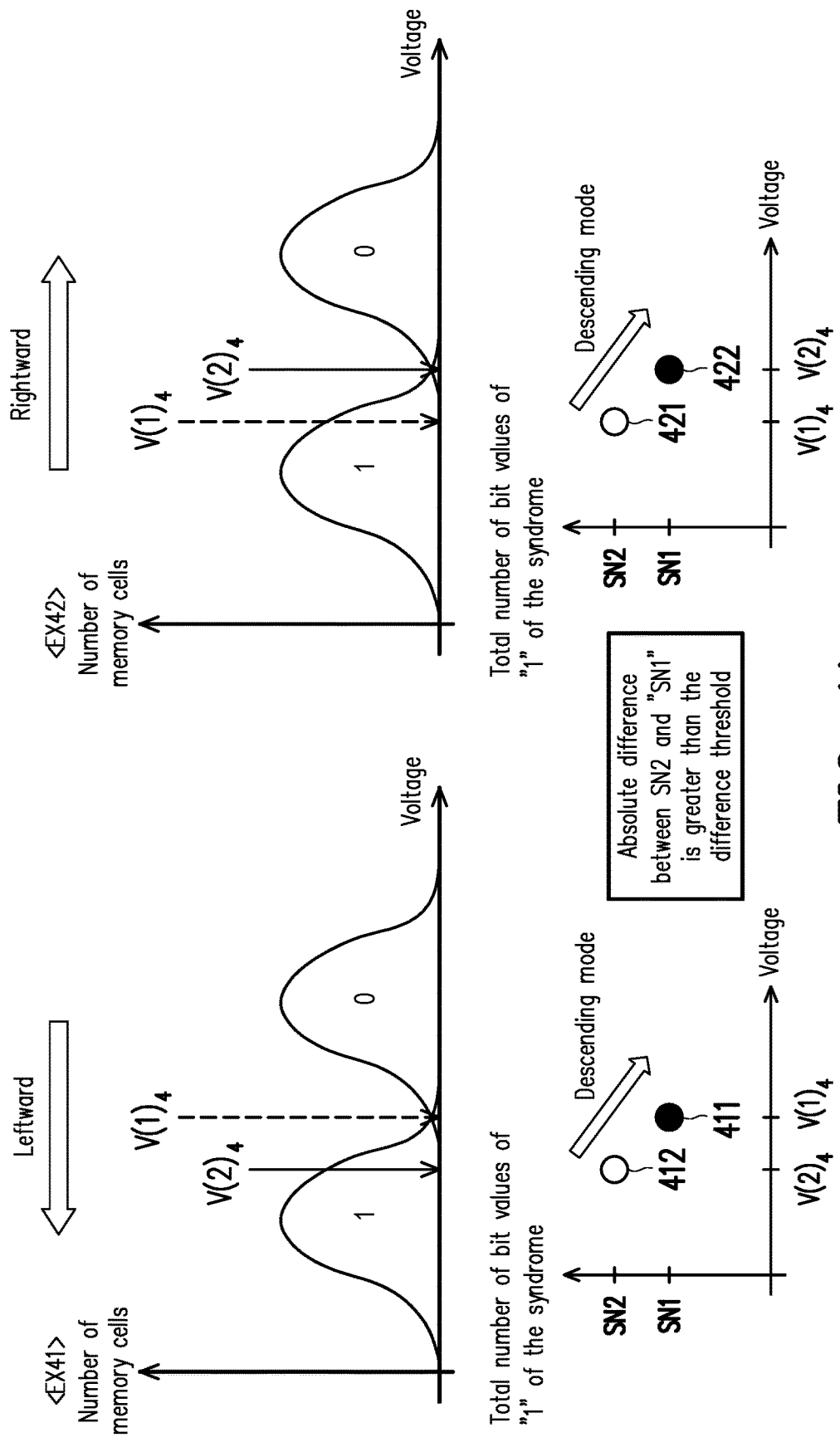
FIG. 4A is a schematic diagram illustrating a size relative relation among a plurality of syndromes having a first descending mode according to an embodiment of the invention.

FIG. 4A is a schematic diagram illustrating a size relative relation among a plurality of syndromes having a first descending mode according to an embodiment of the invention. FIG. 6A is a schematic diagram illustrating the setting of a plurality of predetermined confidence values corresponding to a plurality of transition read voltages and the target physical page having 1 transition read voltage according to an embodiment of the invention.

Referring to FIG. 4A and FIG. 6A, it is assumed that the target physical page is a lower physical page, the read assisting circuit unit 215 first uses a predetermined read voltage $V(1)_4$ corresponding to the lower physical page to read the lower physical page to obtain a read codeword and its corresponding read codeword syndrome 411, and the read assisting circuit unit 215 uses a first adjust read voltage $V(2)_4$ corresponding to the predetermined read voltage $V(1)_4$ to read the lower physical page to obtain a first adjust codeword and its corresponding a first adjust codeword syndrome 412. The read codeword syndrome 411 and the first adjust codeword syndrome 412 are stored in the syndrome buffer area.

Moreover, the soft information management circuit 2151 may identify a first bit value number (i.e., a total number of bit values of "1") of the read codeword syndrome 411 as "SN1" and identify a first bit value number of the first adjust codeword syndrome 412 as "SN2" (wherein SN2>SN1).

Because the first bit value number of the read codeword syndrome 411 is the smallest, the soft information management circuit 2151 may select/identify the read codeword syndrome 411 as a smallest syndrome and set a read codeword corresponding to the read codeword syndromes 411 as a hard bit codeword. Thereafter, the soft information management circuit 2151 may set the rest of the syndromes, i.e., the first adjust codeword syndrome 412, in the syndrome buffer area as a soft bit codeword.

As illustrated in FIG. 6A, the soft information management circuit 2151 may combine the hard bit codeword and the soft bit codeword as a plurality of soft information read by a plurality of target memory cells of the target physical page. That is to say, for a specific memory cell, the soft information management circuit 2151 may identify a read bit value corresponding to this memory cell from the hard bit codeword and identify this read bit value as a hard bit value of this memory cell. The soft information management circuit 2151 may identify a read bit value corresponding to this memory cell from the soft bit codeword and identify this read bit value as a soft bit value from the soft bit codeword. Thereafter, the soft information management circuit 2151 may combine the hard bit value and the soft bit value to obtain the soft information of this memory cell. It should be noted that in an embodiment, in case there are a plurality of soft bit codewords, the soft information management circuit 2151 may, according to an absolute voltage difference value between the read voltage corresponding to the soft bit codeword and the read voltage corresponding to the hard bit codeword, sort in an ascending order and sequentially select the soft bit codewords to combine the soft information (for example, the soft bit codeword corresponding to the smallest absolute voltage difference value is first selected for to combine the soft information).

In the present embodiment, with the soft information of one target memory cell, the soft information management circuit 2151 may identify a voltage relative relationship among a threshold voltage distribution area belonging to the target memory cell and transition read voltages of the target physical page.

For example, it is assumed that the soft information management circuit 2151 is to identify a threshold voltage distribution area belonging to a first target memory cell (having soft information of "1 0") and a voltage relative relationship between and first target memory cell and a transition read voltage $V(1)_4$ of a lower physical page. The soft information management circuit 2151 may identify the first target memory cell as belonging to a threshold voltage distribution area R61 between the read voltage $V(1)_4$ and a read voltage $V(2)_4$ by identifying the soft information of "1 0" of the first target memory cell. Further, in another example, another target memory cell having soft information of "1 1" is identified as belonging to a threshold voltage distribution area R62, and yet another target memory cell having soft information of "0 0" is identified as belonging to a threshold voltage distribution area R63. In the present embodiment, the closer the read bit value stored by the memory cell is to the transition read voltage, the higher misjudgment probability the read bit value has, such that the memory cell which is closest to the transition read voltage has the lowest confidence value, and the memory cell which is farthest from the transition read voltage has the highest confidence value. Among the threshold voltage distribution areas R61 to R63, the first target memory cell belonging to the threshold voltage distribution area R61 is closer to the transition read voltage $V(1)_4$ than another target memory cell belonging to the threshold voltage distribution area R62. Accordingly, a confidence value of the first target memory cell (i.e., the memory cell having the soft information of "1 0") belonging to the threshold voltage distribution area R61 is set to be a smaller absolute value (e.g., |A|), while a confidence value of another target memory cell (i.e., the memory cell having the soft information of "1 1") belonging to the threshold voltage distribution area R62 is set to be a greater absolute value (e.g., |B|). On the other hand, because a range of the threshold voltage distribution area R63 belonging to yet another memory cell having the soft information of "0 0" is from a voltage value of the transition read voltage $V(1)_4$ to infinity, an absolute value (e.g., |X|) of a confidence value corresponding to the soft information of "0 0" may be set according to a range interval. A maximum value of the range interval is |B|, and a minimum value thereof is In an embodiment, X may be set to be an average value of A and B. It should be noted that since a soft information pattern of "0 1" does not belong to and correspond to the read voltage $V(1)_4$, the soft information pattern of "0 1" is not recorded in the corresponding confidence table, or a predetermined confidence value corresponding to the soft information pattern of "0 1" may be directly set to "0".

After the soft information of each of the target memory cells is obtained, in step S25, the read assisting circuit unit 215 (or the confidence table management circuit 2152) may identify a target confidence table corresponding to a size relative relation from a plurality of confidence tables corresponding to the target physical page according to the size relative relation among a plurality of syndromes in the syndrome buffer area, wherein the confidence tables respectively correspond to a plurality of modes of the size relative relation, and each of the confidence tables has a plurality of predetermined confidence values respectively corresponding to a plurality of soft information patterns.

Specifically, in the present embodiment, the confidence table management circuit 2152 (or the soft information management circuit 2151) may determine whether the size relative relation among a plurality of syndromes in the syndrome buffer area belongs to one of the modes. The aforementioned modes may be further classified according to a total number of the syndromes in the syndrome buffer area. If the total number of the syndromes is 2 (for example, including a read codeword syndrome corresponding to a read codeword and a first adjust codeword syndrome corresponding to a first adjust codeword), the modes of the size relative relation between the 2 syndromes includes a first descending mode, a first ascending mode and a horizontal mode, wherein the 2 syndromes may be classified into a left syndrome corresponding to a codeword read by a low read voltage and a right syndrome corresponding to a codeword read by a high read voltage. More specifically, if a total number of bit values of "1" of the left syndrome is greater than a total number of bit values of "1" of the right syndrome, the size relative relation is identified as the first descending mode, wherein the right syndrome is identified as the smallest syndrome. If the total number of bit values of "1" of the right syndrome is greater than the total number of bit values of "1" of the left syndrome, the size relative relation is identified as the first ascending mode, wherein the left syndrome is identified as the smallest syndrome. If a difference between the total number of bit values of "1" of the right syndrome and the total number of bit values of "1" of the left syndrome is less than a syndrome difference threshold and the total number of bit values of "1" of the right syndrome and the total number of bit values of "1" of the left syndrome both are less than a syndrome threshold, the size relative relation is identified as the horizontal mode, wherein the syndrome having the smaller total number of bit values of "1" is identified as the smallest syndrome. Moreover, the confidence table management circuit 2152 may design a plurality of confidence tables respectively corresponding to the first descending mode, the first ascending mode and the horizontal mode.

On the other hand, if the total number of the syndromes is 3 (for example, including a read codeword syndrome corresponding to the read codeword, a first adjust codeword syndrome corresponding to the first adjust codeword and a second adjust codeword syndrome corresponding to a second adjust codeword), the modes of the size relative relation among the 3 syndromes includes a second descending mode, a second ascending mode and a hook-like mode, wherein the 3 syndromes may be classified into a left syndrome corresponding to a codeword read by a low read voltage, a right syndrome corresponding to a codeword read by a high read voltage and an middle syndrome corresponding to a codeword read by an intermediate read voltage. More specifically, if a total number of bit values of "1" of the left syndrome is greater than a total number of bit values of "1" of the middle syndrome and the total number of bit values of "1" of the middle syndrome is greater than a total number of bit values of "1" of the right syndrome, the size relative relation is identified as the second descending mode, wherein the right syndrome is identified as the smallest syndrome. If the total number of bit values of "1" of the right syndrome is greater than the total number of bit values of "1" of the middle syndrome and the total number of bit values of "1" of the middle syndrome is greater than the total number of bit values of "1" of the left syndrome, the size relative relation is identified as the second ascending mode, wherein the left syndrome is identified as the smallest syndrome. If the total number of bit values of "1" of the middle syndrome is less than the total number of bit values of "1" of the left syndrome and the total number of bit values of "1" of the middle syndrome is less than the total number of bit values of "1" of the right syndrome, the size relative relation is identified as the hook-like mode, wherein the middle syndrome is identified as the smallest syndrome. Moreover, the confidence table management circuit 2152 may design a plurality of confidence tables respectively corresponding to the second descending mode, the second ascending mode and the hook-like mode. The determination/identification of the modes will be further described with reference to a plurality of drawings below.

Referring to FIG. 4A, as demonstrated by Example <EX41>, it is assumed that the target physical page (e.g., the lower physical page) has 1 transition read voltage (e.g., the predetermined read voltage $V(1)_4$), and the soft information management circuit 2151 performs reading twice on the target physical page (respectively by using the predetermined read voltage $V(1)_4$ and the leftward adjusted first adjust read voltage $V(2)_4$ generated corresponding to the predetermined read voltage $V(1)_4$) and performs a corresponding preset decoding operation to obtain a read codeword and a read codeword syndrome corresponding to the predetermined read voltage $V(1)_4$ and a first adjust codeword and the first adjust codeword syndrome corresponding to the first adjust read voltage $V(2)_4$. Moreover, a total number (a first bit value total number) of bit values of "1" of the read codeword syndrome 412 corresponding to the read codeword obtained according to the predetermined read voltage $V(1)_4$ is "SN2", and a first bit value total number of the first adjust codeword syndrome 411 corresponding to the first adjust codeword obtained according to the first adjust read voltage $V(2)_4$ is "SN1", wherein "SN2" is greater than "SN1". Because in a direction from left to right, the sizes of the syndromes 412 and 411 exhibit a descending trend, the confidence table management circuit 2152 (or the soft information management circuit 2151) determines the size relative relation between the syndromes 411 and 412 as the first descending mode. It should be noted that because the predetermined read voltage $V(1)_4$ is closer to a junction between two threshold voltage distributions, the corresponding read codeword will be more correct (i.e., the first bit value total number of the corresponding syndrome is smaller).

Similarly, as demonstrated by Example <EX42>, it is assumed that the target physical page (e.g., the lower physical page) has 1 transition read voltage (e.g., the predetermined read voltage $V(1)_4$), the soft information management circuit 2151 performs reading twice on the target physical page (respectively by using the predetermined read voltage $V(1)_4$ and the rightward adjusted first adjust read voltage $V(2)_4$ generated corresponding to the predetermined read voltage $V(1)_4$). A first bit value total number of a read codeword syndrome 421 corresponding to the read codeword obtained according to the predetermined read voltage $V(1)_4$ is "SN1", and a first bit value total number of a first adjust codeword syndrome 422 corresponding to the first adjust codeword obtained according to the first adjust read voltage $V(2)_4$ is "SN2". Because in a direction from left to right, the sizes of the syndromes 421 and 422 exhibit a descending trend, the confidence table management circuit 2152 (or the soft information management circuit 2151) determines the size relative relation between the syndromes 421 and 422 as the first descending mode. It is to be mentioned that in an embodiment, the confidence table management circuit 2152 (or the soft information management circuit 2151) determines whether an absolute difference between "SN2" and "SN1" is greater than a difference threshold. If it is greater than the difference threshold, the confidence table management circuit 2152 (or the soft information management circuit 2151) further determines whether the size relative relation has the first ascending mode or the first descending mode.

Figure 4B:
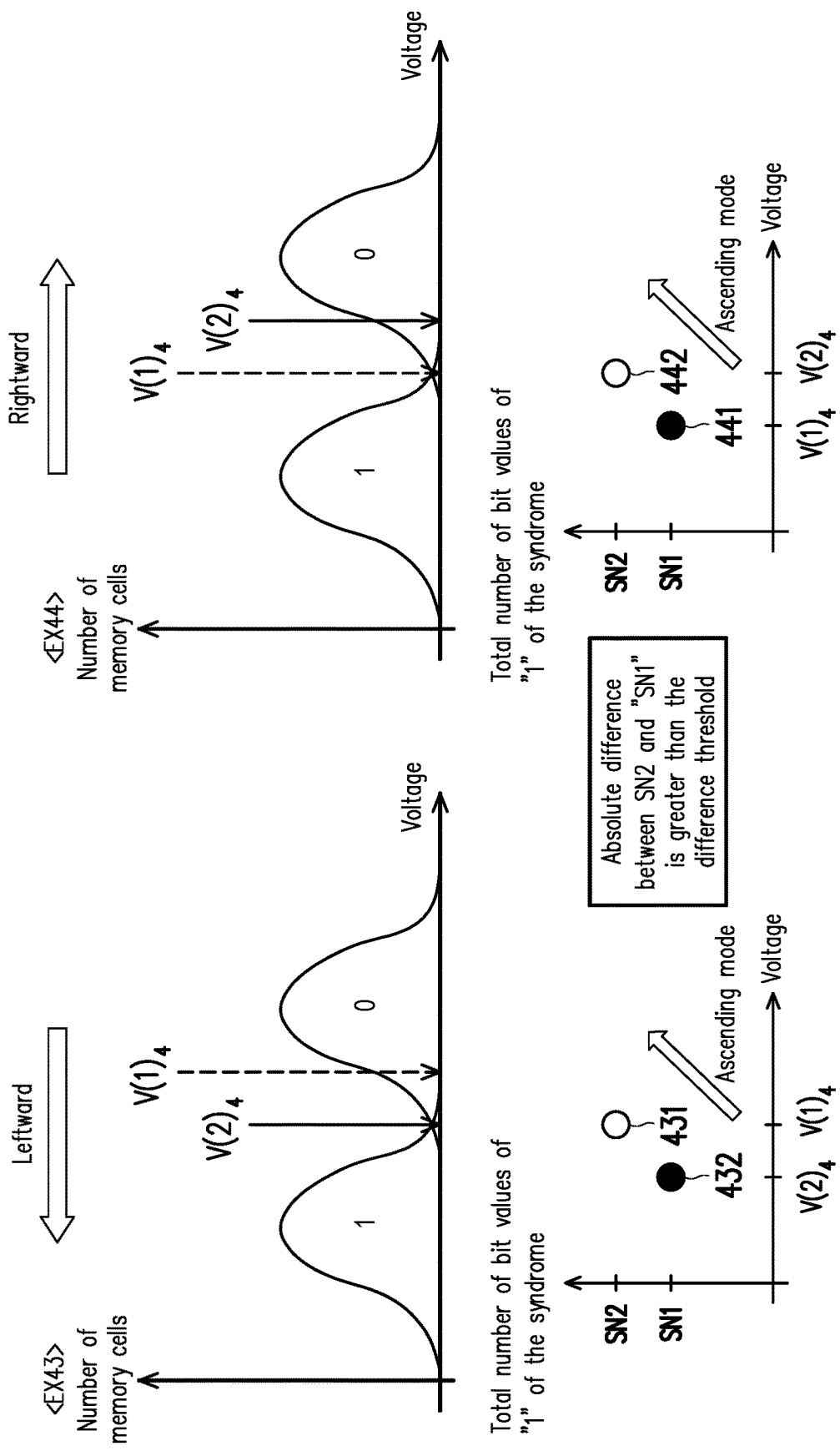
FIG. 4B is a schematic diagram illustrating a size relative relation among a plurality of syndromes having the first ascending mode according to an embodiment of the invention.

FIG. 4B is a schematic diagram illustrating a size relative relation among a plurality of syndromes having the first ascending mode according to an embodiment of the invention.

Referring to FIG. 4B, as demonstrated by Example <EX43>, it is assumed that the soft information management circuit 2151 performs reading twice on the target physical page respectively by using the predetermined read voltage $V(1)_4$ and the first adjust read voltage $V(2)_4$. In addition, a first bit value total number of a read codeword syndrome 431 corresponding to the read codeword obtained according to the predetermined read voltage $V(1)_4$ is "SN2", and a first bit value total number of a first adjust codeword syndrome 432 corresponding to the first adjust codeword obtained according to the first adjust read voltage $V(2)_4$ is "SN1", wherein "SN2" is greater than "SN1". Because in a direction from left to right, the sizes of the syndromes 432 and 431 exhibit an ascending trend, the confidence table management circuit 2152 (or the soft information management circuit 2151) determines the size relative relation between the syndromes 431 and 432 as the first ascending mode. Similarly, Example <EX44> is another example having the first ascending mode. A first bit value total number of "SN1" of a read codeword syndrome 441 corresponding to the predetermined read voltage $V(1)_4$ is smaller than a first bit value total number of "SN2" of a first adjust codeword syndrome 442 corresponding to the first adjust read voltage $V(2)_4$, the sizes of the read codeword syndrome 441 and the first adjust codeword syndrome 442 exhibit an ascending trend. The read codeword syndrome 441 and the first adjust codeword syndrome 442 are identified to have the first ascending mode.

It should be noted that in an embodiment, if an absolute difference between the first bit value total numbers of the syndromes in the syndrome buffer area is not greater than the difference threshold and each of the syndromes is smaller than the syndrome threshold, the confidence table management circuit 2152 (or the soft information management circuit 2151) determines the syndromes as having the horizontal mode.

Figure 4C:
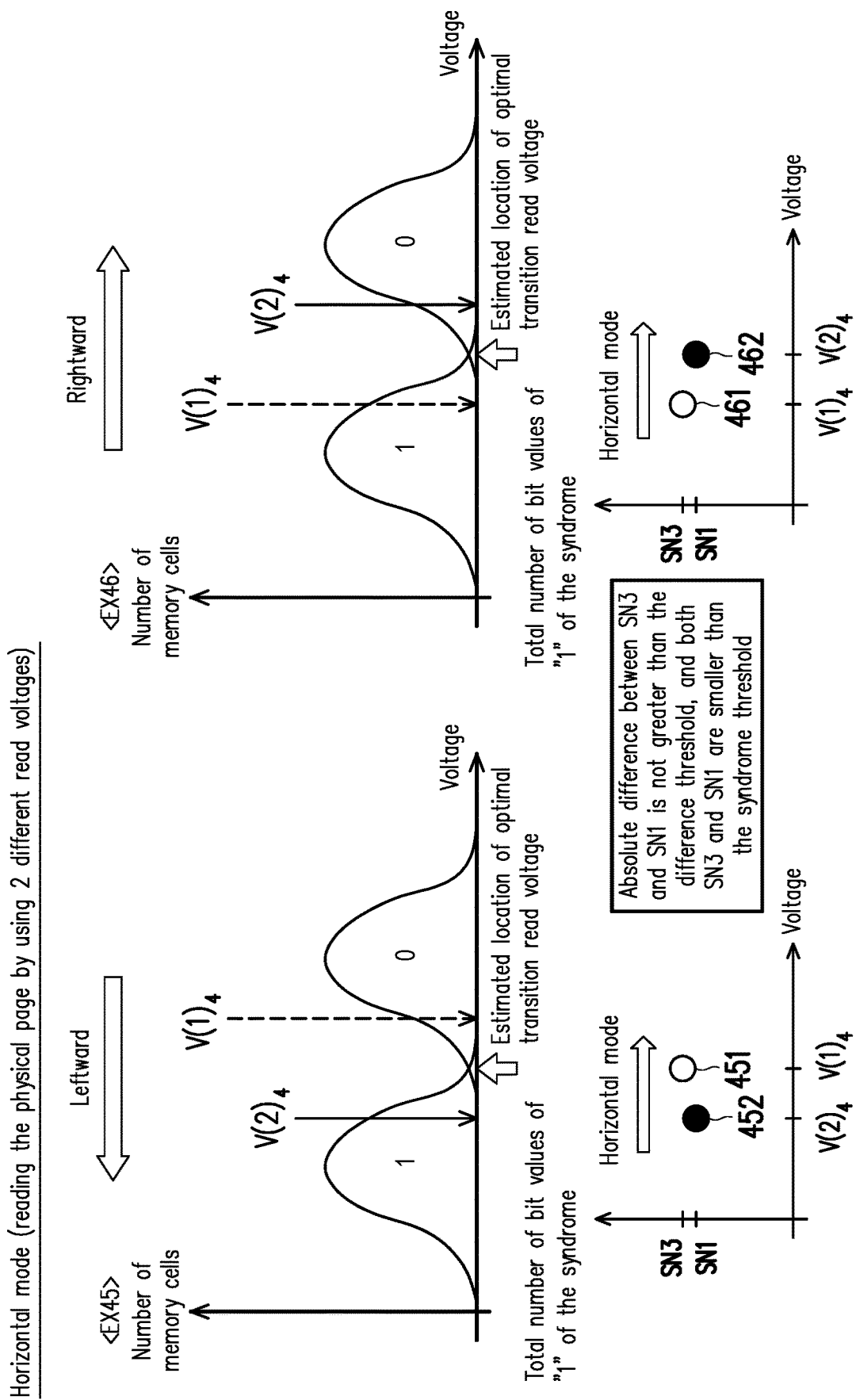
FIG. 4C is a schematic diagram illustrating a size relative relation among a plurality of syndromes having the horizontal mode according to an embodiment of the invention.

FIG. 4C is a schematic diagram illustrating a size relative relation among a plurality of syndromes having the horizontal mode according to an embodiment of the invention. Referring to FIG. 4C, as demonstrated by Example <EX45>, it is assumed that the target physical page (e.g., the lower physical page) has 1 transition read voltage (e.g., the predetermined read voltage $V(1)_4$), the soft information management circuit 2151 performs reading twice on the target physical page respectively by using the predetermined read voltage $V(1)_4$ and the first adjust read voltage $V(2)_4$ and performs a corresponding preset decoding operation to obtain a read codeword and a read codeword syndrome 451 corresponding to the predetermined read voltage $V(1)_4$ and a first adjust codeword and a first adjust codeword syndrome 452 corresponding to the first adjust read voltage $V(2)_4$. Moreover, a first bit value total number of the read codeword syndrome 451 corresponding to the predetermined read voltage $V(1)_4$ is "SN3", a first bit value total number of the first adjust codeword syndrome 452 corresponding to the first adjust read voltage $V(2)_4$ is "SN1". In this example, the confidence table management circuit 2152 identifies that "SN3" is greater than "SN1", an absolute difference between "SN3" and "SN1" is not greater than the difference threshold, and "SN3" and "SN1" both are smaller than the syndrome threshold. In this circumstance, the confidence table management circuit 2152 determines that a size relative relation between the read codeword syndrome 451 and the first adjust codeword syndrome 452 to have the horizontal mode (because the ascending or descending trend is not obvious). It should be noted that in this example, the confidence table management circuit 2152 infers that both the predetermined read voltage $V(1)_4$ corresponding to the read codeword syndrome 451 and the first adjust read voltage $V(2)_4$ corresponding to the first adjust codeword syndrome 452 are close to a junction between two threshold voltage distributions, and the confidence table management circuit 2152 infers that an optimal transition read voltage should be set to be between the predetermined read voltage $V(1)_4$ and the first adjust read voltage $V(2)_4$.

Similarly, as demonstrated by Example <EX46>, as an absolute difference between a first bit value total number of "SN3" of a read codeword syndrome 461 corresponding to the predetermined read voltage $V(1)_4$ and a first bit value total number of "SN1" of a first adjust codeword syndrome 462 corresponding to the first adjust read voltage $V(2)_4$ is not greater than the difference threshold, and the first bit value total numbers "SN1" and "SN3" both are smaller than the syndrome threshold, the read codeword syndrome 461 and the first adjust codeword syndrome 462 are identified to have the horizontal mode.

Figure 8A:
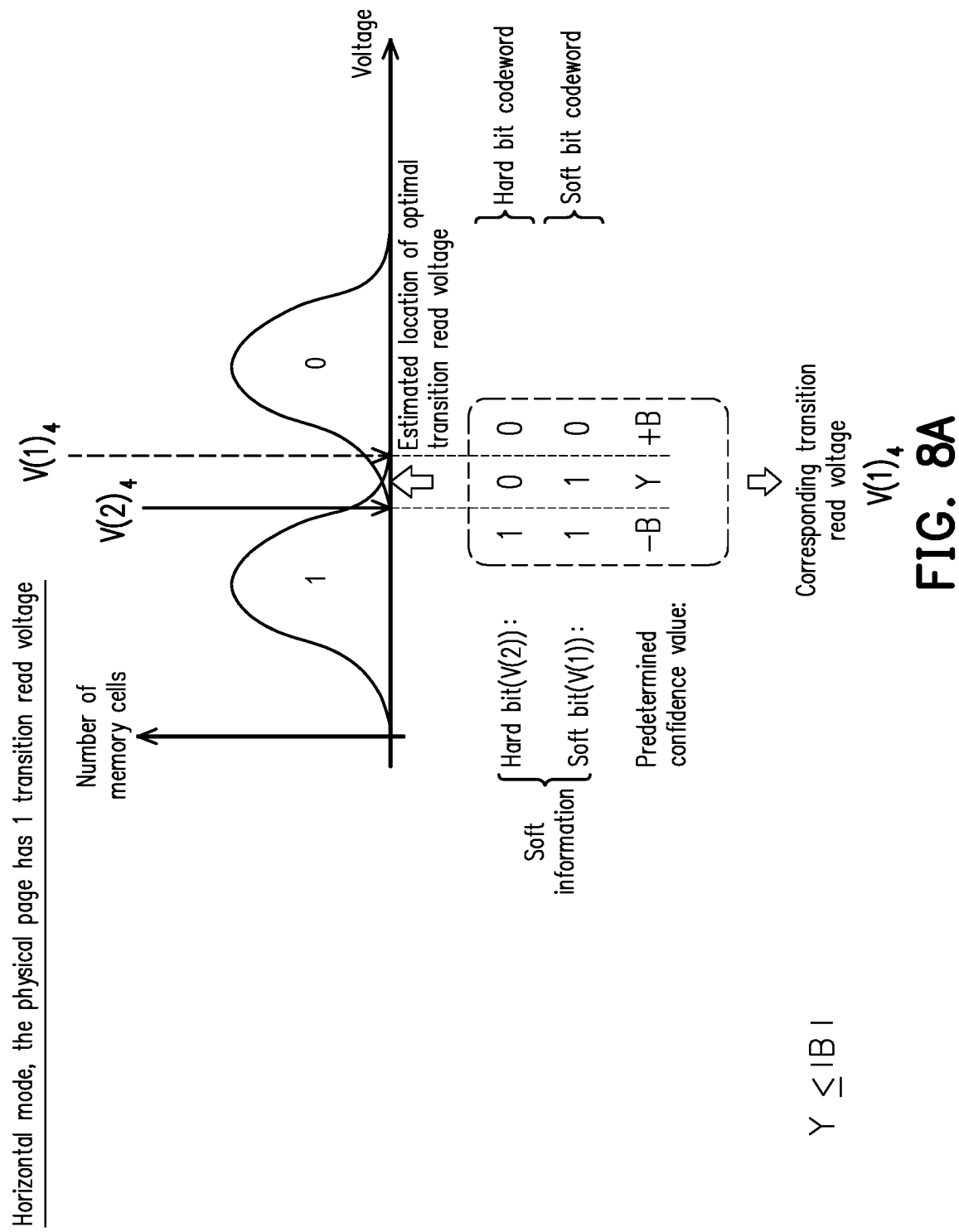
FIG. 8A is a schematic diagram illustrating the setting of a plurality of predetermined confidence values corresponding to the horizontal mode and a target physical page having 1 transition read voltage according to an embodiment of the invention.

It is to be mentioned that for the syndromes having the horizontal mode, since the corresponding read voltages are very close to the junction between the threshold voltage distributions, the confidence table management circuit 2152 may consider that the read bit values of the memory cells corresponding to the threshold voltage distribution areas between the read voltages are unreliable, and the confidence table management circuit 2152 may set the predetermined confidence values of the soft information corresponding to the threshold voltage distribution areas to specific values (with reference to the description related to FIG. 8A below).

The aforementioned examples are provided merely for illustrating a plurality of modes of the size relative relation between two syndromes corresponding to two read voltages. Moreover, regarding modes of a size relative relation among three syndromes corresponding to three read voltages, they will be described with reference to FIG. 5A to FIG. 5C.

In an embodiment, step S24 may further includes the following steps. In response to the determination that a plurality of bit values of a last one of the first adjust codeword syndromes are not all zero, the read assisting circuit unit 215 (or the soft information management circuit 2151) generates a second adjust read voltage according to the predetermined read voltage, the first adjust read voltage and the corresponding syndromes. The soft information management circuit 2151 may calculate a voltage difference value obtained by subtracting the first adjust read voltage by the predetermined read voltage. In response to a total number of bit values of "1" of the syndrome corresponding to the first adjust read voltage in the syndrome buffer area being smaller than a total number of bit values of "1" of the syndrome corresponding to the predetermined read voltage, the read assisting circuit unit generates the second adjust read voltage by adding the first adjust read voltage by the voltage difference value. In response to the total number of bit values of "1" of the syndrome corresponding to the first adjust read voltage in the syndrome buffer area being greater than the total number of bit values of "1" of the syndrome corresponding to the predetermined read voltage, the read assisting circuit unit generates the second adjust read voltage by subtracting the predetermined read voltage by the voltage difference value. In an embodiment, in response to an absolute difference between the total number of bit values of "1" of the syndrome corresponding to the first adjust read voltage in the syndrome buffer area and the total number of bit values of "1" of the syndrome corresponding to the predetermined read voltage being smaller than the difference threshold, and the total number of bit values of "1" of the syndrome corresponding to the first adjust read voltage in the syndrome buffer area and the total number of bit values of "1" of the syndrome corresponding to the predetermined read voltage both being smaller than the syndrome threshold, an average value of the predetermined read voltage and the first adjust read voltage is calculated to serve as the second adjust read voltage (because the predetermined read voltage and the first adjust read voltage may likely be quite close to the optimal transition read voltage of the target physical page), which will be described with reference to FIG. 5A.

Figure 5A:
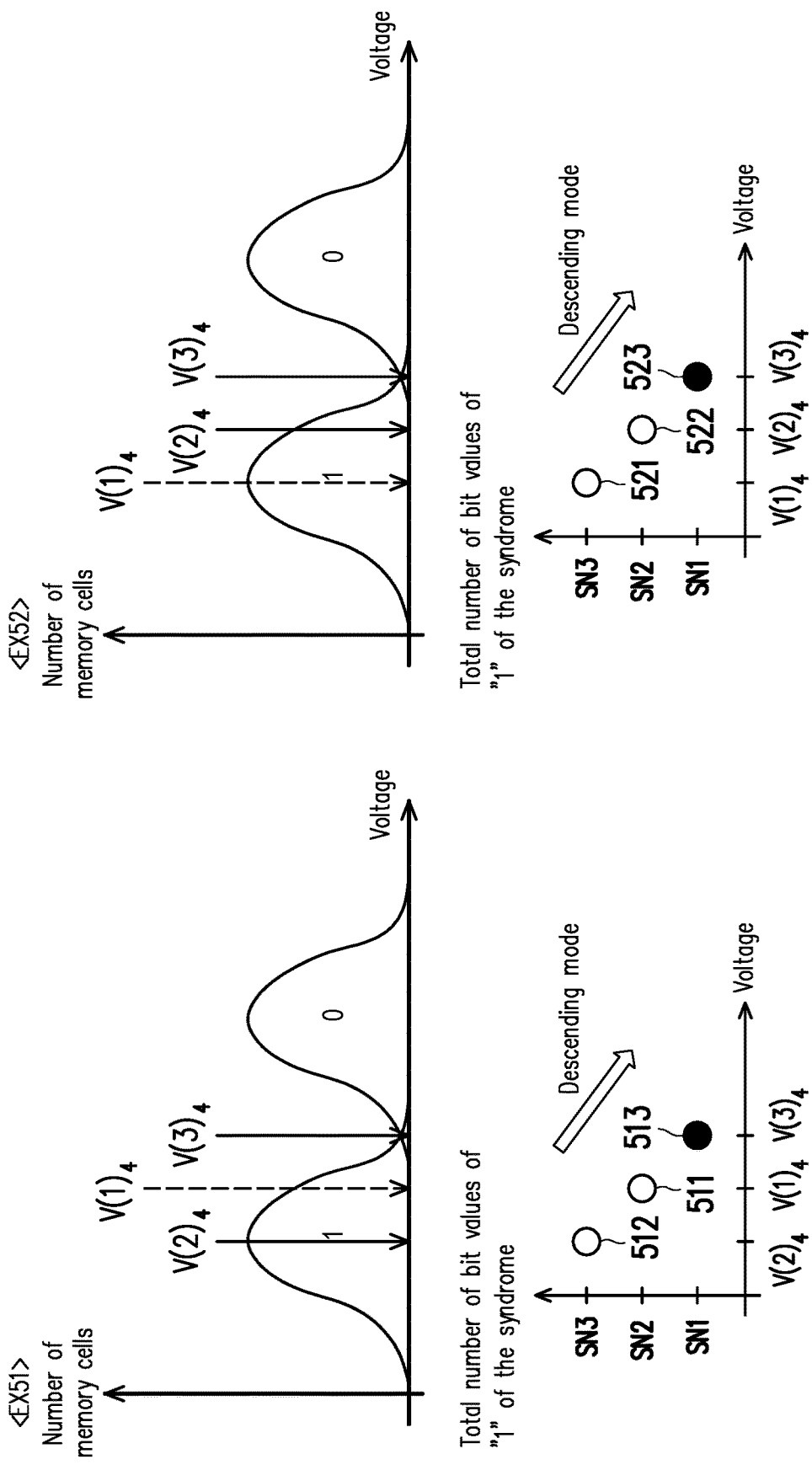
FIG. 5A is a schematic diagram illustrating a size relative relation among a plurality of syndromes having the second descending mode according to an embodiment of the invention.

FIG. 5A is a schematic diagram illustrating a size relative relation among a plurality of syndromes having the second descending mode according to an embodiment of the invention. More specifically, referring to FIG. 5A, in Example <EX51>, it is assumed that the soft information management circuit 2151 uses the predetermined read voltage $V(1)_4$ and the first adjust read voltage $V(2)_4$ to read the target physical page and obtains corresponding syndromes 511 and 512. In response to all bit values of the syndrome 512 not being zero and a first bit value total number corresponding to the syndrome 512 in the syndrome buffer area being greater than a first bit value total number corresponding to a syndrome 511, the soft information management circuit 2151 determines that a codeword (i.e., a first adjust codeword) in a poor condition (having a greater first bit value total number) will be obtained if leftward adjusting the predetermined read voltage $V(1)_4$ to be the first adjust read voltage, and the soft information management circuit 2151 rightward (opposite to leftward) adjusts the predetermined read voltage $V(1)_4$. That is to say, the soft information management circuit 2151 adds the predetermined read voltage $V(1)_4$ by a voltage difference value between the predetermined read voltage $V(1)_4$ and the first adjust read voltage $V(2)_4$, so as to generate a second adjust read voltage $V(3)_4$. In other words, the soft information management circuit 2151 determines a voltage value of the second adjust read voltage according to a voltage size relation between the predetermined read voltage and the first adjust read voltage and according to a size relation between the syndromes respectively corresponding to the predetermined read voltage and the first adjust read voltage. In brief, if an adjust read voltage obtained in a voltage adjustment direction results in a poor decoding result (the corresponding syndrome has a greater first bit value total number), the soft information management circuit 2151 infers that a preferable result (the corresponding syndrome has a smaller first bit value total number) may be obtained by the adjust read voltage generated in an opposite direction (as demonstrated by Example <EX51> in FIG. 5A, for example). If an adjust read voltage obtained in a voltage adjustment direction results in a preferable decoding result (the corresponding syndrome has a smaller first bit value total number), the soft information management circuit 2151 infers that a preferable result (the corresponding syndrome has an much smaller first bit value total number) may be obtained by the adjust read voltage generated by continuing in the same direction (as demonstrated by Example <EX52> in FIG. 5A, for example).

After obtaining the second adjust read voltage, the soft information management circuit 2151 uses the second adjust read voltage to read the target physical page to obtain a second adjust codeword corresponding to the target physical page. That is to say, the soft information management circuit 2151 further performs another read retry operation (by using the second adjust read voltage) to try to obtain a valid codeword of the target physical page. The error checking and correcting circuit 214 performs the preset decoding operation on the second adjust codeword to obtain a plurality of second adjust codeword syndromes corresponding to the second adjust codeword. The soft information management circuit 2151 stores the second adjust codeword in the codeword buffer area and stores a first one of the second adjust codeword syndromes in the syndrome buffer area. It should be noted that in this circumstance, the syndrome buffer area stores three syndromes in total, including the read codeword syndrome, the first adjust codeword syndrome and the second adjust codeword syndrome.

In response to the determination that a plurality of bit values of a last one of the second adjust codeword syndromes are not all zero (i.e., the decoding on the second adjust codeword obtained corresponding to this read retry operation is failed), the read assisting circuit unit 215 generates the soft information of each of the target memory cells according to all the codewords corresponding to the read operation in the codeword buffer area. In response to the determination that the bit values of the last one of the second adjust codeword syndromes are all zero, the error checking and correcting circuit 214 identifies the decoded first adjust codeword corresponding to the last one of the first adjust codeword syndromes as the valid codeword corresponding to the read operation (or the read retry operation), and the processor completes the read operation.

The determination/identification of the modes of the size relative relation will be further described according to a plurality of drawings below.

Referring to FIG. 5A, in Example <EX51>, the first bit value total number of "SN2" of the read codeword syndrome 511 corresponding to the predetermined read voltage $V(1)_4$ is smaller than the first bit value total number of "SN3" of the first adjust codeword syndrome 512 corresponding to the first adjust read voltage $V(2)_4$, and the first bit value total number of "SN1" of the second adjust codeword syndrome 513 corresponding to the second adjust read voltage $V(3)_4$ is smaller than the first bit value total number of "SN2" of the read codeword syndrome 511 corresponding to the predetermined read voltage $V(1)_4$. The sizes of the first adjust codeword syndrome 512, the read codeword syndrome 511 and the second adjust codeword 513 exhibit a descending trend. A size relative relation among the first adjust codeword syndrome 512, the read codeword syndrome 511 and the second adjust codeword 513 is identified as the second descending mode.

Similarly, in Example <EX52>, the sizes of a read codeword syndrome 521, a first adjust codeword syndrome 522 and a second adjust codeword 523 exhibit a descending trend. A size relative relation among the read codeword syndrome 521, the first adjust codeword syndrome 522 and the second adjust codeword 523 is identified as the second descending mode.

Figure 5B:
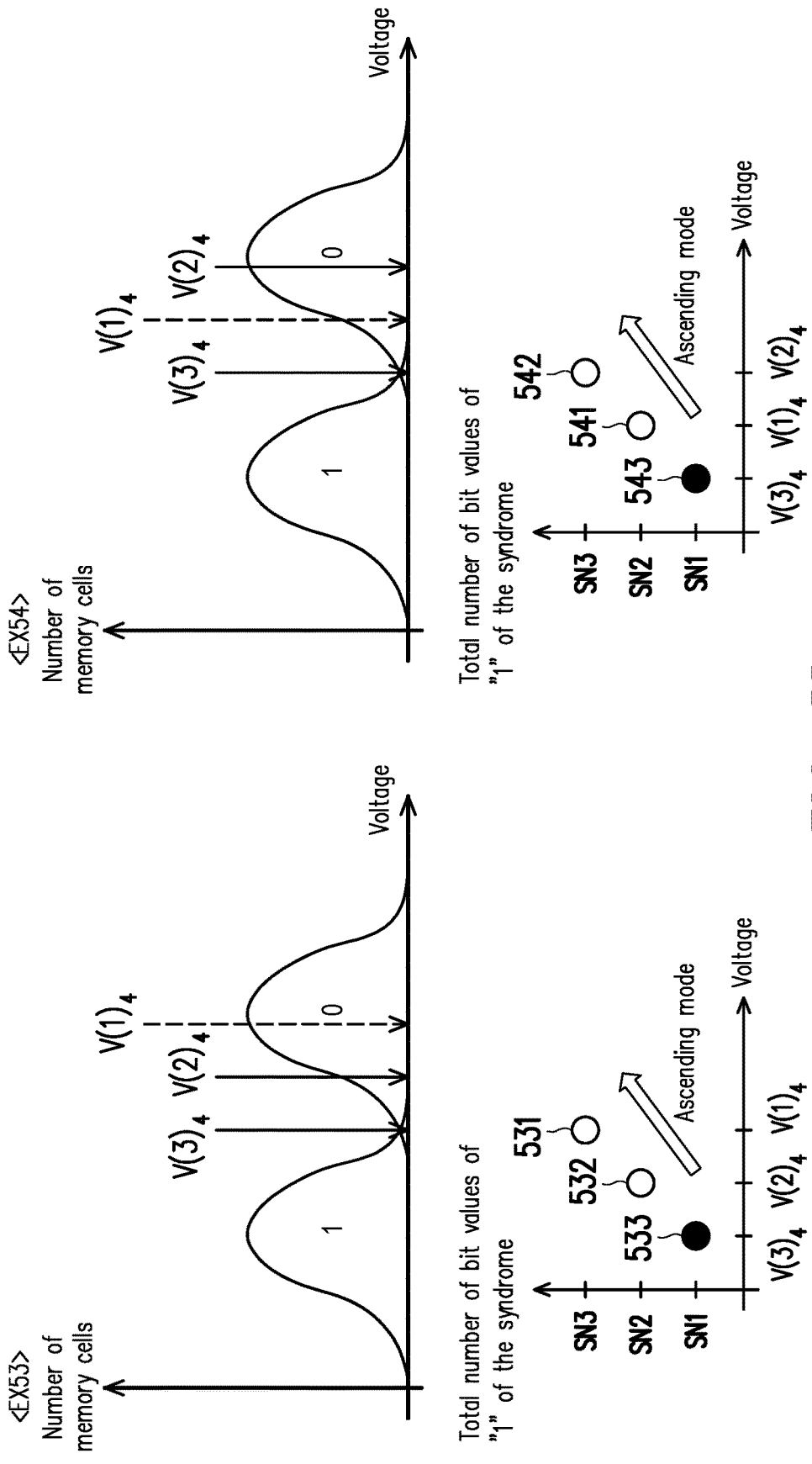
FIG. 5B is a schematic diagram illustrating a size relative relation among a plurality of syndromes having the second ascending mode according to an embodiment of the invention.

FIG. 5B is a schematic diagram illustrating a size relative relation among a plurality of syndromes having the second ascending mode according to an embodiment of the invention. Referring to FIG. 5B, in Example <EX53>, the sizes of a second adjust codeword syndrome 533, a first adjust codeword syndrome 532 and a read codeword syndrome 531 exhibit an ascending trend. The second adjust codeword syndrome 533, the first adjust codeword syndrome 532 and the read codeword syndrome 531 are identified to have the second ascending mode. Similarly, in Example <EX54>, the sizes of a second adjust codeword syndrome 543, a read codeword syndrome 541 and a first adjust codeword syndrome 542 exhibit an ascending trend. A size relative relation among the second adjust codeword syndrome 543, the read codeword syndrome 541 and the first adjust codeword syndrome 542 is identified as the second ascending mode.

Figure 5C:
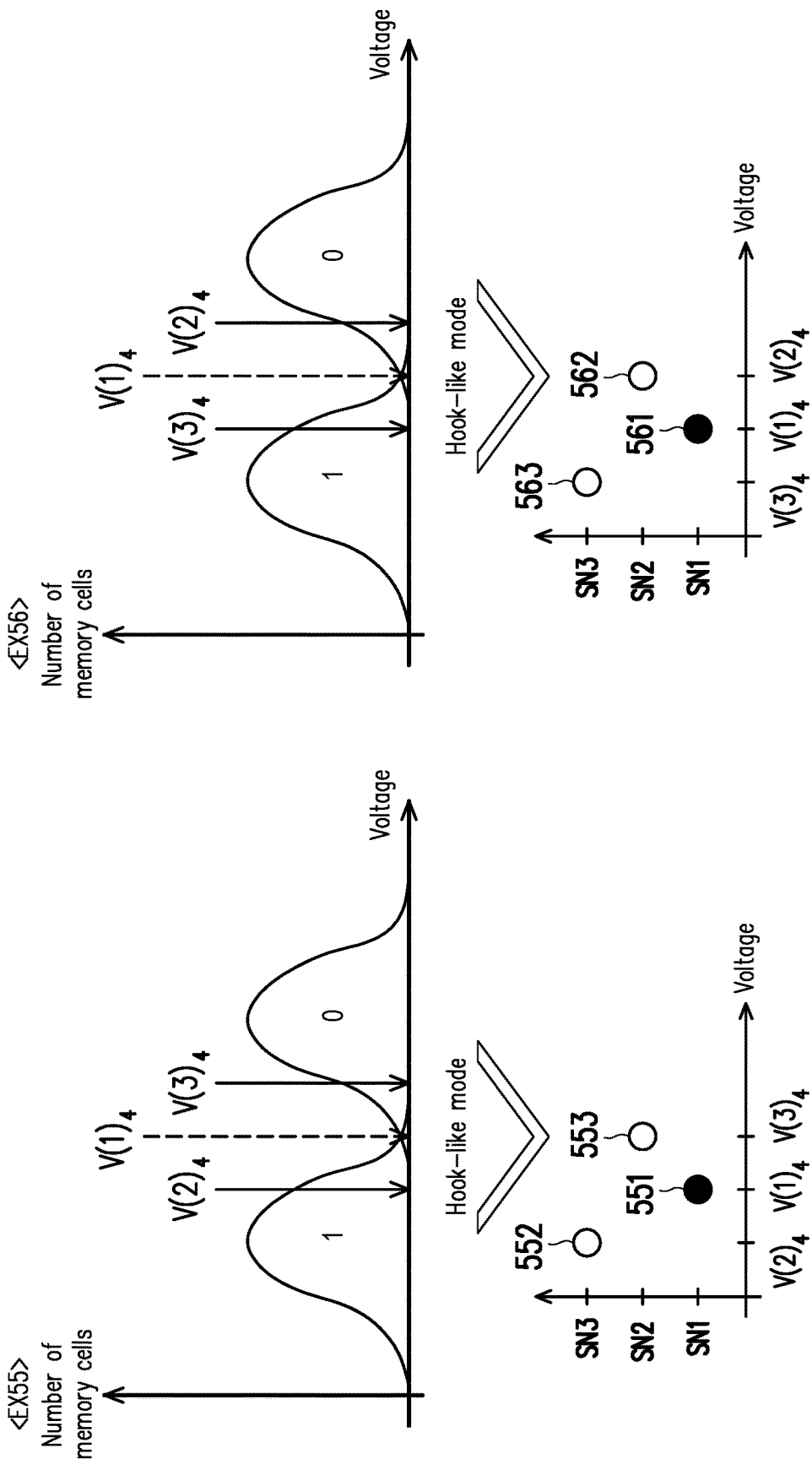
FIG. 5C is a schematic diagram illustrating a size relative relation among a plurality of syndromes having the hook-like mode according to an embodiment of the invention.

FIG. 5C is a schematic diagram illustrating a size relative relation among a plurality of syndromes having the hook-like mode according to an embodiment of the invention. Referring to FIG. 5C, in Example <EX55>, the sizes of a first adjust codeword syndrome 552, a read codeword syndrome 551 and a second adjust codeword syndrome 553 exhibit a hook-like shape. Namely, a first bit value number of the read codeword syndrome 551 in the middle is the smallest. A size relative relation among the first adjust codeword syndrome 552, the read codeword syndrome 551 and the second adjust codeword syndrome 553 is identified as the second ascending mode. Similarly, in Example <EX56>, the sizes of a second adjust codeword syndrome 563, a read codeword syndrome 561 and a first adjust codeword syndrome 562 present a hook-like shape. A size relative relation among the second adjust codeword syndrome 563, the read codeword syndrome 561 and the first adjust codeword syndrome 562 is identified as the hook-like mode. It should be noted that in the above embodiment, the syndrome which is the smallest syndrome is drawn in black, and the codeword corresponding to the smallest syndrome is set as a hard bit codeword.

In the present embodiment, a plurality of confidence tables corresponding to the target physical page correspond to various modes. Each of the confidence table has a plurality of predetermined confidence values and a plurality of corresponding soft information patterns. In the present embodiment, an absolute value of each of the predetermined confidence values of a confidence table is set according to a mode corresponding to the confidence table (i.e., a target mode of a size relative relation among a plurality of syndromes obtained by reading the target physical page). The soft information patterns of each of the confidence tables are obtained by reading the target physical page sequentially using one or more transition read voltages corresponding to the target mode and the target physical page and one or more adjust read voltages corresponding to the one or more transition read voltages. Among the soft information patterns, the absolute values of one or more predetermined confidence values corresponding to one or more of the soft information patterns that are closer to the one or more transition read voltages are set to smaller values, wherein among the soft information patterns, the absolute value of the predetermined confidence value corresponding to the soft information pattern between one of the one or more transition read voltages and the corresponding adjust read voltage is set to the minimum value. The positiveness or the negativeness of the predetermined confidence values is set according to a hard bit values in the corresponding soft information pattern, wherein in response to the hard bit value in the soft information pattern corresponding to one of the predetermined confidence values being "1", the first predetermined confidence value is set to be a negative value. In addition, in response to the hard bit value in the soft information pattern corresponding to the predetermined confidence value being "0", the first predetermined confidence value is set to be a positive value.

Referring to FIG. 6A, for example, it is currently assumed that in order to set a plurality of predetermined confidence values of a confidence table of a lower physical page having the first descending mode, the read assisting circuit unit 215 uses the transition read voltage $V(1)_4$ (e.g., the predetermined read voltage) and the adjust read voltage $V(2)_4$ corresponding to the lower physical page to read the lower physical page to obtain a soft information pattern as illustrated in FIG. 6A. It should be noted that in the first descending mode, a codeword corresponding to the transition read voltage $V(1)_4$ is a hard bit codeword, and a codeword corresponding to the adjust read voltage $V(2)_4$ is a soft bit codeword. Moreover, as described above, a predetermined confidence value corresponding to the soft information pattern of "1 0" between the transition read voltage $V(1)_4$ and the adjust read voltage $V(2)_4$ is set to have a minimum absolute value (e.g., |A|) and is a negative value (because the corresponding hard bit value is "1"). |A| represents the predetermined confidence value of the transition read voltage which is closest to the junction between the threshold voltage distributions, and |A| is "|3|", for example. A predetermined confidence value corresponding to the soft information pattern of "1 1" which is far away from the transition read voltage $V(1)_4$ is set to have an absolute value greater than |A| (e.g., |B|) and is set to be a negative value (because the corresponding hard bit value is "1"). B is "5", for example. However, the memory cells belonging to a soft information pattern of "0 0" may likely be close to the transition read voltage $V(1)_4$ or far away from the transition read voltage $V(1)_4$. Thus, the absolute value of a predetermined confidence value corresponding to the soft information pattern of "0 0" is set to be a specific value (e.g., |X|), and a setting range of the specific value is determined according to the predetermined confidence value corresponding to the soft information pattern of "1 0" and the predetermined confidence value corresponding to the soft information pattern of "1 1". For example, |X| may be maximally set to be |B| and may be minimally set to be |A|. In addition, the predetermined confidence value corresponding to the soft information pattern of "0 0" may be set to be a positive value (because the corresponding hard bit value is "0"). It should be noted that the plurality of soft information patterns of "1 1", "1 0" and "0 0" may be considered as corresponding to the transition read voltage $V(1)_4$.

Figure 6B:
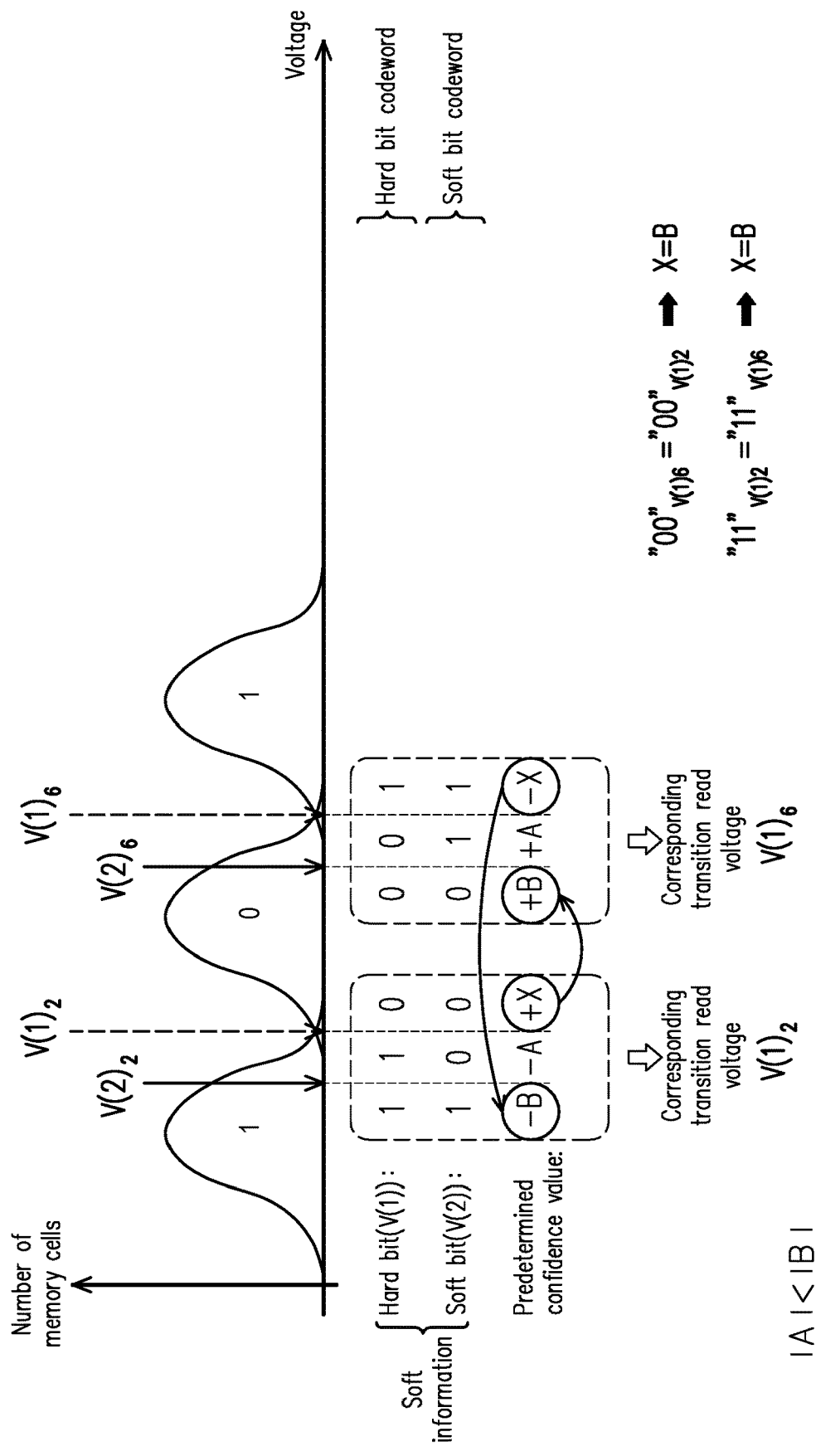
FIG. 6B is a schematic diagram illustrating the setting of a plurality of predetermined confidence values corresponding to the first descending mode and a target physical page having 2 transition read voltages according to an embodiment of the invention.

FIG. 6B is a schematic diagram illustrating the setting of a plurality of predetermined confidence values corresponding to the first descending mode and the target physical page having 2 transition read voltages according to an embodiment of the invention. Referring to FIG. 6B, for example, it is currently assumed that a plurality of predetermined confidence values of a confidence table of a physical page (e.g., a middle physical page) having 2 transition read voltages in the first descending mode are to be set. The read assisting circuit unit 215 uses a transition read voltage $V(1)_2$ and an adjust read voltage $V(2)_2$ corresponding to the middle physical page to read the middle physical page to obtain a plurality of soft information patterns corresponding to the transition read voltage $V(1)_2$ as illustrated in FIG. 6B and uses a transition read voltage $V(1)_6$ and an adjust read voltage $V(2)_6$ corresponding to the middle physical page to read the middle physical page to obtain a plurality of soft information patterns corresponding to the transition read voltage $V(1)_6$ as illustrated in FIG. 6B. It should be noted that in the first descending mode, a codeword corresponding to the transition read voltage $V(1)_2$ is a hard bit codeword, and a codeword corresponding to the adjust read voltage $V(2)_4$ is a soft bit codeword, while a codeword corresponding to the transition read voltage $V(1)_6$ is a hard bit codeword, and a codeword corresponding to the adjust read voltage $V(2)_6$ is a soft bit codeword. Moreover, for the three soft information patterns at the left side, the predetermined confidence value corresponding to the soft information pattern of "1 0" between the transition read voltage $V(1)_2$ and the adjust read voltage $V(2)_2$ is set to have a minimum absolute value (e.g., |A|) and is set to be a negative value. The predetermined confidence value corresponding to the soft information pattern of "1 1" which is far away from the transition read voltage $V(1)_2$ is set to have an absolute value greater than |A| (e.g., |B|) and is set to be a negative value. The predetermined confidence value corresponding to the soft information pattern of "0 0" may be set to have a specific absolute value (e.g., |X|) and is set to be a positive value. Similarly, for the three soft information patterns at the right side, the predetermined confidence value corresponding to the soft information pattern of "0 1" between a transition read voltage $V(1)_6$ and an adjust read voltage $V(2)_6$ is set to have a minimum absolute value (e.g., |A|) and is set to be a positive value. The predetermined confidence value corresponding to the soft information pattern of "0 0" which is far away from the transition read voltage $V(1)_6$ is set to have an absolute value greater than |A| (e.g., |B|) and is set to be a positive value. The predetermined confidence value corresponding to the soft information pattern of "1 1" may be set to have a specific absolute value (e.g., |X|) and is set to be a negative value.

It should be noted that the two sets of the soft information patterns at the left and the right sides respectively have the same soft information patterns (but have different predetermined confidence values from each other). Accordingly, the confidence table management circuit 2152 uses a smaller predetermined confidence value as a basis for the adjustment, such that the same soft information pattern may correspond to the same predetermined confidence value.

For example, the soft information pattern of "0 0" in a soft information pattern set corresponding to the transition read voltage $V(1)_2$ has a predetermined confidence value of "+X", and the soft information pattern of "0 0" in a soft information pattern set corresponding to the transition read voltage $V(1)_6$ has a predetermined confidence value of "+B". In this situation, the confidence table management circuit 2152 identifies "+B" as the smaller predetermined confidence value and adjusts the predetermined confidence value of the soft information pattern of "0 0" in the soft information pattern set corresponding to the transition read voltage $V(1)_2$ from previous "+X" to "+B". Similarly, the confidence table management circuit 2152 adjusts the predetermined confidence value of the soft information pattern of "1 1" in the soft information pattern set corresponding to the transition read voltage $V(1)_6$ from previous "−X" to "−B".

Figure 6C:
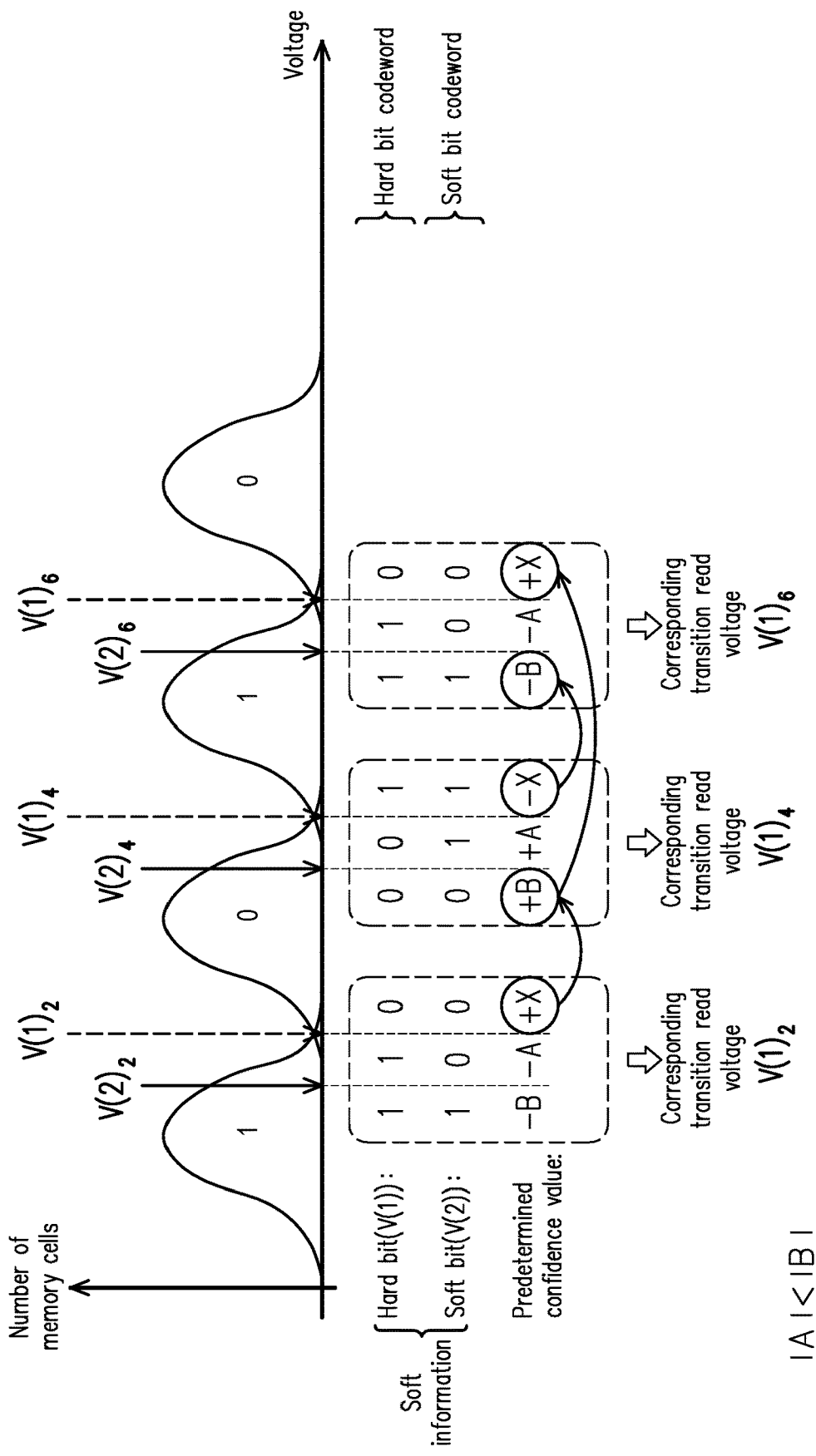
FIG. 6C is a schematic diagram illustrating the setting of a plurality of predetermined confidence values corresponding to the first descending mode and a target physical page having 3 transition read voltages according to an embodiment of the invention.

FIG. 6C is a schematic diagram illustrating the setting of a plurality of predetermined confidence values corresponding to the first descending mode and a target physical page having 3 transition read voltages according to an embodiment of the invention. Referring to FIG. 6C, for a physical page having 3 transition read voltages (e.g., a middle physical page corresponding to the second read voltage mode), the confidence table management circuit 2152 adjusts a plurality of predetermined confidence values corresponding to the same soft information pattern to be consistent. Referring to FIG. 6C, the confidence table management circuit 2152 adjusts the predetermined confidence value of the soft information pattern of "0 0" in the soft information pattern set corresponding to the transition read voltage $V(1)_2$ from previous "+X" to "+B", adjusts the predetermined confidence value of the soft information pattern of "1 1" in a soft information pattern set corresponding to the transition read voltage $V(1)_4$ from previous "−X" to "−B", and adjusts the predetermined confidence value of the soft information pattern of "0 0" in the soft information pattern set corresponding to the transition read voltage $V(1)_6$ from previous "+X" to "+B".

Figure 6D:
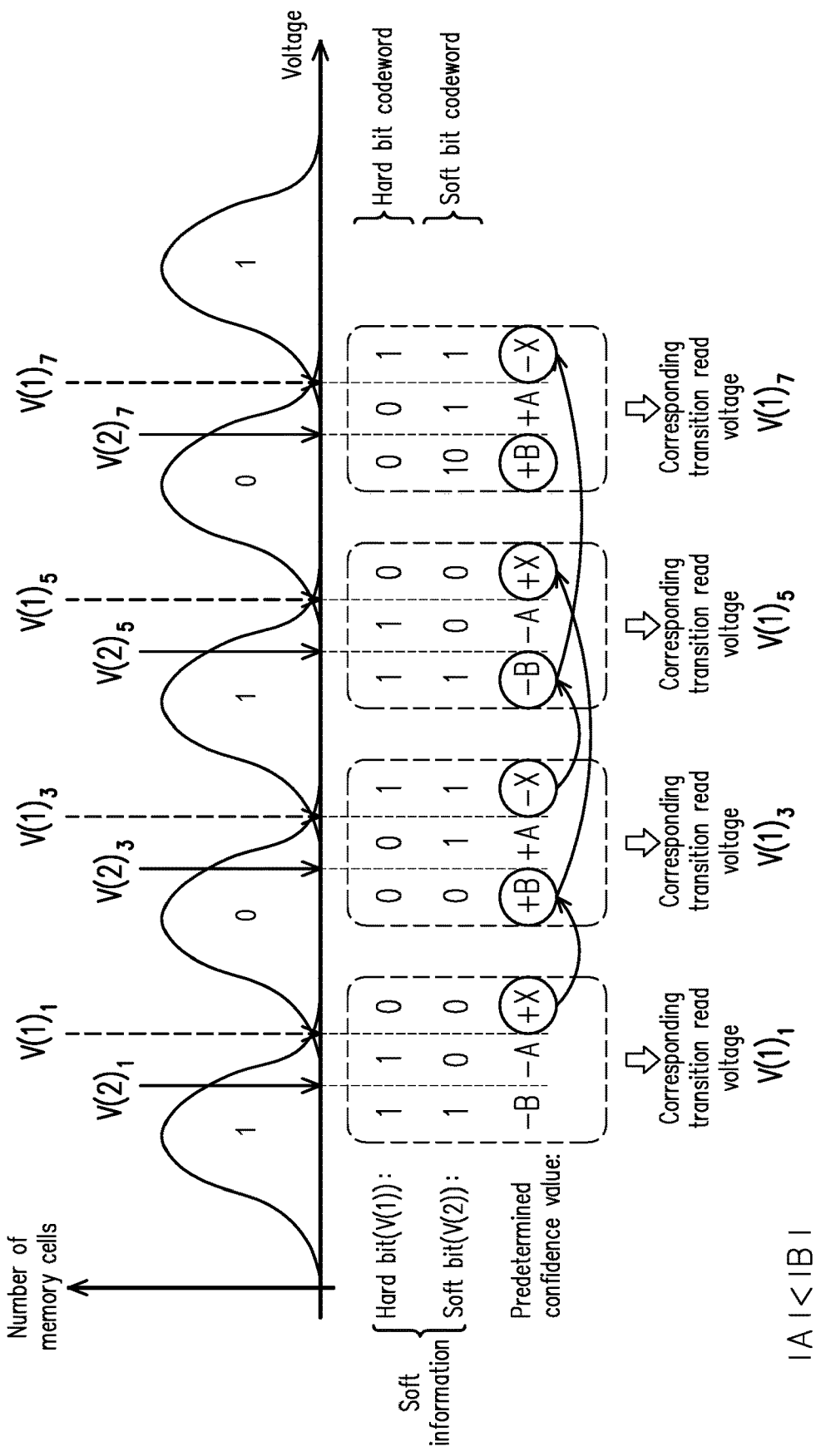
FIG. 6D is a schematic diagram illustrating the setting of a plurality of predetermined confidence values corresponding to the first descending mode and a target physical page having 4 transition read voltages according to an embodiment of the invention.

FIG. 6D is a schematic diagram illustrating the setting of a plurality of predetermined confidence values corresponding to the first descending mode and a target physical page having 4 transition read voltages according to an embodiment of the invention. Referring to FIG. 6D, for a physical page having 4 transition read voltages (e.g., an upper physical page corresponding to the first read voltage mode), the confidence table management circuit 2152 adjusts a plurality of predetermined confidence values corresponding to the same soft information pattern to be consistent. Referring to FIG. 6D, the confidence table management circuit 2152 adjusts a predetermined confidence value of the soft information pattern of "0 0" in a soft information pattern set corresponding to a transition read voltage $V(1)_1$ from previous "+X" to "+B", adjusts a predetermined confidence value of the soft information pattern of "1 1" in a soft information pattern set corresponding to a transition read voltage $V(1)_3$ from previous "−X" to "−B", adjusts a predetermined confidence value of the soft information pattern of "0 0" in a soft information pattern set corresponding to a transition read voltage $V(1)_5$ from previous "+X" to "+B", and adjusts a predetermined confidence value of the soft information pattern of "1 1" in a soft information pattern set corresponding to a transition read voltage $V(1)_7$ from previous "−X" to "−B".

Through the setting method of the aforementioned embodiment, the confidence table management circuit 2152 may set confidence tables corresponding to the first descending mode respectively for a plurality of physical pages having different transition read voltages.

FIG. 6E is a schematic diagram illustrating a plurality of predetermined confidence tables corresponding to the first descending mode of various target physical pages according to an embodiment of the invention. Referring to FIG. 6E, for example, as illustrated in Table 600, the confidence table management circuit 2152 may make a plurality of confidence tables corresponding to different physical pages, and each of the confidence table has a plurality of predetermined confidence values and a plurality of soft information patterns of corresponding memory cells. Afterwards, the confidence table management circuit 2152 may find a confidence value of each memory cell matching a specific soft information pattern by using a plurality of confidence tables. As described in step S26 of FIG. 2, the confidence value of each of target memory cells may be found from the target confidence table according to a plurality of soft information of the target memory cells.

Specifically, for first soft information of the first target memory cell among the target memory cells, the read assisting circuit unit 215 (or the confidence table management circuit 2152) may find a first soft information pattern matching the first soft information from a plurality of soft information patterns from the target confidence table and a first predetermined confidence value corresponding to the first soft information according to the first soft information. The confidence table management circuit 2152 identifies the first predetermined confidence value as a first confidence value of the first target memory cell corresponding to the target physical page.

For example, it is assumed that the physical page has 2 transition read voltages, and the first soft information of the first target memory cell is "1 0". The confidence table management circuit 2152 identifies a predetermined confidence value corresponding to a soft information pattern matching "1 0" as "−A" and identifies "−A" as a confidence value of the first target memory cell.

Moreover, in response to the first soft information not matching any one of the soft information patterns of the target confidence table, the read assisting circuit unit sets the first predetermined confidence value corresponding to the first soft information to a preset value.

For example, it is assumed that the physical page has 1 transition read voltage, and the first soft information of the first target memory cell is "0 1". The confidence table management circuit 2152 identifies a predetermined confidence value corresponding to a soft information pattern matching "0 1" as "Null" (because the confidence table management circuit 2152 does not set the redetermined confidence values corresponding to the soft information pattern of "0 1" in the confidence table, and for example, as illustrated in FIG. 6A, the soft information pattern of "0 1" does not exist), and the confidence table management circuit 2152 sets the confidence value of the first target memory cell to a preset value. In an embodiment, the preset value may be "0". In an embodiment, during the process of setting a plurality of predetermined confidence values of the confidence table, after the soft information patterns currently corresponding to all the read voltages and the predetermined confidence values corresponding to the soft information patterns, the confidence table management circuit 2152 may directly set the predetermined confidence value of each of the one or more soft information patterns that are not set (e.g., the first soft information patterns of "0 1" in the aforementioned examples) as the preset value in the corresponding confidence table.

Figure 7A:
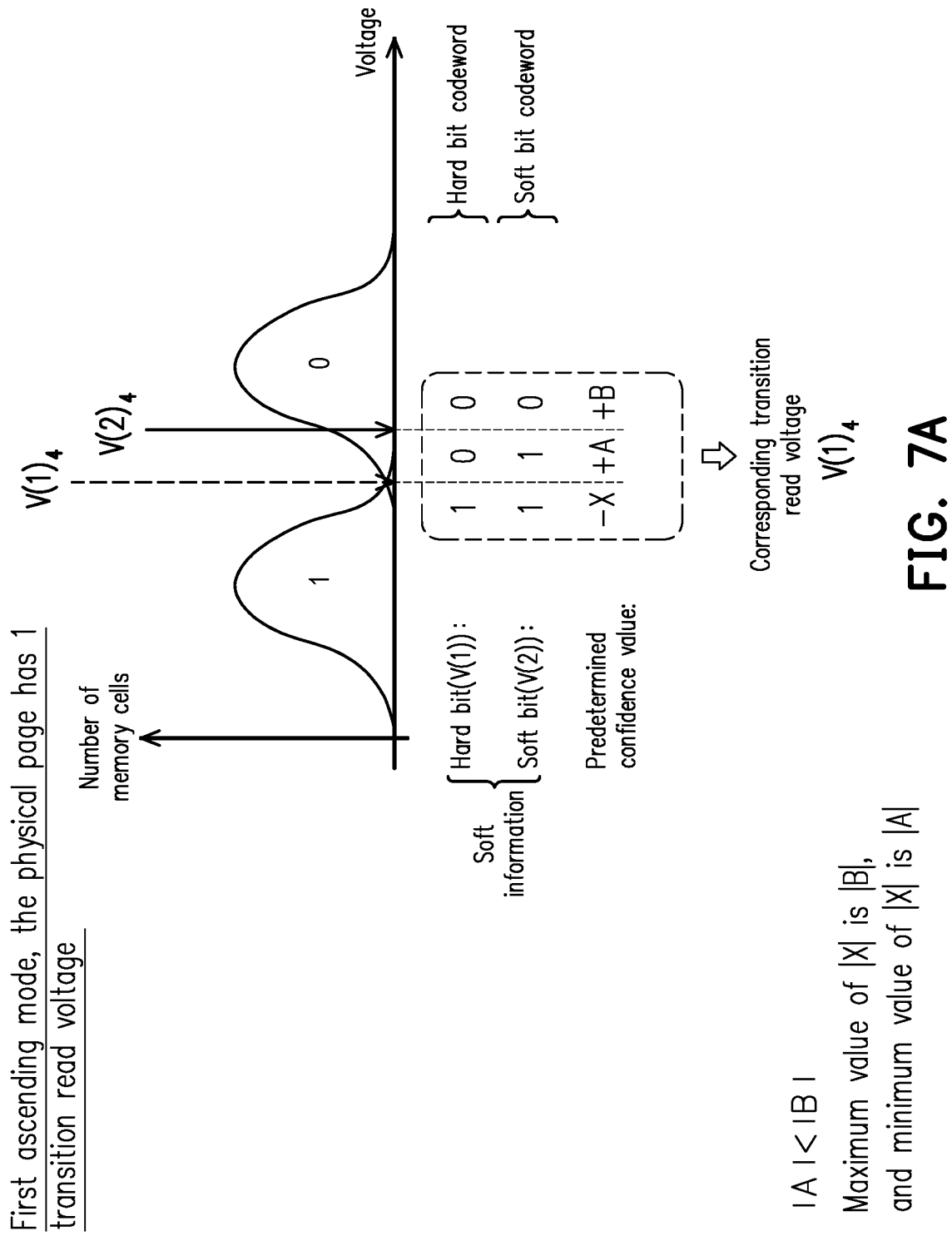
FIG. 7A is a schematic diagram illustrating the setting of a plurality of predetermined confidence values corresponding to the first ascending mode and a target physical page having 1 transition read voltage according to an embodiment of the invention.

FIG. 7A is a schematic diagram illustrating the setting of a plurality of predetermined confidence values corresponding to the first ascending mode and a target physical page having 1 transition read voltages according to an embodiment of the invention. Referring to FIG. 7A, for example, it is currently assumed that a plurality of predetermined confidence values of a confidence table of a lower physical page (e.g., a physical page having 1 transition read voltage) in the first ascending mode are to be set, the read assisting circuit unit 215 uses the transition read voltage $V(1)_4$ and an adjust read voltage $V(2)_4$ corresponding to the lower physical page to read the lower physical page to obtain a soft information pattern as illustrated in FIG. 7A. It should be noted that in the first ascending mode, a codeword corresponding to the transition read voltage $V(1)_4$ is a hard bit codeword, and a codeword corresponding to the adjust read voltage $V(2)_4$ is a soft bit codeword. Moreover, as described above, the predetermined confidence value corresponding to the soft information pattern of "1 1" between the transition read voltage $V(1)_4$ and the adjust read voltage $V(2)_4$ is set to have a minimum absolute value (e.g., |A|) and is set to be a positive value (because the corresponding hard bit value is "0"). The predetermined confidence value corresponding to the soft information pattern of "0 0" which is far away from the transition read voltage $V(1)_4$ is set to have an absolute value greater than |A| (e.g., |B|) and is set to be a positive value (because the corresponding hard bit value is "1"). However, the memory cells belonging to the soft information pattern of "1 1" may likely be close to the transition read voltage $V(1)_4$ or far away from the transition read voltage $V(1)_4$. Thus, the predetermined confidence value corresponding to the soft information pattern of "0 0" may be set to have a specific absolute value (e.g., |X|), and a setting range of the specific value is determined according to the predetermined confidence value corresponding to the soft information pattern of "0 1" and the predetermined confidence value corresponding to the soft information pattern of "0 0". For example, |X| may be maximally set to be |B| and may be minimally set to be |A|. Moreover, the predetermined confidence value corresponding to the soft information pattern of "1 1" may be set to be a negative value (because the corresponding hard bit value is "1"). It should be noted that the plurality of soft information patterns of "1 1", "0 1" and "0 0" may be considered as corresponding to the transition read voltage $V(1)_4$.

Figure 7B:
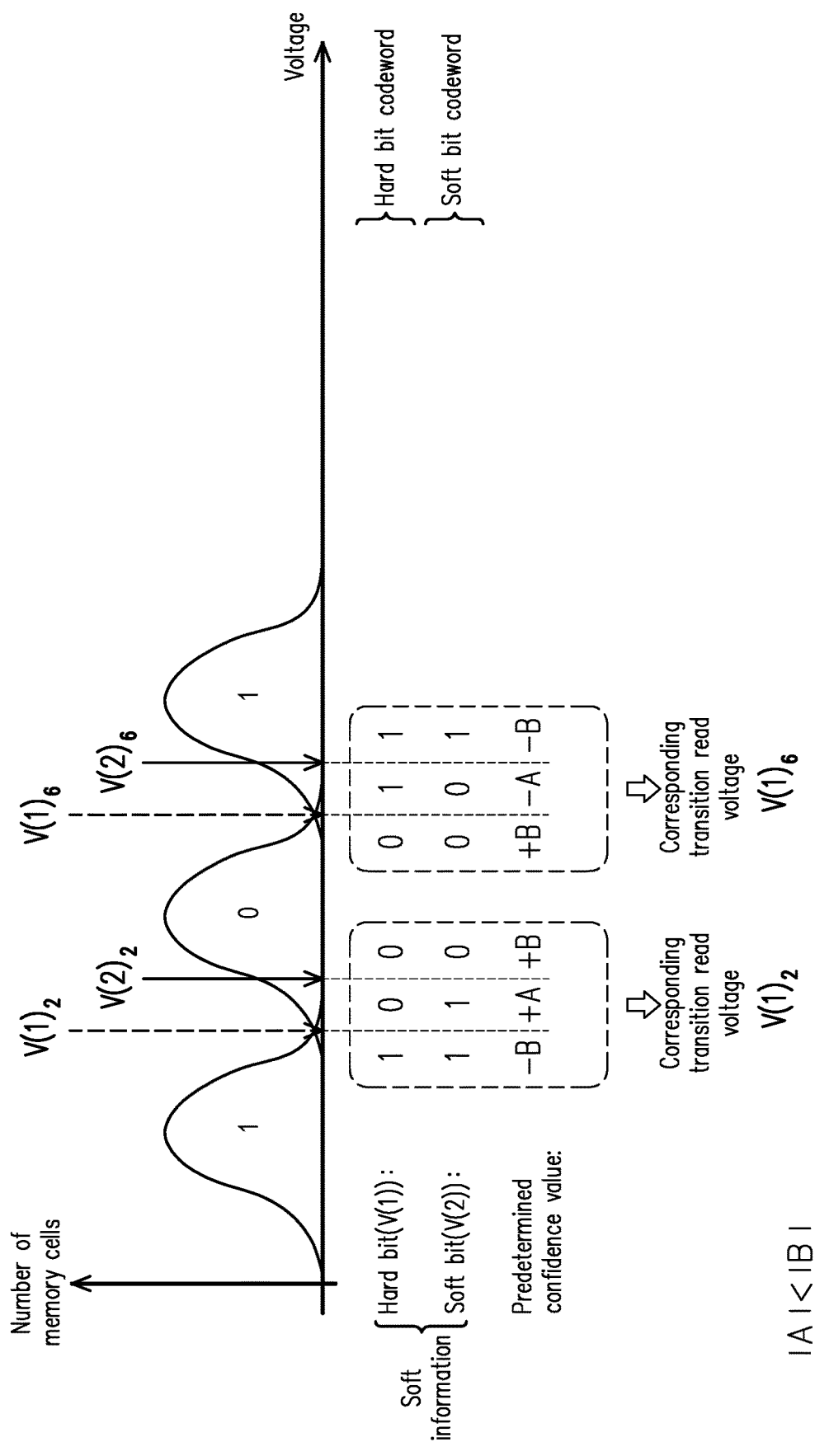
FIG. 7B is a schematic diagram illustrating the setting of a plurality of predetermined confidence values corresponding to the first ascending mode and a target physical page having 2 transition read voltages according to an embodiment of the invention.

FIG. 7B is a schematic diagram illustrating the setting of a plurality of predetermined confidence values corresponding to the first ascending mode and a target physical page having 2 transition read voltages according to an embodiment of the invention. Referring to FIG. 7B, similar to the description set forth above, the soft information management circuit 2151 sets a plurality of soft information patterns corresponding to the transition read voltage $V(1)_2$ and a plurality of soft information patterns corresponding to the transition read voltage $V(1)_6$. Moreover, in order for the predetermined confidence value corresponding to the same soft information pattern to be the same, a plurality of predetermined confidence values are finally set as illustrated in FIG. 7B. The process of setting the confidence table corresponding to the first ascending mode for a physical page having 2 or more transition read voltages is similar to that illustrated in FIG. 6B through FIG. 6D and will not be repeated hereinafter.

FIG. 7C is a schematic diagram illustrating a plurality of predetermined confidence tables corresponding to the first descending mode of various target physical pages according to an embodiment of the invention. Referring to FIG. 7C, as illustrated in Table 700, the confidence table management circuit 2152 may make a plurality of confidence tables corresponding to different physical pages in the first ascending mode, and each of the confidence table has a plurality of predetermined confidence values and a plurality of soft information patterns of corresponding memory cells.

FIG. 8A is a schematic diagram illustrating the setting of a plurality of predetermined confidence values corresponding to the horizontal mode and a target physical page having 1 transition read voltages according to an embodiment of the invention. Referring to FIG. 8A, for example, it is currently assumed that a plurality of predetermined confidence values of a confidence table of a lower physical page (e.g., a physical page having 1 transition read voltage) in the horizontal mode are to be set, the read assisting circuit unit 215 uses the transition read voltage $V(1)_4$ and an adjust read voltage $V(2)_4$ corresponding to the lower physical page to read the lower physical page to obtain a soft information pattern as illustrated in FIG. 8A. A codeword corresponding to the adjust read voltage $V(2)_4$ having a smaller first bit value total number is identified as a hard bit codeword, and a codeword corresponding to the transition read voltage $V(1)_4$ is set to be a soft bit codeword. Moreover, in the horizontal mode, the confidence table management circuit 2152 considers that a voltage value of an optimal transition read voltage should be set to be between the transition read voltage $V(1)_4$ and the adjust read voltage $V(2)_4$. Accordingly, the predetermined confidence value corresponding to the soft information pattern of "1 1" between the transition read voltage $V(1)_4$ and the adjust read voltage $V(2)_4$ is a relatively indefinite value. For example, the predetermined confidence value is set to be a smaller specific value (e.g., |Y|, where |Y|<|X|). Y is "2", for example. The predetermined confidence value corresponding to the soft information pattern of "0 1" may be set to be a positive value or a negative value. In another embodiment, the predetermined confidence value corresponding to the soft information pattern of "0 1" may be set to be a positive value (corresponding to a soft bit codeword with a predetermined confidence value which is a negative value) or a negative value.

However, both the soft information pattern of "1 0" corresponding to the transition read voltage $V(1)_4$ at the right side and the soft information pattern of "1 1" corresponding to the transition read voltage $V(2)_4$ at the left side may be determined as the soft information patterns far away from the optimal transition read voltage. Accordingly, the predetermined confidence value corresponding to the soft information pattern of "0 0" may be set to have an absolute value greater than |A| (e.g., |B|), and is set to be a positive value (because the corresponding hard bit value is "0"). The predetermined confidence value corresponding to the soft information pattern of "1 1" may be set to have an absolute value greater than |A| (e.g., |B|), and is set to be a negative value (because the corresponding hard bit value is "1").

Figure 8B:
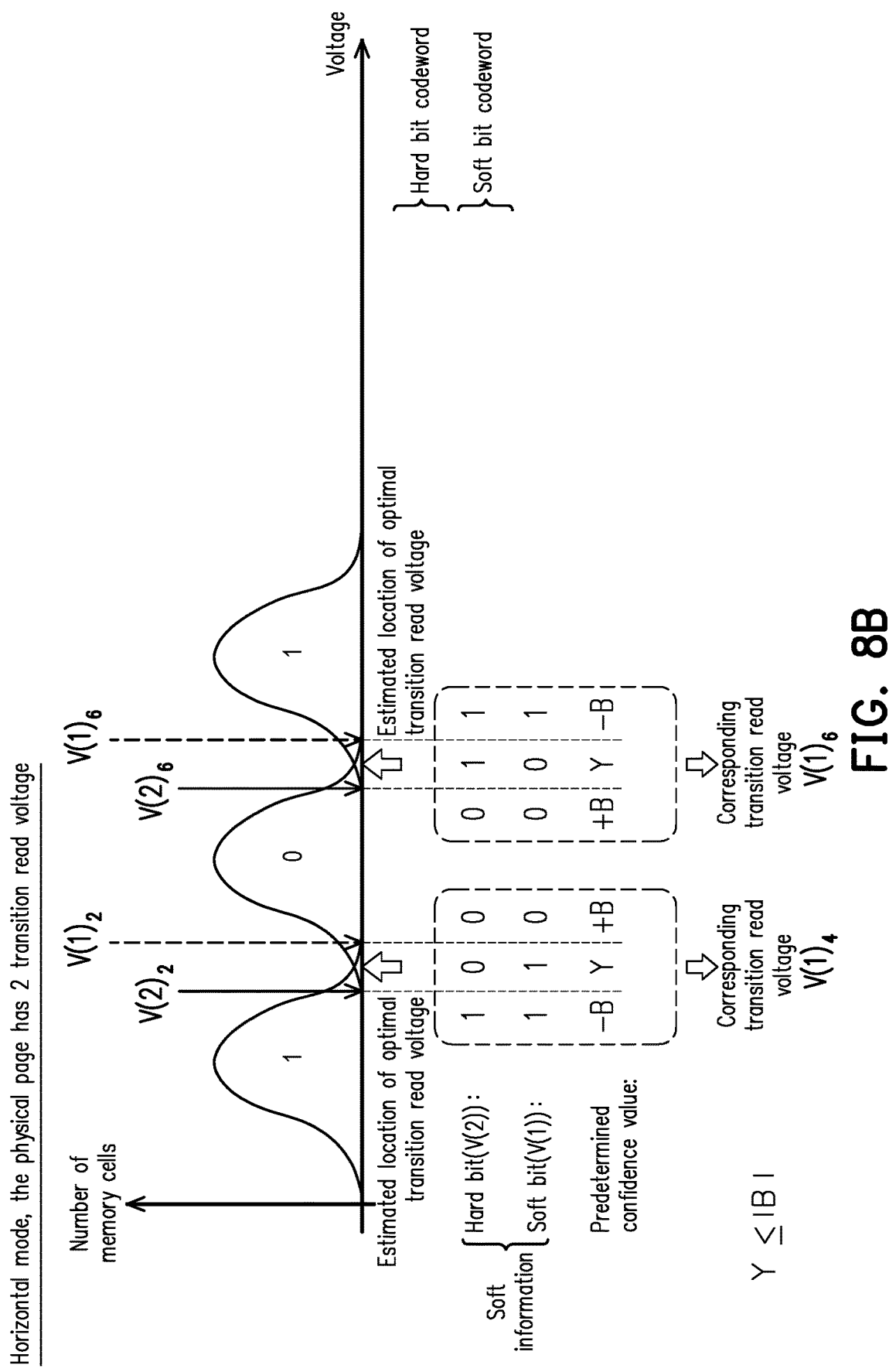
FIG. 8B is a schematic diagram illustrating the setting of a plurality of predetermined confidence values corresponding to the horizontal mode and a target physical page having 2 transition read voltages according to an embodiment of the invention.

FIG. 8B is a schematic diagram illustrating the setting of a plurality of predetermined confidence values corresponding to the horizontal mode and a target physical page having 2 transition read voltages according to an embodiment of the invention. Referring to FIG. 8B, similar to the description set forth above, the soft information management circuit 2151 sets a plurality of soft information patterns corresponding to the transition read voltage $V(1)_2$ and a plurality of soft information patterns corresponding to the transition read voltage $V(1)_6$. Then, the confidence table management circuit 2152 sets the plurality of predetermined confidence values corresponding to the soft information patterns in the manner as described above (referring to FIG. 8B), so as to generate a plurality of corresponding confidence tables (for example, as illustrated in FIG. 8C). It is to be mentioned that in an embodiment, Y may be set to 0. In another embodiment, Y may be set to be an arbitrary value between "−X" and "X".

Figure 9A:
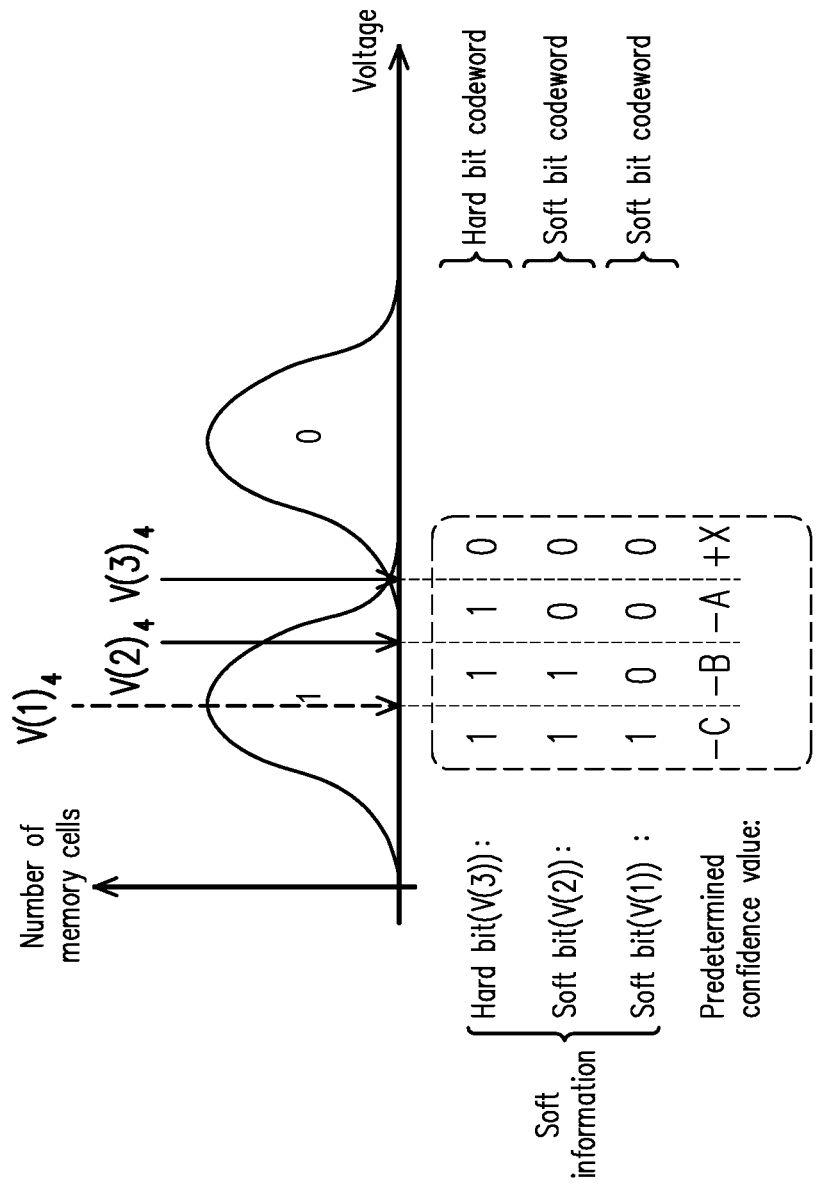
FIG. 9A is a schematic diagram illustrating the setting of a plurality of predetermined confidence values corresponding to the second descending mode and a target physical page having 1 transition read voltage according to an embodiment of the invention.

FIG. 9A is a schematic diagram illustrating the setting of a plurality of predetermined confidence values corresponding to the second descending mode and a target physical page having 1 transition read voltage according to an embodiment of the invention. Referring to FIG. 9A, similar to manner with respect to the first descending mode as illustrated in FIG. 6A, the soft information management circuit 2151 obtains a soft information pattern as illustrated in FIG. 9A. A codeword corresponding to a transition read voltage $V(3)_4$ is a hard bit codeword, and codewords corresponding to the adjust read voltages $V(1)_4$ and $V(2)_4$ are soft bit codewords. It should be noted that during a process of combining the soft information patterns, a soft bit codeword which is closer to the codeword corresponding to the read voltages $V(3)_4$ and $V(2)_4$ is sorted in the front among the soft information patterns, and finally, soft information patterns of "111", 110", "100" and "000" are generated. Thereafter, the corresponding predetermined confidence values are set to "−C", "−B", "−A" and "+X", wherein |C|>|B| (because the soft information pattern of "111" is identified as being further away from the transition read voltage $V(3)_4$ than the soft information pattern of "110", and an absolute value of the corresponding predetermined confidence value is greater). Since a range of a threshold voltage distribution of memory cells corresponding to the soft information pattern of "000" is indefinite (which may be close to or far away from the transition read voltage $V(3)_4$), a predetermined confidence value corresponding to the soft information pattern of "000" may be set to have an absolute value of IN and is a positive value. A maximum value of |X| is |C|, a minimum value thereof is |A|, and a manufacturer may set a specific value of |X| within a range from |A| to |C| according to a demand.

Figure 9B:
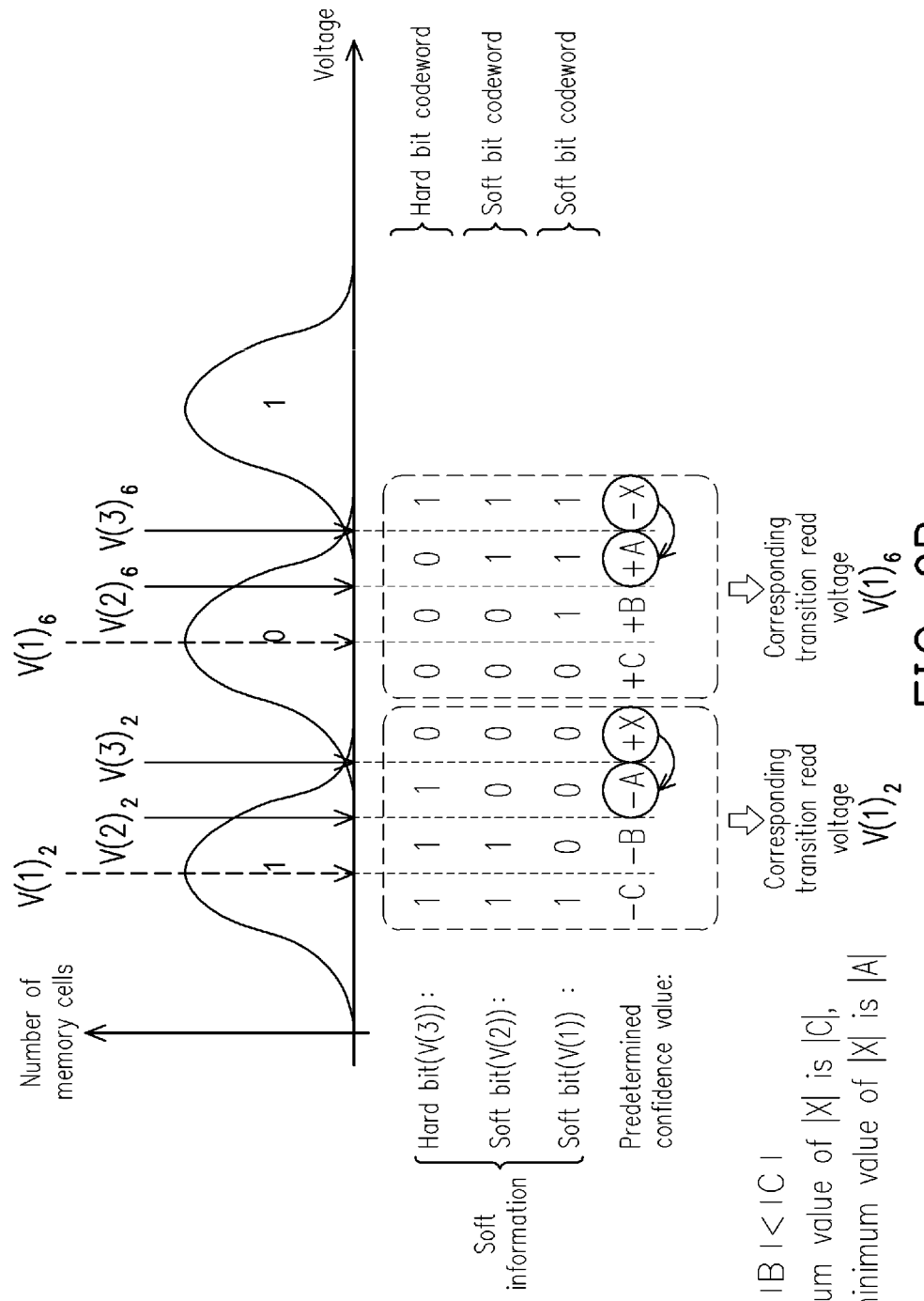
FIG. 9B through FIG. 9D are schematic diagrams illustrating the setting of a plurality of predetermined confidence values corresponding to the second descending mode and a target physical page having 2 transition read voltages according to an embodiment of the invention.
Figure 9C:
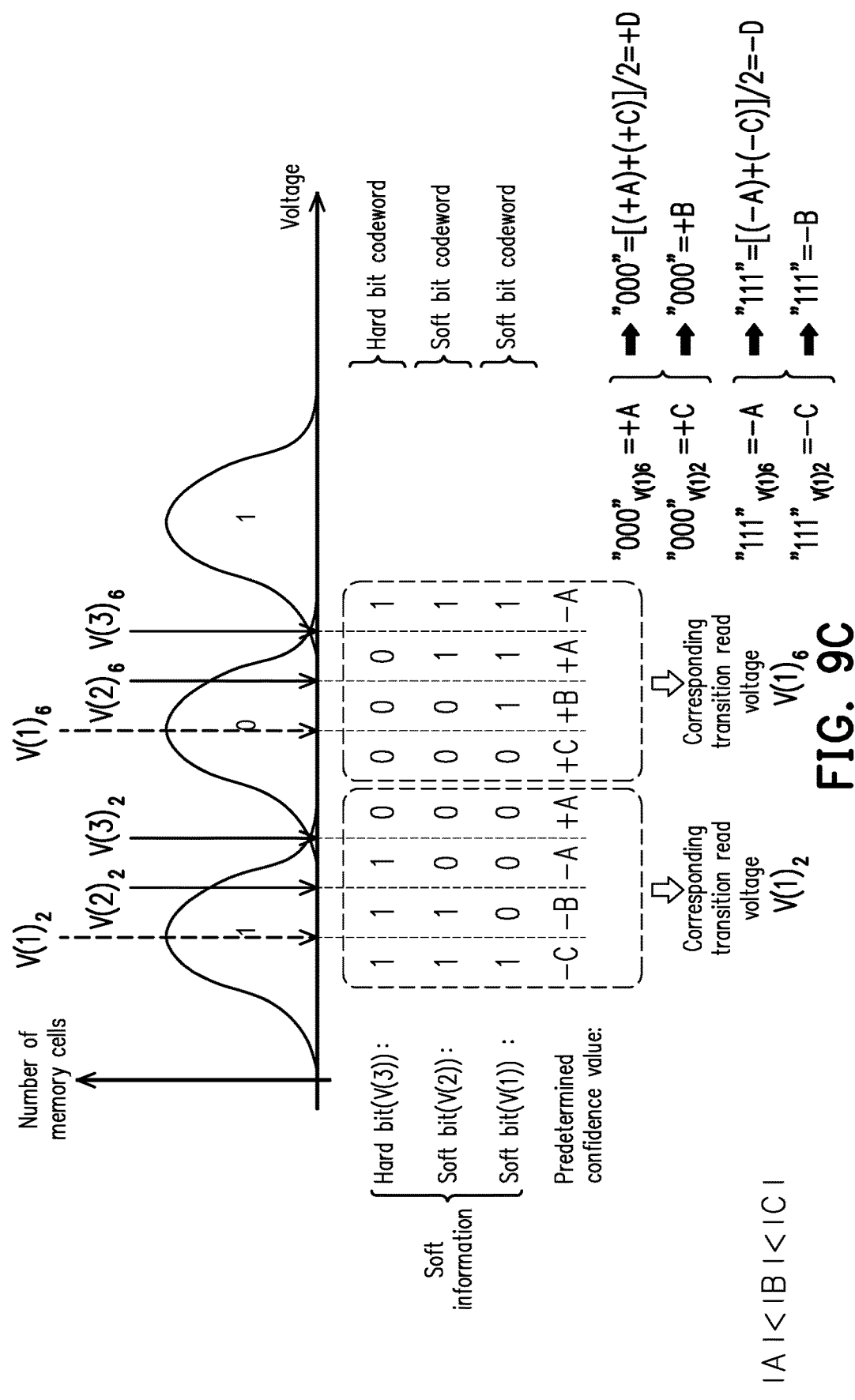
Figure 9D:
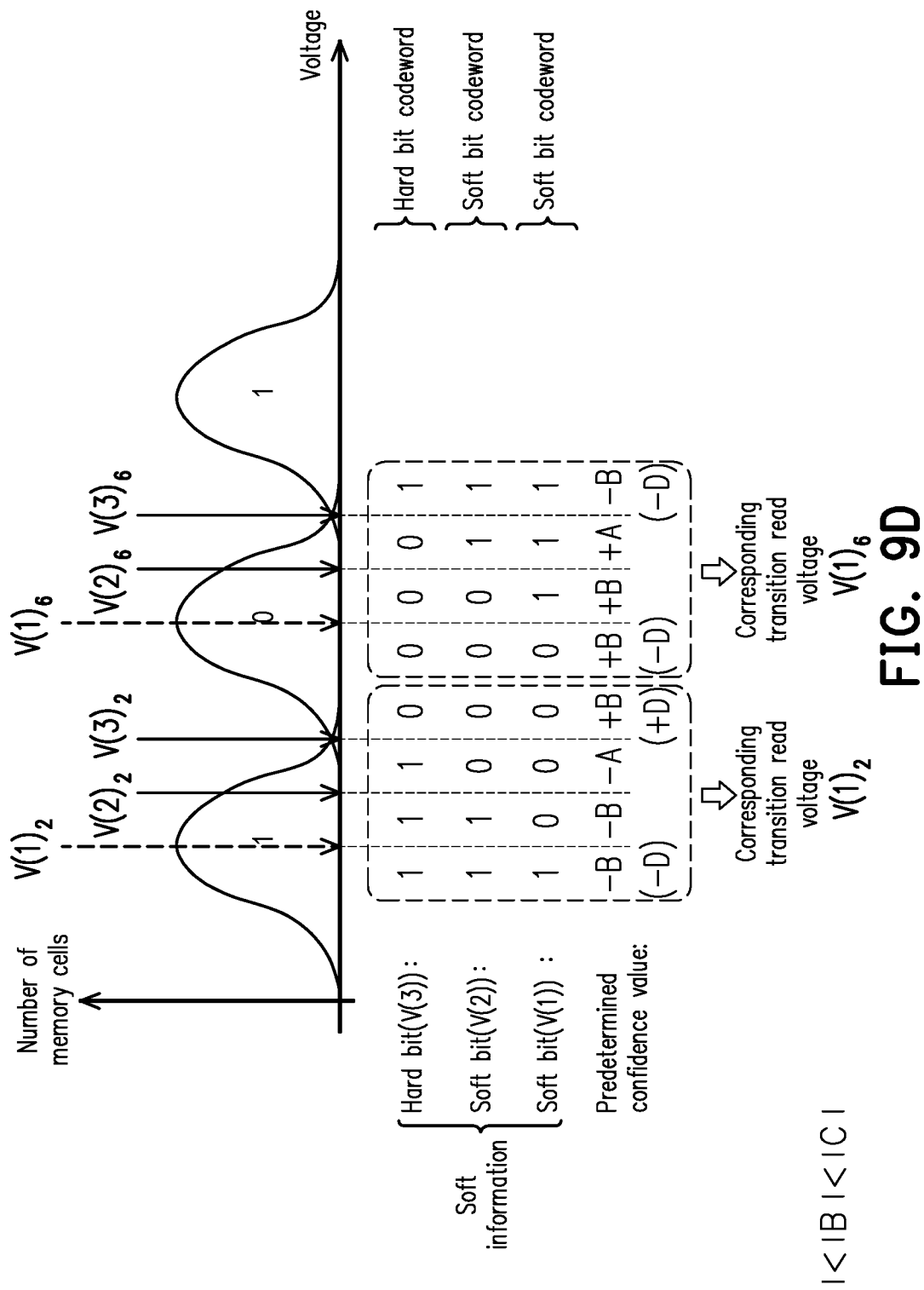

FIG. 9B through FIG. 9D are schematic diagrams illustrating the setting of a plurality of predetermined confidence values corresponding to the second descending mode and a target physical page having 2 transition read voltages according to an embodiment of the invention. Referring to FIG. 9B first, the confidence table management circuit 2152 sets predetermined confidence values of the soft information patterns of "111", "110", "100" and "000" corresponding to the transition read voltage $V(1)_2$ as "−C", "−B", "−A" and "+X" and sets the predetermined confidence values of the soft information patterns of "000", "001", "011" and "111" corresponding to the transition read voltage $V(1)_6$ as "+C", "+B", +A" and "−X". In the present embodiment, the confidence table management circuit 2152 sets the predetermined confidence values corresponding to the read voltage adjacent to the hard bit codeword as having the same absolute value (based on a value that is currently confirmed).

For example, the confidence table management circuit 2152 sets the predetermined confidence value of the soft information pattern of "000" adjacent to the read voltage $V(3)_2$ from "+X" to "−A" and sets the predetermined confidence value of the soft information pattern of "111" adjacent to the read voltage $V(3)_6$ from "−X" to "+A". Referring to FIG. 9C, after the adjustment, the predetermined confidence values of the soft information patterns of "111", "110", "100" and "000" corresponding to the read voltage $V(1)_2$ are "−C", "−B", "−A" and "−A", and the predetermined confidence values of the soft information patterns of "000", "001", "011" and "111" corresponding to the read voltage $V(1)_6$ are "+C", "+B", "+A" and "+A". Thereafter, the confidence table management circuit 2152 adjusts the predetermined confidence values corresponding to the same soft information pattern to be consistent. For example, the soft information pattern of "000" (having the predetermined confidence value of "+A") corresponding to the transition read voltage $V(1)_2$ is the same as the soft information pattern of "000" (having the predetermined confidence value of "+C") corresponding to the transition read voltage $V(1)_6$, but the same soft information pattern of "000" does not have the same predetermined confidence value. In an embodiment, the confidence table management circuit 2152 sets an absolute value of each predetermined confidence value corresponding to the two same soft information patterns to an intermediate value, wherein the intermediate absolute value is, for example, "|B|". In an embodiment, the confidence table management circuit 2152 sets the absolute value of each predetermined confidence value corresponding to the two same soft information pattern to an average value, wherein the average value is an average of the absolute values originally corresponding to the predetermined confidence values (for example, [(+A)+(+C)]/2=D).

Referring to FIG. 9D, after the predetermined confidence values are adjusted to be consist, the confidence table of the physical page having 2 transition read voltages corresponding to the first descending mode is completely set by the confidence table management circuit 215. The predetermined confidence values of the soft information patterns of "111", "110", "100" and "000" corresponding to the read voltage $V(1)_2$ are "−B" (or "−D"), "−B", "−A" and "+B" (or "+D"), the predetermined confidence values of the soft information patterns of "000", "001", "011" and "111" corresponding to the read voltage $V(1)_6$ are "+B" (or "+D"), "+B", "+A" and"−B" (or "−D"). The confidence tables generated corresponding to the second descending mode are, for example, Table 900 as illustrated in FIG. 9E.

In the same way, the confidence table management circuit 2152 may generate a plurality of confidence table corresponding to the second ascending mode, are as illustrated in Table 1000 in FIG. 10, for example. The detailed setting manners and processes may be known according to the embodiments above and are not repeated hereinafter.

FIG. 1|A is a schematic diagram illustrating the setting of a plurality of predetermined confidence values corresponding to the hook-like mode and a target physical page having 1 transition read voltages according to an embodiment of the invention. Referring to an example at the left side in FIG. 1|A, in the example, the soft information management circuit 2151 sequentially uses the transition read voltage $V(1)_4$, the first adjust read voltage $V(2)_4$ (which is adjusted leftward) and the second adjust read voltage $V(3)_4$ (which is adjusted rightward) to read a target physical page and obtains corresponding soft information patterns of "111", 101", "001" and "000". The confidence table management circuit 2152, according to the above manner, sets predetermined confidence values of the soft information patterns "101" and "001" to "−A" and "+A", and sets predetermined confidence values of the soft information patterns "111" and "000" to "−C" and "+C". Referring to an example at the right side in FIG. 1|A, in the example, the soft information management circuit 2151 sequentially uses the transition read voltage $V(1)_4$, the first adjust read voltage $V(2)_4$ (which is adjusted rightward) and the second adjust read voltage $V(3)_4$ (which is adjusted leftward) to read the target physical page and obtains corresponding soft information patterns of "111", 110", "010" and "000". The confidence table management circuit 2152, according to the above manner, sets predetermined confidence values of the soft information patterns "110" and "010" to "−A" and "+A", and sets predetermined confidence values of the soft information patterns "111" and "000" to "−C" and "+C".

In an embodiment, if a total number of the soft bit codewords is greater than 1 (for example, 2, in the example illustrated in FIG. 9A), the soft information management circuit 2151 performs an XOR operation or an XNOR operation on all the soft bit codewords, serves an obtained first operation result corresponding to the XOR operation or an obtained second operation result corresponding to the XNOR operation as a soft bit value of each of a plurality of memory cells, a hard bit value of each of the target memory cells according to the hard bit codeword, and combines the hard bit value of each of the target memory cells with the soft bit value of each of the target memory cells to constitute the soft information of each of the target memory cells.

FIG. 1|B is a schematic diagram illustrating the setting of a plurality of predetermined confidence values corresponding to the hook-like mode and a target physical page having 1 transition read voltages according to another embodiment of the invention. For example, referring to FIG. 1|B, it is assumed that a soft bit codeword corresponding to a read voltage $V(2)_4$ is "1110", and a soft bit codeword corresponding to a read voltage $V(3)_4$ is "1000". The soft information management circuit 2151 performs an XOR operation the soft bit codewords 1110" and "1000" and serves an obtained result of "0110" as a soft bit value corresponding to soft information. Then, the soft information management circuit 2151 combines the hard bit value of "1100" and the soft bit value of "0110" to obtain the soft information of "10 11 01 00" (also referred to as a soft information pattern of "10 11 01 00".

Figure 11A:
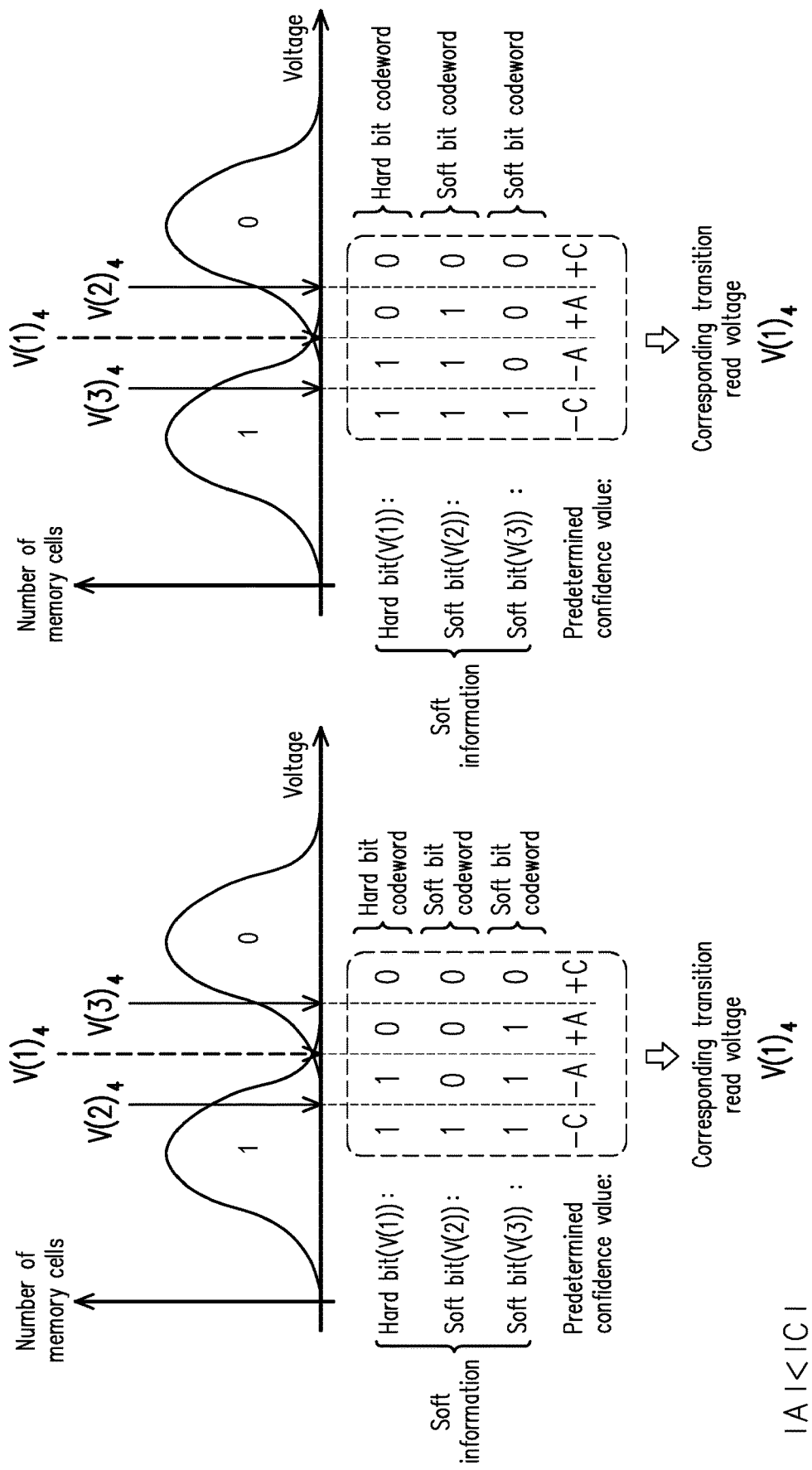
FIG. 11A is a schematic diagram illustrating the setting of a plurality of predetermined confidence values corresponding to the hook-like mode and a target physical page having 1 transition read voltages according to an embodiment of the invention.
Figure 11B:
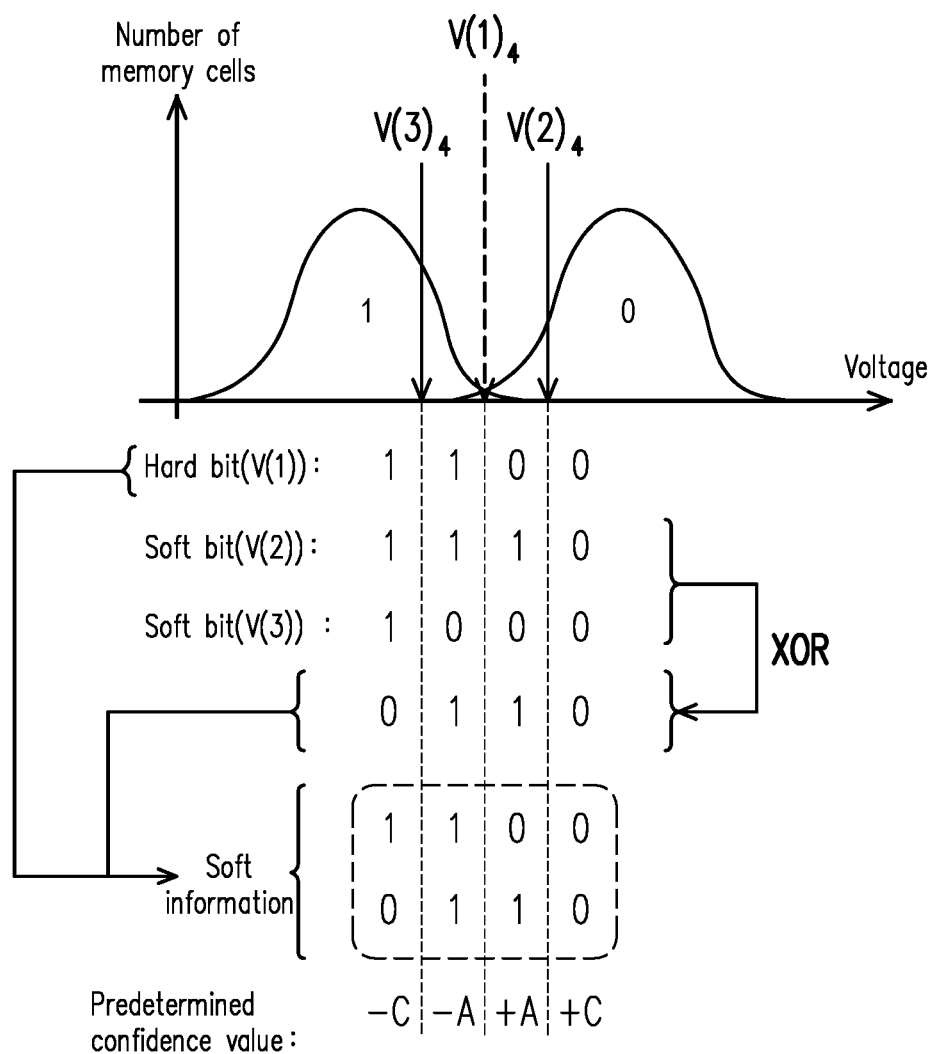
FIG. 11B is a schematic diagram illustrating the setting of a plurality of predetermined confidence values corresponding to the hook-like mode and a target physical page having 1 transition read voltages according to another embodiment of the invention.

Thereafter, the confidence table management circuit 2152, according to the above manner, sets predetermined confidence values of the soft information patterns "11" and "01" to "−A" and "+A", and sets predetermined confidence values of the soft information patterns "10" and "00" to "−C" and "+C". The confidence tables generated corresponding to the hook-like mode are, for example, Table 1000 as illustrated in FIG. 11.

Returning to FIG. 2, after a plurality of confidence values corresponding to a plurality of target memory cells are obtained, in step S26, the confidence values of the target memory cells are used to replace a plurality of log likelihood ratios corresponding to the target memory cells, the adjusted preset decoding operation having the replaced log likelihood ratios is performed on the plurality of soft information, so as to obtain a valid codeword corresponding to the target physical page and complete the read operation.

Specifically, the preset decoding operation originally corresponding to the target word line performs a plurality of iterative decoding operations according to a plurality of log likelihood ratios corresponding to the target memory cells and original soft information corresponding to the target memory cells. The original soft information is not the same as that soft information generated in step S24. The original soft information is obtained through a plurality of auxiliary read voltage sets corresponding to a plurality of transition read voltages, wherein an auxiliary read voltage set corresponding to a transition read voltage has two paired auxiliary read voltages, wherein one of the auxiliary read voltages is smaller than a voltage offset value of the transition read voltage, and the other one of the auxiliary read voltages is greater than a voltage offset value of the transition read voltage.

However, in step S26, the error checking and correcting circuit 214 replaces the log likelihood ratios of the target memory cells by a plurality of confidence values of the target memory cells, replaces the original soft information with the plurality of generated soft information of the target memory cells, and again performs the preset decoding operation (also referred to as the adjusted preset decoding operation) on the plurality of soft information of the target memory cells. After completing the adjusted preset decoding operation, the error checking and correcting circuit 214 may obtain the valid codeword and complete the read operation on the target word line. The valid codeword is output as the read operation is completed, and the valid codeword is considered as a correct target codeword stored by the read correct target physical page.

It is to be mentioned that in the present embodiment, the read assisting circuit unit 215 uses a Gray code count value obtained by reading verified data to identify a size relative relation among a plurality of read voltages of a plurality of read voltage sets, which will be described with reference to FIG. 12A, FIG. 12B and FIG. 13.

FIG. 12A is a schematic diagram illustrating the calculation of deviation amount difference values according to an embodiment of the invention. In the present embodiment, the read assisting circuit unit 215 may use a plurality of read voltages of a read voltage set to read verified data stored by a target word line to obtain a deviation amount difference value of the read voltage values of the read voltage set. Referring to FIG. 12A, for example, it is assumed that the read assisting circuit unit 215 uses a read voltage set V(1) to read the verified data. The read voltage set V(1) includes a plurality of read voltages V(1)$_1$ to V(1)$_7$.

Since a preset storage state (a preset Gray code) of the verified data stored in a plurality of memory cells of the target word line is known to the read assisting circuit unit 215, the read assisting circuit unit 215 may directly identify a deviation direction of the Gray code of each of the memory cell and a corresponding deviation amount. For example, if the preset Gray code of a target memory cell has a Gray code pattern of "111" (G1), and a Gray code obtained according to the read voltage set V(1) is "110" (G2), the read assisting circuit unit 215 may identify a storage state of an upper physical page of this target memory cell corresponding to the read voltage V(1) as deviating rightward, and the read assisting circuit unit 215 may accumulate an amount of corresponding upper physical pages which deviate rightward, which is represented by C(1)$_{G1G2}$ (i.e., a rightward deviation count value), wherein "(1)" is used to represent the corresponding read voltage set V(1), and "G1G2" is used to represent that the storage state of the target memory cell deviates from the preset Gray code pattern G1 of "111" to the currently read Gray code pattern G2 of "110" (i.e., the storage state of the upper physical page of the target memory cell deviates rightward). Moreover, it may be understood from "G1G2" that the corresponding read voltage V(1)$_1$ is a read voltage from the read voltage set V(1) used to distinguish the Gray code pattern G1 and the Gray code pattern G2, and an order of "G1" and "G2" in "G1 G2" may indicate that the deviation direction is from G1 to G2, which is a rightward direction.

That is to say, as illustrated in Table 1200, the read voltage V(1)$_1$ corresponds the Gray code pattern G1 of "111" and the Gray code pattern G2 of "110", the read voltage V(1)$_2$ corresponds the Gray code pattern G2 of "110" and a Gray code pattern G3 of "100", the read voltage V(1)$_3$ corresponds the Gray code pattern G3 of "100" and a Gray code pattern G4 of "101", the read voltage V(1)$_4$ corresponds the Gray code pattern G4 of "101" and a Gray code pattern G5 of "001", the read voltage V(1)$_5$ corresponds the Gray code pattern G5 of "001" and a Gray code pattern G6 of "000", the read voltage V(1)$_6$ corresponds the Gray code pattern G6 of "000" and a Gray code pattern G7 of "010", and the read voltage V(1)$_7$ corresponds the Gray code pattern G7 of "010" and a Gray code pattern G8 of "011". By reading the verified data stored in the target word line by using the read voltages V(1)$_1$ to V(1)$_7$ of the read voltage set V(1), the read assisting circuit unit 215 may record/calculate corresponding leftward deviation count value and rightward deviation count value.

For example, as illustrated in Table 1200, for the read voltage V(1)$_1$, the read assisting circuit unit 215 may record a rightward deviation count value C(1)G1G2 and a leftward deviation count value C(1)$_{G2G1}$ corresponding to the read voltage V(1)1.

After calculating the rightward deviation count values and the leftward deviation count values corresponding to all the read voltages of the read voltage set V(1), the read assisting circuit unit 215 may calculate a deviation amount difference value according to the rightward deviation count value and the leftward deviation count value corresponding to each of the read voltages. Specifically, the deviation amount difference value may be a difference of the rightward deviation count value subtracted by the leftward deviation count value.

For example, Referring to FIG. 12A, for the read voltage $V(1)_1$, the read assisting circuit unit 215 may calculate a deviation amount difference value $V(1)_1$ according to the rightward deviation count value $C(1)_{G1G2}$ and the leftward deviation count value C(1)G2G1 corresponding to the read voltage $V(1)_1$ (i.e., $D(1)_1=C(1)_{G1G2}-C(1)_{G2G1}$).

In the present embodiment, the read assisting circuit unit 215 may further sum up deviation amount difference values corresponding to all read voltages in a read voltage set to obtain a deviation amount difference value summation corresponding to the read voltage set. Thereafter, the read assisting circuit unit 215 may use the deviation amount difference value summation of each of a plurality of read voltage sets to determine a size relative relation among the voltages of the read voltage set.

Figure 12B:
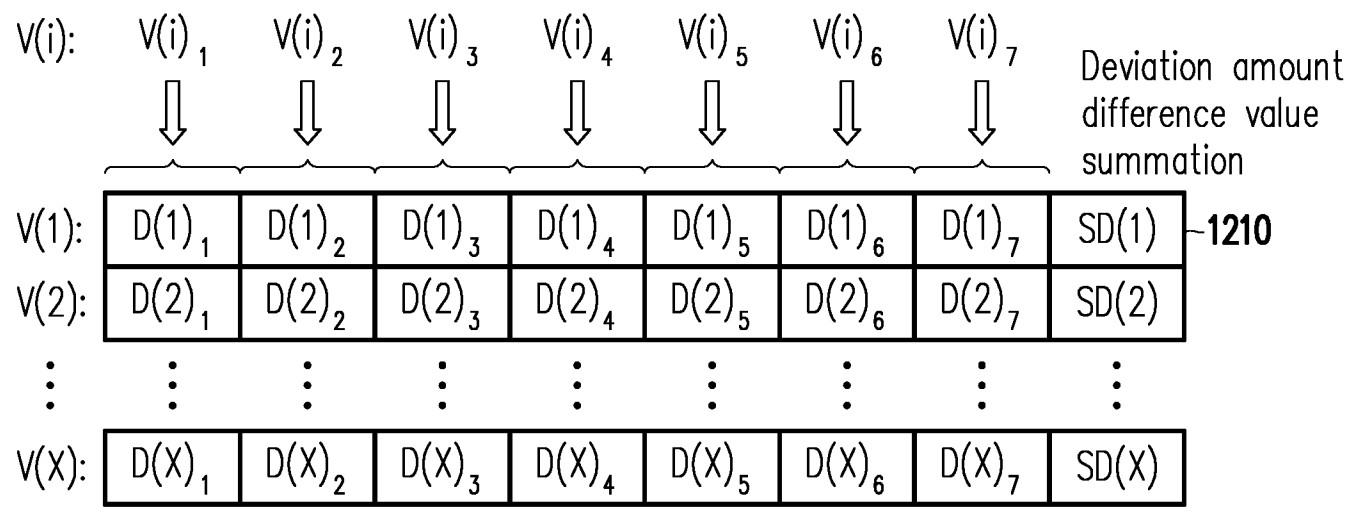

FIG. 12B is a schematic diagram illustrating a statistical table for recording the deviation amount difference values and deviation amount difference value summations according to an embodiment of the invention. Referring to FIG. 12B, as illustrated in Table 1210, the read assisting circuit unit 215 may record deviation amount difference values of read voltages of a plurality of read voltage sets V(1) to V(X) and deviation amount difference value summations of the read voltage sets V(1) to V(X) (i.e., the deviation amount difference value summations SD(1) to SD(X)).

In the present embodiment, if a first deviation amount difference value summation of a first read voltage set is less than a second deviation amount difference value summation of a second read voltage set, the read assisting circuit unit 215 may determine a plurality of read voltages of the first read voltage set are smaller than those of the second read voltage set (e.g., the read voltage $V(1)_1$ is smaller than the read voltage $V(2)_1$). Or otherwise, if a third deviation amount difference value summation of a third read voltage set is less than a fourth deviation amount difference value summation of a fourth read voltage set, the read assisting circuit unit 215 may determine a plurality of read voltages of the third read voltage set are greater than those of the fourth read voltage set (e.g., the read voltage $V(3)_1$ is smaller than the read voltage $V(4)_1$).

It should be noted that one of the read voltage sets may be used to read a predetermined read voltage set of the target physical page (the predetermined read voltage of the predetermined read voltage set is used to read the target physical page), another one of the read voltage sets may be a first adjust read voltage set corresponding to the predetermined read voltage set used to read the target physical page (the first adjust read voltage of the first adjust read voltage set is used to read again the target physical page).

FIG. 13 is a schematic diagram illustrating the sorting of a plurality of read voltage sets by the deviation amount difference value summations according to an embodiment of the invention. Referring to FIG. 13, the read assisting circuit unit 215 may sort a plurality of read voltage sets according to values of a plurality of deviation amount difference value summations of the read voltage sets.

For example, as illustrated in Table 1300, the read assisting circuit unit 215 may calculate that a deviation amount difference value of the read voltage sets V(1) is "5" according to the deviation amount difference values of $-1, 9, 6, -4, -3, -2, 0$" of the read voltages $V(1)_1$ to $V(1)_7$ of the read voltage set V(1). After all the deviation amount difference value summations are calculated, the read assisting circuit unit 215 may sort a plurality of read voltage sets V(1) to V(16). Afterwards, the read assisting circuit unit 215 may directly determine a size relation among the read voltages of the read voltage sets V(1) to V(16) according to an order of the read voltages of the read voltage sets V(1) to V(16).

For example, it is assumed that the predetermined read voltage set is a read voltage set V(13) having a sorting value of "1", and a first adjust read voltage set V(12) corresponding to the predetermined read voltage set which is the read voltage set V(13) has a sorting value of "10". The read assisting circuit unit 215 may determine that the predetermined read voltage set V(13) is smaller than the first adjust read voltage set V(12) (wherein 1<10). Namely, the read assisting circuit unit 215 may determine that a read voltage from the predetermined read voltage set V(13) is smaller than one from the first adjust read voltage set V(12) (e.g., a predetermined read voltage $V(13)_4$ is smaller than a first adjust read voltage $V(12)_4$).

In another embodiment, the deviation amount difference value calculated by the read assisting circuit unit 215 may be a difference value of the leftward deviation count value subtracted by the rightward deviation count value, and correspondingly adjust a subsequent method of determining two read voltage sets by using deviation amount difference value summations. For example, in another embodiment, if a first deviation amount difference value summation of a first read voltage set is less than a second deviation amount difference value summation of a second read voltage set, the read assisting circuit unit 215 may determine a plurality of read voltages of the first read voltage set are much "greater" than those of the second read voltage set (e.g., the read voltage $V(1)_1$ is larger than the read voltage $V(2)_1$).

It is to be mentioned that in the plurality of embodiments described above, the read assisting circuit unit 215 is implemented in a form of a hardware circuit, but the invention is not limited thereto. For example, in an embodiment, the read assisting circuit unit 215 may be implemented as a read assisting program module with the functions of the read assisting circuit unit 215 in a form of software. The read assisting program code module may include a soft information management program module and a confidence table management program module. The soft information management program module is a program module with the functions of the soft information management circuit 2151, and the confidence table management program module is a program module with the functions of the confidence table management circuit 2152. The processor 211 may access and execute the read assisting program module (or the soft information management program module and the confidence table management program module) to perform the data reading method (or the read assisting method) provided by the invention.

In light of the foregoing, the data reading method, the storage controller and the storage device provided by the embodiments of the invention can utilize the predetermined read operation (using the predetermined read voltage) performed on the target physical page and the read retry operation (using the first adjust read voltage) without preparing the verified data to obtain a plurality of codewards corresponding to the target physical page and perform the preset decoding operation on the codeword to obtain the plurality of corresponding syndromes. Thereafter, in response to the failure of the read retry operation (the syndromes corresponding to the codewords in the read retry operation are not zero), the soft information of each of the target memory cells of the target physical page can be further generated according to the size relative relation among the syndromes and the codewords to find the confidence values of the target memory cells from the confidence tables corresponding to the size relative relation and the target physical page so as to perform the adjusted iterative decoding operation according to the confidence values. In this way, the adjusted iterative decoding operation with powerful decoding capability can be performed for decoding to obtain the valid codeword of the target physical page, such that the correct valid codeword can be obtained after the failure of the read retry operation, and the accuracy and the reliability of the data read from the target word line can be enhanced. Thereby, the negative effect due to the failure of the read retry operation can be mitigated, and the overall time of the read operation for obtaining the valid codeword can be saved, so as to improve the overall efficiency of the data reading operation.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A data read method, applicable to a storage device disposed with a rewritable non-volatile memory module, wherein the rewritable non-volatile memory module comprises a plurality of word lines, each of the word lines is coupled to a plurality of memory cells, each of the memory cells comprises a plurality of physical pages, and each of the physical pages is configured to be programmed to have a bit value, the method comprising:

selecting a target physical page of a target word line to perform a read operation on a target codeword stored by the target physical page, wherein a plurality of target memory cells of the target physical page are configured to respectively store a plurality of target bit values of the target codeword;

using a predetermined read voltage corresponding to the target physical page to read the target physical page to obtain a read codeword corresponding to the target physical page and performing a preset decoding operation on the read codeword to obtain a plurality of read codeword syndromes corresponding to the read codeword, wherein the read codeword is stored in a codeword buffer area, and a first one of the read codeword syndromes is stored in a syndrome buffer area;

in response to the determination that a plurality of bit values of a last one of the read codeword syndromes are not all zero, using a first adjust read voltage corresponding to the predetermined read voltage to read again the target physical page to obtain a first adjust codeword corresponding to the target physical page and performing the preset decoding operation on the first adjust codeword to obtain a plurality of first adjust codeword syndromes corresponding to the first adjust codeword, wherein the first adjust codeword is stored in the codeword buffer area, and a first one of the first adjust codeword syndromes is stored in the syndrome buffer area;

in response to the determination that a plurality of bit values of a last one of the first adjust codeword syndromes are not all zero, generating soft information of each of the target memory cells according to a plurality of codewords corresponding to the read operation in the codeword buffer area;

identifying a target confidence table corresponding to a size relative relation from a plurality of confidence tables corresponding to the target physical page according to the size relative relation among a plurality of syndromes in the syndrome buffer area, wherein the confidence tables respectively correspond to a plurality of modes of the size relative relation, and each of the confidence tables has a plurality of predetermined confidence values respectively corresponding to a plurality of soft information patterns;

finding a confidence value of each of the target memory cells from the target confidence table according to the plurality of soft information of the target memory cells; and using the confidence values of the target memory cells to replace a plurality of log likelihood ratios corresponding to the target memory cells in the preset decoding operation and performing an adjusted preset decoding operation having the replaced log likelihood ratios on the plurality of soft information, so as to obtain a valid codeword corresponding to the target physical page and complete the read operation.

2. The data read method as recited in claim 1, wherein the preset decoding operation comprises a plurality of iterative decoding operations applying a low density parity check algorithm.

3. The data read method as recited in claim 1, further comprising:

in response to the determination that the bit values of the last one of the read codeword syndromes are all zero, identifying a decoded read codeword corresponding to the last one of the read codeword syndromes as the valid codeword of the read operation and completing the read operation; and in response to the determination that the bit values corresponding to the last one of the first adjust codeword syndromes are all zero, identifying a decoded first adjust codeword corresponding to the last one of the first adjust codeword syndromes as the valid codeword of the read operation and completing the read operation.

4. The data read method as recited in claim 1, wherein if a total number of the syndromes in the syndrome buffer area is equal to 2, and the syndromes comprise a left syndrome corresponding to a low read voltage and a right syndrome corresponding to a high read voltage, the modes of the size relative relation comprise:

a first descending mode, wherein if a total number of bit values of "1" of the left syndrome is greater than a total number of bit values of "1" of the right syndrome, the size relative relation is identified as the first descending mode, wherein the right syndrome is identified as a smallest syndrome;

a first ascending mode, wherein if the total number of bit values of "1" of the right syndrome is greater than the total number of bit values of "1" of the left syndrome, the size relative relation is identified as the first ascending mode, wherein the left syndrome is identified as the smallest syndrome; and a horizontal mode, wherein if a difference between the total number of bit values of "1" of the right syndrome and the total number of bit values of "1" of the left syndrome is less than a syndrome difference threshold, and both the total number of bit values of "1" of the right syndrome and the total number of bit values of "1" of the left syndrome are less than a syndrome threshold, the size relative relation is identified as the horizontal mode, wherein the syndrome having the smaller total number of bit values of "1" is identified as the smallest syndrome, wherein the confidence tables corresponding to the target physical page respectively correspond to the first descending mode, and the first ascending mode and the horizontal mode.

5. The data read method as recited in claim 1, wherein the step of in response to the determination that the bit values of the last one of the first adjust codeword syndromes are not all zero, generating the soft information of each of the target memory cells according to the codewords corresponding to the read operation in the codeword buffer area comprises:

in response to the determination that the bit values of the last one of the first adjust codeword syndromes are not all zero, generating a second adjust read voltage according to the predetermined read voltage, the first adjust read voltage and the corresponding syndromes;

using the second adjust read voltage to read the target physical page to obtain a second adjust codeword corresponding to the target physical page and performing the preset decoding operation on the second adjust codeword to obtain a plurality of second adjust codeword syndromes corresponding to the second adjust codeword, wherein the second adjust codeword is stored in the codeword buffer area, and a first one of the second adjust codeword syndromes is stored in the syndrome buffer area; and in response to the determination that a plurality of bit values of a last one of the second adjust codeword syndromes are not all zero, generating the soft information of each of the target memory cells according to all the codewords corresponding to the read operation in the codeword buffer area.

6. The data read method as recited in claim 5, wherein if a total number of the syndromes in the syndrome buffer area is equal to 3, and the syndromes comprise a left syndrome corresponding to a lowest read voltage, a right syndrome corresponding to a highest read voltage and an middle syndrome corresponding to an intermediate read voltage, the modes of the size relative relation comprise:

a second descending mode, wherein if a total number of bit values of "1" of the left syndrome is greater than a total number of bit values of "1" of the middle syndrome, and the total number of bit values of "1" of the middle syndrome is greater than a total number of bit values of "1" of the right syndrome, the size relative relation is identified as the second descending mode, wherein the right syndrome is identified as a smallest syndrome;

a second ascending mode, wherein if the total number of bit values of "1" of the right syndrome is greater than the total number of bit values of "1" of the middle syndrome, and the total number of bit values of "1" of the middle syndrome is greater than the total number of bit values of "1" of the left syndrome, the size relative relation is identified as the second ascending mode, wherein the left syndrome is identified as the smallest syndrome; and a hook-like mode, wherein if the total number of bit values of "1" of the middle syndrome is less than the total number of bit values of "1" of the left syndrome, and the total number of bit values of "1" of the middle syndrome is less than the total number of bit values of "1" of the right syndrome, the size relative relation is identified as the hook-like mode, wherein the middle syndrome is identified as the smallest syndrome, wherein the confidence tables corresponding to the target physical page respectively correspond to the second descending mode, the second ascending mode and the hook-like mode.

7. The data read method as recited in claim 5, wherein the step of generating the second adjust read voltage according to the predetermined read voltage, the first adjust read voltage and the corresponding syndromes comprises:

calculating a voltage difference value obtained by subtracting the first adjust read voltage by the predetermined read voltage;

in response to a total number of bit values of "1" of a syndrome corresponding to the first adjust read voltage in the syndrome buffer area being smaller than a total number of bit values of "1" of a syndrome corresponding to the predetermined read voltage, generating the second adjust read voltage by adding the first adjust read voltage by the voltage difference value; and in response to the total number of bit values of "1" of the syndrome corresponding to the first adjust read voltage in the syndrome buffer area being greater than the total number of bit values of "1" of the syndrome corresponding to the predetermined read voltage, generating the second adjust read voltage by subtracting the predetermined read voltage by the voltage difference value.

8. The data read method as recited in claim 1, the step of generating the soft information of each of the target memory cells according to the codewords corresponding to the read operation in the codeword buffer area comprises:

identifying a smallest syndrome having a minimum total number of bit values of "1" among the syndromes in the syndrome buffer area, selecting a codeword corresponding to the smallest syndrome among the codewords in the codeword buffer area to set the selected codeword as a hard bit codeword corresponding to the target memory cells and setting the rest of the codewords among the codewords in the codeword buffer area which are not selected as a soft bit codeword corresponding to the target memory cells; and using the hard bit codeword and the soft bit codewords to constitute the soft information of each of the target memory cells.

9. The data read method as recited in claim 8, wherein if a total number of the soft bit codewords is greater than 1, the step of using the hard bit codeword and the soft bit codewords to constitute the soft information of each of the target memory cells comprises:

performing an XOR operation or an XNOR operation on all the soft bit codewords and serving an obtained first operation result corresponding to the XOR operation or an obtained second operation result corresponding to the XNOR operation as a soft bit value of each of the target memory cells;

identifying a hard bit value of each of the target memory cells according to the hard bit codeword; and combining the hard bit value of each of the target memory cells with the soft bit value of each of the target memory cells to constitute the soft information of each of the target memory cells.

10. The data read method as recited in claim 1, wherein the step of finding the confidence value of each of the target memory cells from the target confidence table according to the plurality of soft information of the target memory cells comprises:

for first soft information of a first target memory cell among the target memory cells, finding a first soft information pattern matching the first soft information from a plurality of soft information patterns of the target confidence table and a first predetermined confidence value corresponding to the first soft information according to the first soft information, and in response to the first soft information not matching one of the soft information patterns of the target confidence table, setting the first predetermined confidence value corresponding to the first soft information to a preset value; and identifying the first predetermined confidence value as a first confidence value of the first target memory cell corresponding to the target physical page.

11. The data read method as recited in claim 10, wherein an absolute value of each of the predetermined confidence values in the target confidence table is set according to a target mode of the size relative relation corresponding to the target confidence table, wherein the soft information patterns of the target confidence table are obtained by reading the target physical page by sequentially using one or more transition read voltages corresponding to the target mode and the target physical page and one or more adjust read voltages corresponding to the one or more transition read voltages, wherein among the soft information patterns, absolute values of one or more predetermined confidence values corresponding to one or more of the soft information patterns that are closer to the one or more transition read voltages are set to be smaller values, wherein among the soft information patterns, the absolute value of the predetermined confidence value corresponding to the soft information pattern between one of the one or more transition read voltages and the corresponding adjust read voltage is set to be a minimum value, wherein positiveness or negativeness of each of the predetermined confidence values is set according to a hard bit value in the corresponding soft information pattern, wherein in response to the hard bit value in the soft information pattern corresponding to one of the predetermined confidence values being "1", the first predetermined confidence value is set to be a negative value, wherein in response to the hard bit value in the soft information pattern corresponding to the predetermined confidence value being "0", the first predetermined confidence value is set to be a positive value.

12. A storage controller, for controlling a storage device disposed with a rewritable non-volatile memory module, the storage controller comprises:

a connection interface unit, configured to couple to a host system;

a memory interface control circuit, configured to couple to the rewritable non-volatile memory module, wherein the rewritable non-volatile memory module comprises a plurality of word lines, each of the word lines is coupled to a plurality of memory cells, each of the memory cells comprises a plurality of physical pages, and each of the physical pages is configured to be programmed to have a bit value;

a read assisting circuit unit;

an error checking and correcting circuit; and a processor, coupled to the connection interface circuit, the memory interface control circuit, the read assisting circuit unit and the error checking and correcting circuit, wherein the processor is configured to select a target physical page of a target word line to perform a read operation on a target codeword stored by the target physical page, wherein a plurality of target memory cells of the target physical page are configured to respectively store a plurality of target bit values of the target codeword, wherein the processor is further configured to use a predetermined read voltage corresponding to the target physical page to read the target physical page to obtain a read codeword corresponding to the target physical page, wherein the error checking and correcting circuit is configured to perform a preset decoding operation on the read codeword to obtain a plurality of read codeword syndromes corresponding to the read codeword, wherein the read assisting circuit unit is configured to store the read codeword in a codeword buffer area and store a first one of the read codeword syndromes in a syndrome buffer area, wherein in response to the determination that a plurality of bit values of a last one of the read codeword syndromes are not all zero, the processor is further configured to use a first adjust read voltage corresponding to the predetermined read voltage to read again the target physical page to obtain a first adjust codeword corresponding to the target physical page, wherein the error checking and correcting circuit is further configured to perform the preset decoding operation on the first adjust codeword to obtain a plurality of first adjust codeword syndromes corresponding to the first adjust codeword, wherein the read assisting circuit unit is configured to store the first adjust codeword in the codeword buffer area and store a first one of the first adjust codeword syndromes in the syndrome buffer area, wherein in response to the determination that the bit values of the last one of the first adjust codeword syndromes are not all zero, the read assisting circuit unit is further configured to generate soft information of each of the target memory cells according to a plurality of codewords corresponding to the read operation in the codeword buffer area, wherein the read assisting circuit unit is further configured to identify a target confidence table corresponding to a size relative relation from a plurality of confidence tables corresponding to the target physical page according to the size relative relation among a plurality of syndromes in the syndrome buffer area, wherein the confidence tables respectively correspond to a plurality of modes of the size relative relation, and each of the confidence tables has a plurality of predetermined confidence values respectively corresponding to a plurality of soft information patterns, wherein the read assisting circuit unit is further configured to find a confidence value of each of the target memory cells from the target confidence table according to the plurality of soft information of the target memory cells, wherein the read assisting circuit unit is further configured to use the confidence values of the target memory cells to replace a plurality of log likelihood ratios corresponding to the target memory cells, and the error checking and correcting circuit is further configured to perform an adjusted preset decoding operation having the replaced log likelihood ratios on the plurality of soft information, so as to obtain a valid codeword corresponding to the target physical page and complete the read operation.

13. The storage controller as recited in claim 12, wherein the preset decoding operation comprises a plurality of iterative decoding operations applying a low density parity check algorithm.

14. The storage controller as recited in claim 12, wherein
in response to the determination that the bit values of the last one of the read codeword syndromes are all zero, the error checking and correcting circuit identifies a decoded read codeword corresponding to the last one of the read codeword syndromes as the valid codeword of the read operation, and the processor completes the read operation; and
in response to the determination that the bit values corresponding to the last one of the first adjust codeword syndromes are all zero, the error checking and correcting circuit identifies a decoded first adjust codeword corresponding to the last one of the first adjust codeword syndromes as the valid codeword of the read operation, and the processor completes the read operation.

15. The storage controller as recited in claim 12, wherein if a total number of the syndromes in the syndrome buffer area is equal to 2, and the syndromes comprise a left syndrome corresponding to a low read voltage and a right syndrome corresponding to a high read voltage, the modes of the size relative relation comprise:
a first descending mode, wherein if a total number of bit values of "1" of the left syndrome is greater than a total number of bit values of "1" of the right syndrome, the size relative relation is identified as the first descending mode, wherein the right syndrome is identified as a smallest syndrome;
a first ascending mode, wherein if the total number of bit values of "1" of the right syndrome is greater than the total number of bit values of "1" of the left syndrome, the size relative relation is identified as the first ascending mode, wherein the left syndrome is identified as the smallest syndrome; and
a horizontal mode, wherein if a difference between the total number of bit values of "1" of the right syndrome and the total number of bit values of "1" of the left syndrome is less than a syndrome difference threshold, and both the total number of bit values of "1" of the right syndrome and the total number of bit values of "1" of the left syndrome are less than a syndrome threshold, the size relative relation is identified as the horizontal mode, wherein the syndrome having the smaller total number of bit values of "1" is identified as the smallest syndrome,
wherein the confidence tables corresponding to the target physical page respectively correspond to the first descending mode, and the first ascending mode and the horizontal mode.

16. The storage controller as recited in claim 12, wherein in the operation of in response to the determination that the bit values of the last one of the first adjust codeword syndromes are not all zero, generating the soft information of each of the target memory cells according to the codewords corresponding to the read operation in the codeword buffer area,
in response to the determination that a plurality of bit values of a last one of the first adjust codeword syndromes are not all zero, the read assisting circuit unit generates a second adjust read voltage according to the predetermined read voltage, the first adjust read voltage and the corresponding syndromes,
wherein the read assisting circuit unit uses the second adjust read voltage to read the target physical page to obtain a second adjust codeword corresponding to the target physical page, wherein the error checking and correcting circuit performs the preset decoding operation on the second adjust codeword to obtain a plurality of second adjust codeword syndromes corresponding to the second adjust codeword, wherein the read assisting circuit unit stores the second adjust codeword in the codeword buffer area and stores a first one of the second adjust codeword syndromes in the syndrome buffer area,
wherein in response to the determination that the bit values of the last one of the second adjust codeword syndromes are not all zero, the read assisting circuit unit generates the soft information of each of the target memory cells according to all the codewords corresponding to the read operation in the codeword buffer area.

17. The storage controller as recited in claim 16, wherein if a total number of the syndromes in the syndrome buffer area is equal to 3, and the syndromes comprise a left syndrome corresponding to a lowest read voltage, a right syndrome corresponding to a highest read voltage and an middle syndrome corresponding to an intermediate read voltage, the modes of the size relative relation comprise:
a second descending mode, wherein if a total number of bit values of "1" of the left syndrome is greater than a total number of bit values of "1" of the middle syndrome, and the total number of bit values of "1" of the middle syndrome is greater than a total number of bit values of "1" of the right syndrome, the size relative relation is identified as the second descending mode, wherein the right syndrome is identified as a smallest syndrome;
a second ascending mode, wherein if the total number of bit values of "1" of the right syndrome is greater than the total number of bit values of "1" of the middle syndrome, and the total number of bit values of "1" of the middle syndrome is greater than the total number of bit values of "1" of the left syndrome, the size relative relation is identified as the second ascending mode, wherein the left syndrome is identified as the smallest syndrome; and
a hook-like mode, wherein if the total number of bit values of "1" of the middle syndrome is less than the total number of bit values of "1" of the left syndrome, and the total number of bit values of "1" of the middle syndrome is less than the total number of bit values of "1" of the right syndrome, the size relative relation is identified as the hook-like mode, wherein the middle syndrome is identified as the smallest syndrome,
wherein the confidence tables corresponding to the target physical page respectively correspond to the second descending mode, the second ascending mode and the hook-like mode.

18. The storage controller as recited in claim 16, wherein in the operation of the read assisting circuit unit generating the second adjust read voltage according to the predetermined read voltage, the first adjust read voltage and the corresponding syndromes,
the read assisting circuit unit calculates a voltage difference value obtained by subtracting the first adjust read voltage by the predetermined read voltage, wherein in response to a total number of bit values of "1" of a syndrome corresponding to the first adjust read voltage in the syndrome buffer area being smaller than a total number of bit values of "1" of a syndrome corresponding to the predetermined read voltage, the read assisting circuit unit generates the second adjust read voltage by adding the first adjust read voltage by the voltage difference value, wherein in response to the total number of bit values of "1" of the syndrome corresponding to the first adjust read voltage in the syndrome buffer area being greater than the total number of bit values of "1" of the syndrome corresponding to the predetermined read voltage, the read assisting circuit unit generates the second adjust read voltage by subtracting the predetermined read voltage by the voltage difference value.

19. The storage controller as recited in claim 12, wherein in the operation of the read assisting circuit unit generating the soft information of each of the target memory cells according to the codewords corresponding to the read operation in the codeword buffer area, the read assisting circuit unit identifies a smallest syndrome having a minimum total number of bit values of "1" among the syndromes in the syndrome buffer area, wherein the read assisting circuit unit selects a codeword corresponding to the smallest syndrome among the codewords in the codeword buffer area to set the selected codeword as a hard bit codeword corresponding to the target memory cells and sets the rest of the codewords among the codewords in the codeword buffer area which are not selected as a soft bit codeword corresponding to the target memory cells, wherein the read assisting circuit unit uses the hard bit codeword and the soft bit codewords to constitute the soft information of each of the target memory cells.

20. The storage controller as recited in claim 19, wherein if a total number of the soft bit codewords is greater than 1, the read assisting circuit unit performs an XOR operation or an XNOR operation on all the soft bit codewords and serves an obtained first operation result corresponding to the XOR operation or an obtained second operation result corresponding to the XNOR operation as a soft bit value of each of the target memory cells, wherein the read assisting circuit unit identifies a hard bit value of each of the target memory cells according to the hard bit codeword, wherein the read assisting circuit unit combines the hard bit value of each of the target memory cells with the soft bit value of each of the target memory cells to constitute the soft information of each of the target memory cells.

21. The storage controller as recited in claim 12, wherein in the operation of the read assisting circuit unit finding the confidence value of each of the target memory cells from the target confidence table according to the plurality of soft information of the target memory cells, for first soft information of a first target memory cell among the target memory cells, the read assisting circuit unit finds a first soft information pattern matching the first soft information from a plurality of soft information patterns of the target confidence table and a first predetermined confidence value corresponding to the first soft information according to the first soft information, wherein in response to the first soft information not matching one of the soft information patterns of the target confidence table, the read assisting circuit unit sets the first predetermined confidence value corresponding to the first soft information to a preset value, wherein the read assisting circuit unit identifies the first predetermined confidence value as a first confidence value of the first target memory cell corresponding to the target physical page.

22. The storage controller as recited in claim 21, wherein an absolute value of each of the predetermined confidence values in the target confidence table is set according to a target mode of the size relative relation corresponding to the target confidence table, wherein the soft information patterns of the target confidence table are obtained by the read assisting circuit unit reading the target physical page by sequentially using one or more transition read voltages corresponding to the target mode and the target physical page and one or more adjust read voltages corresponding to the one or more transition read voltages, wherein among the soft information patterns, absolute values of one or more predetermined confidence values corresponding to one or more of the soft information patterns that are closer to the one or more transition read voltages are set to smaller values, wherein among the soft information patterns, the absolute value of the predetermined confidence value corresponding to the soft information pattern between one of the one or more transition read voltages and the corresponding adjust read voltage is set to be a minimum value, wherein positiveness or negativeness of each of the predetermined confidence values is set according to a hard bit value in the corresponding soft information pattern, wherein in response to the hard bit value in the soft information pattern corresponding to one of the predetermined confidence values being "1", the first predetermined confidence value is set to be a negative value, and in response to the hard bit value in the soft information pattern corresponding to the predetermined confidence value being "0", the first predetermined confidence value is set to be a positive value.

23. A storage device, comprising:

a rewritable non-volatile memory module, wherein the rewritable non-volatile memory module comprises a plurality of word lines, and each of the word lines is coupled to a plurality of memory cells, each of the memory cells comprises a plurality of physical pages, and each of the physical pages is configured to be programmed to have a bit value;

a memory interface control circuit, configured to couple to the rewritable non-volatile memory module, a processor, coupled to the memory interface control circuit, wherein the processor loads and executes a read assisting program code module to perform a data reading method, comprising steps of:

selecting a target physical page of a target word line, so as to perform a read operation on a target codeword stored by the target physical page, wherein a plurality of target memory cells of the target physical page are configured to respectively store a plurality of target bit values of the target codeword;

using a predetermined read voltage corresponding to the target physical page to read the target physical page to obtain a read codeword corresponding to the target physical page and performing a preset decoding operation on the read codeword to obtain a plurality of read codeword syndromes corresponding to the read codeword, wherein the read codeword is stored in a codeword buffer area, and a first one of the read codeword syndromes is stored in a syndrome buffer area;

in response to the determination that a plurality of bit values of a last one of the read codeword syndromes are not all zero, using a first adjust read voltage corresponding to the predetermined read voltage to read again the target physical page to obtain a first adjust codeword corresponding to the target physical page and performing the preset decoding operation on the first adjust codeword to obtain a plurality of first adjust codeword syndromes corresponding to the first adjust codeword, wherein the first adjust codeword is stored in the codeword buffer area, and a first one of the first adjust codeword syndromes is stored in the syndrome buffer area;

in response to the determination that a plurality of bit values of a last one of the first adjust codeword syndromes are not all zero, generating soft information of each of the target memory cells according to a plurality of codewords corresponding to the read operation in the codeword buffer area;

identifying a target confidence table corresponding to a size relative relation from a plurality of confidence tables corresponding to the target physical page according to the size relative relation among a plurality of syndromes in the syndrome buffer area, wherein the confidence tables respectively correspond to a plurality of modes of the size relative relation, and each of the confidence tables has a plurality of predetermined confidence values respectively corresponding to a plurality of soft information patterns;

finding a confidence value of each of the target memory cells from the target confidence table according to the plurality of soft information of the target memory cells; and using the confidence values of the target memory cells to replace a plurality of log likelihood ratios corresponding to the target memory cells in the preset decoding operation and performing an adjusted preset decoding operation having the replaced log likelihood ratios on the plurality of soft information, so as to obtain a valid codeword corresponding to the target physical page and complete the read operation.

* * * * *